US012751273B2

(12) United States Patent
Lin et al.

(10) Patent No.: US 12,751,273 B2
(45) Date of Patent: Sep. 29, 2026

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); NATIONAL YANG MING CHIAO TUNG UNIVERSITY, Hsinchu City (TW)

(72) Inventors: Hsin-Cheng Lin, Taipei City (TW); Kuan-Ying Chiu, Taoyuan City (TW); Chee-Wee Liu, Taipei City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 354 days.

(21) Appl. No.: 18/477,489

(22) Filed: Sep. 28, 2023

(65) Prior Publication Data

US 2025/0112152 A1 Apr. 3, 2025

(51) Int. Cl.
*H10W 20/41* (2026.01)
*H10D 30/01* (2025.01)
(Continued)

(52) U.S. Cl.
CPC ........ *H10W 20/427* (2026.01); *H10D 30/014* (2025.01); *H10D 30/43* (2025.01);
(Continued)

(58) Field of Classification Search
CPC ............. H10W 20/427; H10W 20/069; H10D 30/014; H10D 30/43; H10D 30/6735;
(Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

TW 1768893 B 6/2022
TW 202238901 A 10/2022
TW 202310285 A 3/2023

OTHER PUBLICATIONS

Lin, H.-C. et al., "RF performance of stacked Si nanosheets/nanowires", IEEE Electron Device Letters, vol. 43, No. 7, pp. 1017-1020; Jul. 2022.

*Primary Examiner* — Jonathan Han
(74) *Attorney, Agent, or Firm* — Maschoff Brennan

(57) ABSTRACT

A device includes a first transistor, a second transistor, an interlayer dielectric (ILD) layer, and a backside gate rail. The first and second transistors are arranged along a first direction in a top view. The first transistor includes a first channel layer, a gate structure surrounding the first channel layer, a first source/drain epitaxial structure and a second source/drain epitaxial structure connected to the first channel layer. The second transistor includes a second channel layer, the gate structure surrounding the second channel layer, a third source/drain epitaxial structure and a fourth source/drain epitaxial structure connected to the second channel layer. A portion of the ILD layer is sandwiched between the first and third source/drain epitaxial structures. The backside gate rail is under the ILD layer and is electrically connected to the gate structure. The portion of the ILD layer is directly above the backside gate rail.

20 Claims, 50 Drawing Sheets

(51) Int. Cl.

| | |
|---|---|
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10D 84/85*** | (2025.01) |

(52) U.S. Cl.

CPC ....... *H10D 30/6735* (2025.01); *H10D 62/121* (2025.01); *H10D 62/151* (2025.01); *H10D 64/017* (2025.01); *H10D 84/0167* (2025.01); *H10D 84/017* (2025.01); *H10D 84/0186* (2025.01); *H10D 84/0188* (2025.01); *H10D 84/038* (2025.01); *H10D 84/85* (2025.01)

(58) Field of Classification Search

CPC .. H10D 62/121; H10D 62/151; H10D 64/017; H10D 84/0167; H10D 84/017; H10D 84/0186; H10D 84/0188; H10D 84/038; H10D 84/85; H10D 30/6757; H10D 84/0135; H10D 84/0149; H10D 84/0151; H10D 84/83

See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 12,598,975 | B2 * | 4/2026 | Lee | H10D 84/83 |
| 2024/0006315 | A1 * | 1/2024 | Xie | H10W 20/40 |
| 2024/0170369 | A1 * | 5/2024 | Kang | H10W 10/014 |

* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process can increase production efficiency and lower associated costs. Such scaling down has also increased the complexity of processing and manufacturing ICs and, for these advancements to be realized, similar developments in IC processing and manufacturing are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
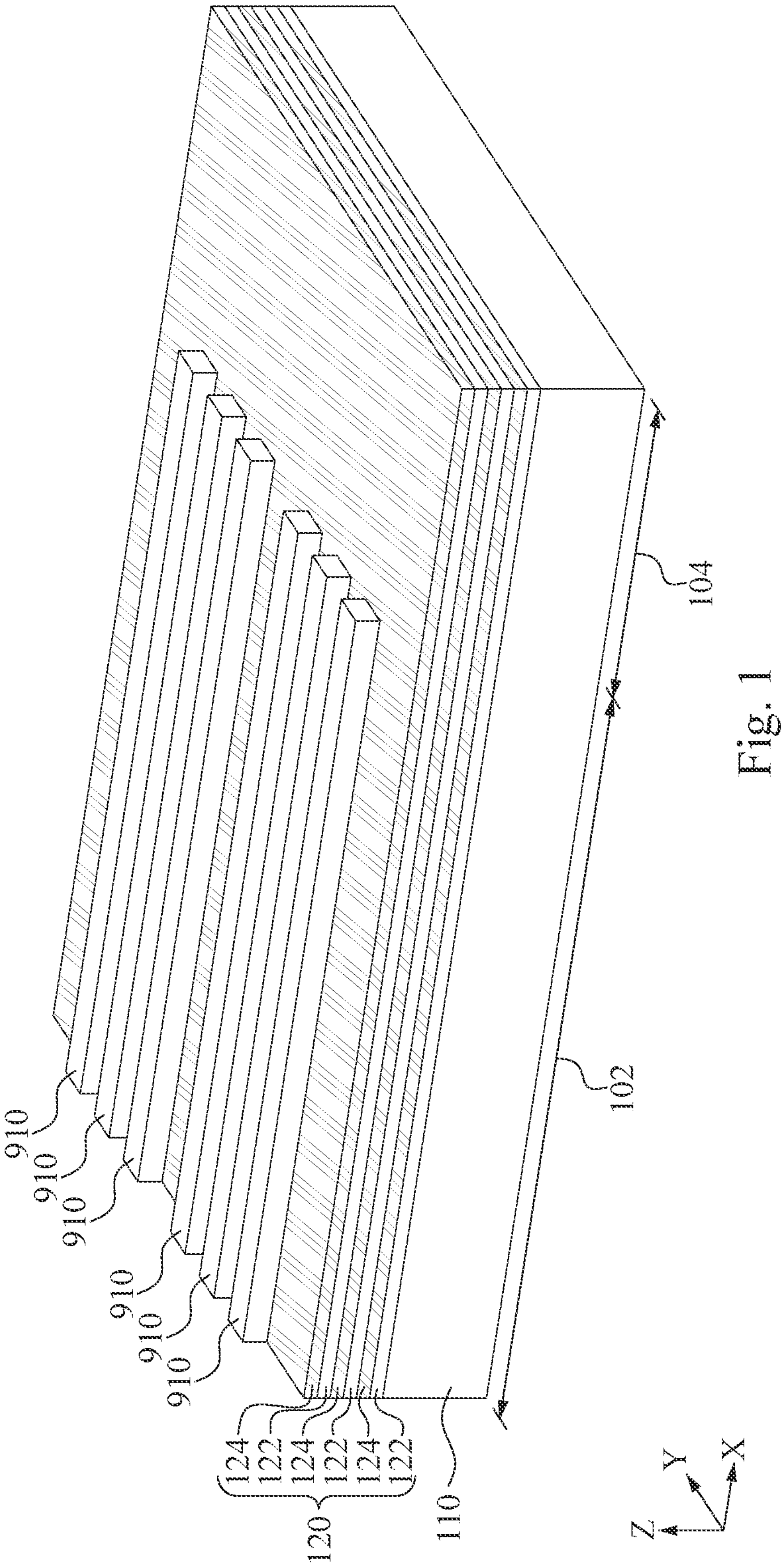
FIGS. 1-15E illustrate a method for manufacturing a semiconductor device (or an integrated circuit structure) at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9). As used herein, the term "low-k" refers to a low dielectric constant. In the field of semiconductor device structures and manufacturing processes, low-k refers to a dielectric constant that is less than the dielectric constant of $SiO_2$ (e.g., less than 3.9). As used herein, the term "p-type" defines a structure, layer, and/or region as being doped with p-type dopants, such as boron. As used herein, the term "n-type" defines a structure, layer, and/or region as being doped with n-type dopants, such as phosphorus. As used herein, the term "conductive" refers to an electrically conductive structure, layer, and/or region. As used herein, source/drain region(s) may refer to a source or a drain, individually or collectively dependent upon the context.

The nanostructure transistor (e.g., gate all around (GAA) transistor) structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The present disclosure is related to semiconductor devices and methods of forming the same. More particularly, some embodiments of the present disclosure are related to radio frequency (RF) devices including one or more buried gate conductive line(s) to reduce the gate resistance without increasing parasitic capacitance of the device. In some embodiments, the RF devices are planar metal-oxide semiconductor field effect transistors (MOSFETs), Fin field effect transistors (FinFETs), and/or nanostructures (e.g., nanosheet devices, nanowire devices, or the like).

FIGS. 1-15E illustrate a method for manufacturing a semiconductor device (or an integrated circuit structure) 100 at various stages in accordance with some embodiments of the present disclosure. In addition to the semiconductor device 100, FIGS. 1-4A, 5A, 6A, 7A, 8A, 9A, 11A, 12A, 13A, 14A, and 15A depict X-axis, Y-axis, and Z-axis directions. In some embodiments, the semiconductor device shown in FIGS. 1-15E may be intermediate devices fabricated during processing of an integrated circuit (IC), or a portion thereof, that may include static random access memory (SRAM), logic circuits, passive components, such as resistors, capacitors, and inductors, and/or active components, such as p-type FETs (PFETs), n-type FETs (NFETs), multi-gate FETs, MOSFETs, complementary metal-oxide semiconductor (CMOS) transistors, bipolar transistors, high voltage transistors, high frequency transistors, other memory cells, and combinations thereof.

FIGS. 1-4A, 5A, 6A, 7A, 8A, 9A, 11A, 12A, 13A, 14A, and 15A are perspective views of some embodiments of the semiconductor device 100 at intermediate stages during fabrication. FIGS. 4B, 5B, 6B, 7B, 8B, 9B, 10A, 11B, 12B, 13B, 14B, and 15B are cross-sectional views of some embodiments of the semiconductor device 100 at intermediate stages during fabrication along a first cut (e.g., cut I-I), which is along a lengthwise direction of a gate structure. FIGS. 4C, 5C, 6C, 9D, 10C, 11D, 12D, 13D, 14D, and 15D are cross-sectional views of some embodiments of the semiconductor device 100 at intermediate stages during fabrication along a second cut (e.g., cut II-II), which is along a lengthwise direction of a buried gate conductive line. FIGS. 6D, 7D, 8D, 9E, 10D, 11E, 12E, 13E, 14E, and 15E are cross-sectional views of some embodiments of the semiconductor device 100 at intermediate stages during fabrication along a third cut (e.g., cut III-III), which is along a lengthwise direction of channels. FIGS. 7C, 8C, 9C, 10B, 11C, 12C, 13C, 14C, and 15C are cross-sectional views of some embodiments of the semiconductor device 100 at intermediate stages during fabrication along a fourth cut (e.g., cut IV-IV), which is along a lengthwise direction of source/drain epitaxial structures.

Reference is made to FIG. 1. A substrate 110 is provided. The substrate 110 includes a device region 102 and a peripheral region 104. In some embodiments, the substrate 110 is made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 110 may include an epitaxial layer (epi-layer), which may be strained for performance enhancement, and/or may include a silicon-on-insulator (SOI) structure.

An epitaxial stack 120 is formed on the substrate 110 through epitaxy, such that the epitaxial stack 120 forms crystalline layers. The epitaxial stack 120 includes epitaxial layers 122 of a first composition interposed by epitaxial layers 124 of a second composition. The first and second compositions may be different. In some embodiments, the epitaxial layers 122 are SiGe and the epitaxial layers 124 are silicon (Si). However, other embodiments are possible including those that provide for a first composition and a second composition having different etch selectivity.

The epitaxial layers 124 or portions thereof may form nanostructure channel(s) of the nanostructure transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. For example, the nanostructures are nanosheets, nanowires, nanoslabs, or nanorings, depending on their geometry. The use of the epitaxial layers 124 to define a channel or channels of a device is further discussed below.

It is noted that three layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

As described in more detail below, the epitaxial layers 124 may serve as channel region(s) for a subsequently-formed semiconductor device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

Figure 2:
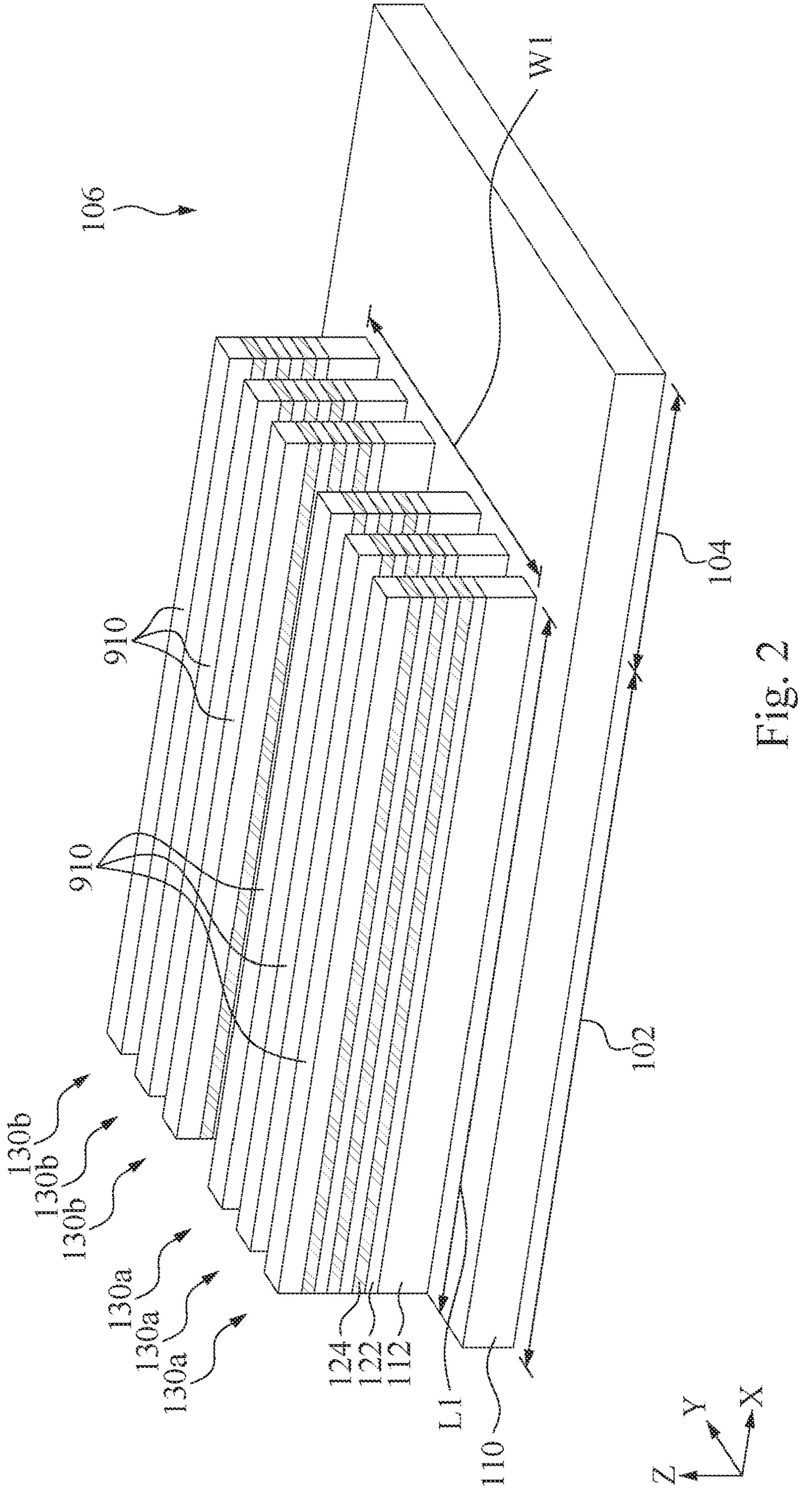

Referring to FIG. 2, a plurality of fin structures 130*a* and 130*b* extending from the device region 102 of the substrate 110 are formed. In various embodiments, each of the fin structures 130*a* and 130*b* includes a base portion 112 formed from the substrate 110 and portions of each of the epitaxial layers of the epitaxial stack 120 including the epitaxial layers 122 and 124. The fin structures 130*a* and 130*b* may be fabricated using suitable processes including double-patterning or multi-patterning processes. As shown in FIG. 2, the fin structures 130*a* and 130*b* may have different pitches. For example, a distance between the adjacent fin structures 130*a* and 130*b* is greater than a pitch of the fin structures 130*a* and also greater than a pitch of the fin structures 130*b*. In some embodiments, a length L1 of each of the fin structures 130*a* and 130*b* is in a range from about 10 nm to about 200 um, and a width W1 of the fin structures 130*a* and 130*b* is in a range from about 10 nm to about 200 um.

In the illustrated embodiment as illustrated in FIGS. 1 and 2, a patterned hard mask (HM) layer 910 is formed over the epitaxial stack 120 prior to patterning the fin structures 130*a* and 130*b*. The HM layer 910 is then used to protect regions of the substrate 110 and layers formed thereupon, while an etch process forms trenches 106 in unprotected regions through the HM layer 910, through the epitaxial stack 120, and into the substrate 110, thereby leaving the plurality of extending fin structures 130*a* and 130*b*. The trenches 106 may be etched using a dry etch (e.g., reactive ion etching), a wet etch, and/or combination thereof.

Figure 3:
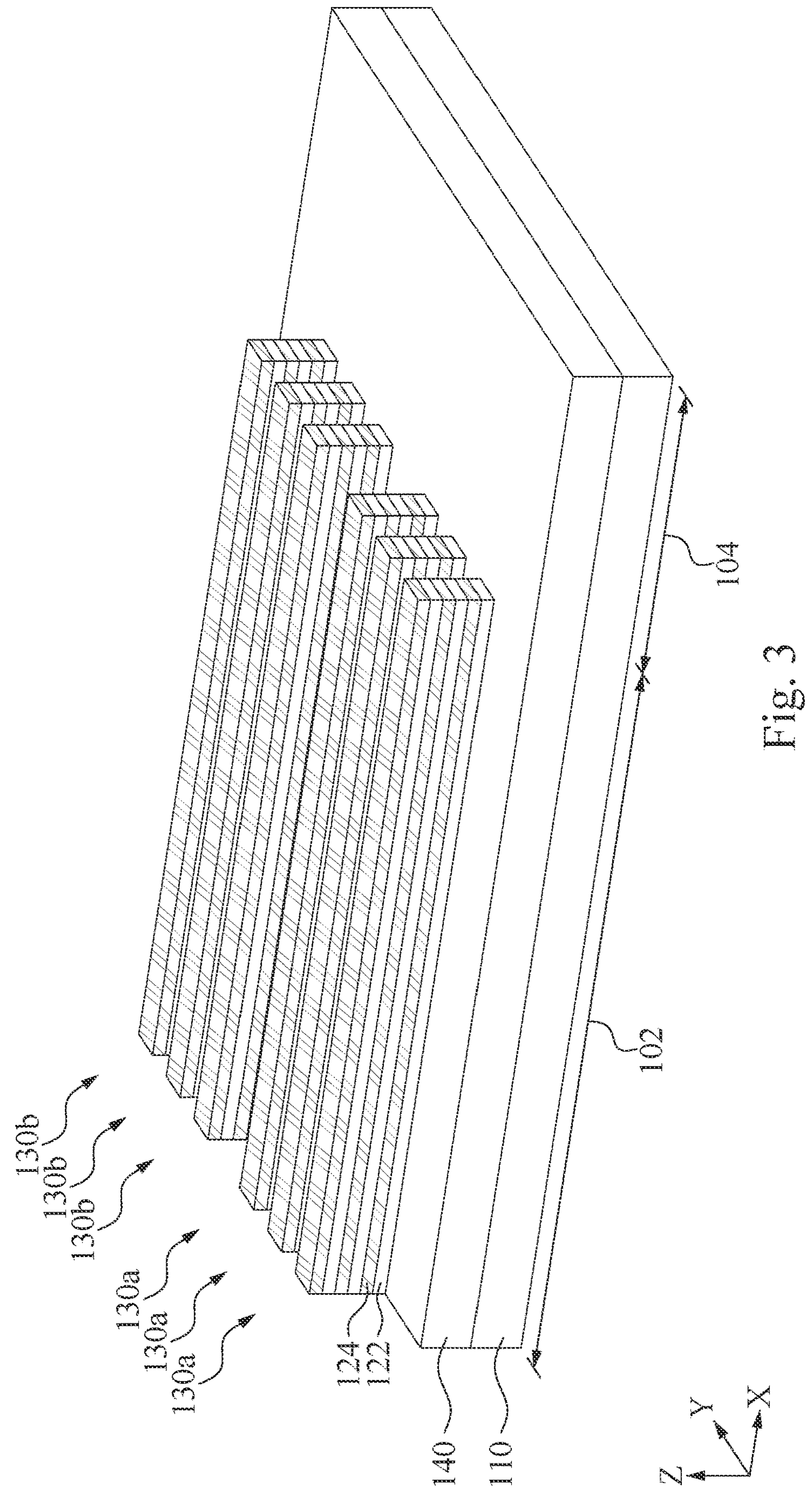

Next, as illustrated in FIG. 3, isolation structures 140 are formed in the trenches 106 (see FIG. 2) and surrounding bottom portions of the fin structures 130*a* and 130*b*. The isolation structures 140 may include a liner oxide (not shown). The liner oxide may be formed of a thermal oxide formed through a thermal oxidation of a surface layer of the substrate 110. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). The isolation structures 140 may also include a dielectric material over the liner oxide, and the dielectric material may be formed using flowable chemical vapor deposition (FCVD), spin-on coating, or the like. The isolation structures 140 are then recessed, so that the top portions of the fin structures 130*a* and 130*b* protrude higher than the top surfaces of the neighboring isolation structures 140 to form protruding fins.

Figure 4A:
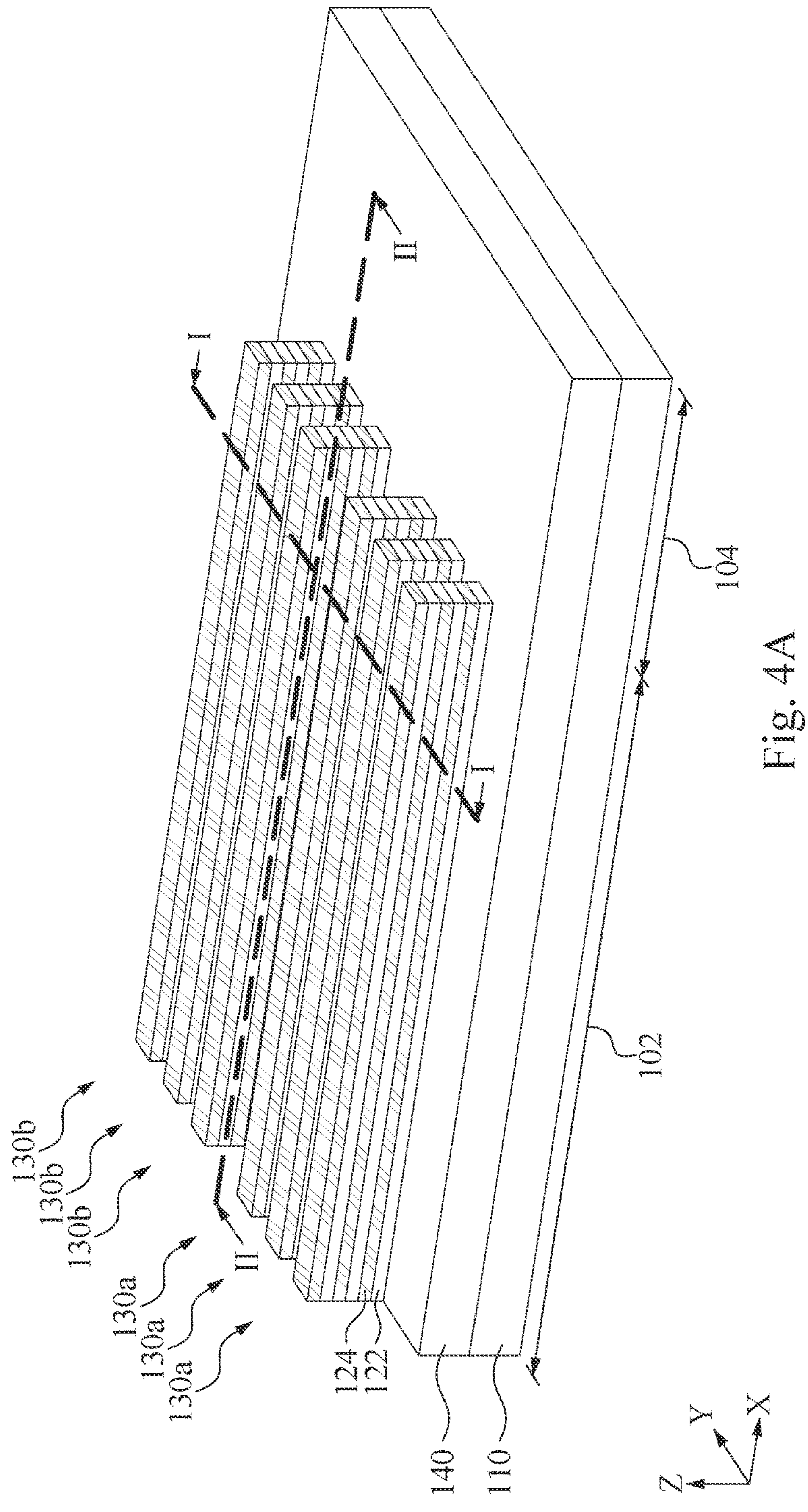
Figure 4B:
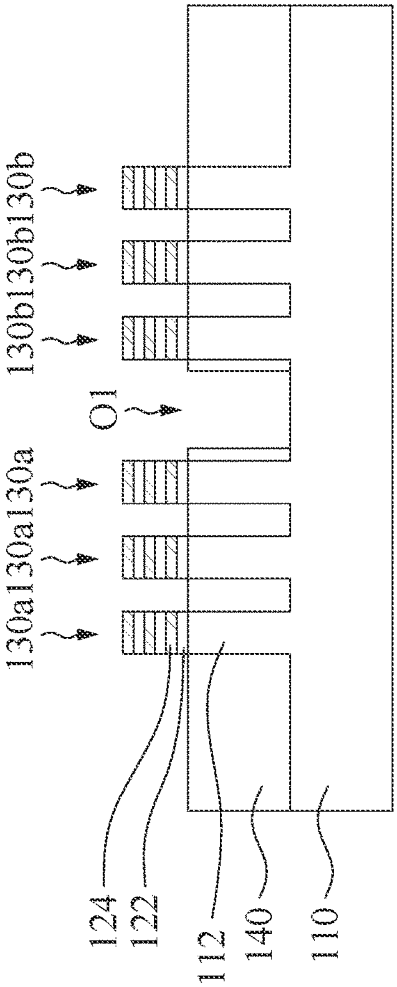
Figure 4C:
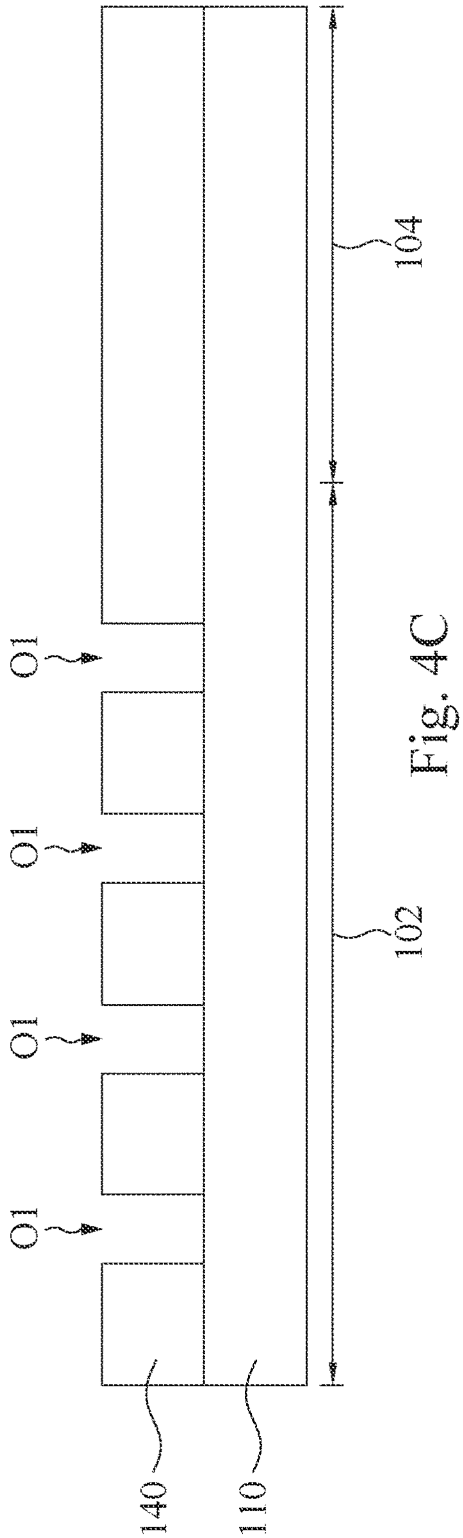

Reference is made to FIGS. 4A-4C, where FIG. 4B is a cross-sectional view taken along line I-I in FIG. 4A, and FIG. 4C is a cross-sectional view taken along line II-II in FIG. 4A. After the formation of the isolation structures 140, gate via openings O1 are formed in the isolation structures 140 and between the fin structures 130*a* and 130*b*. For example, the gate via openings O1 pass through the isolation structures 140 and expose the substrate 110. The gate via openings O1 may be formed by using a single or multiple etching process(es).

Figure 5A:
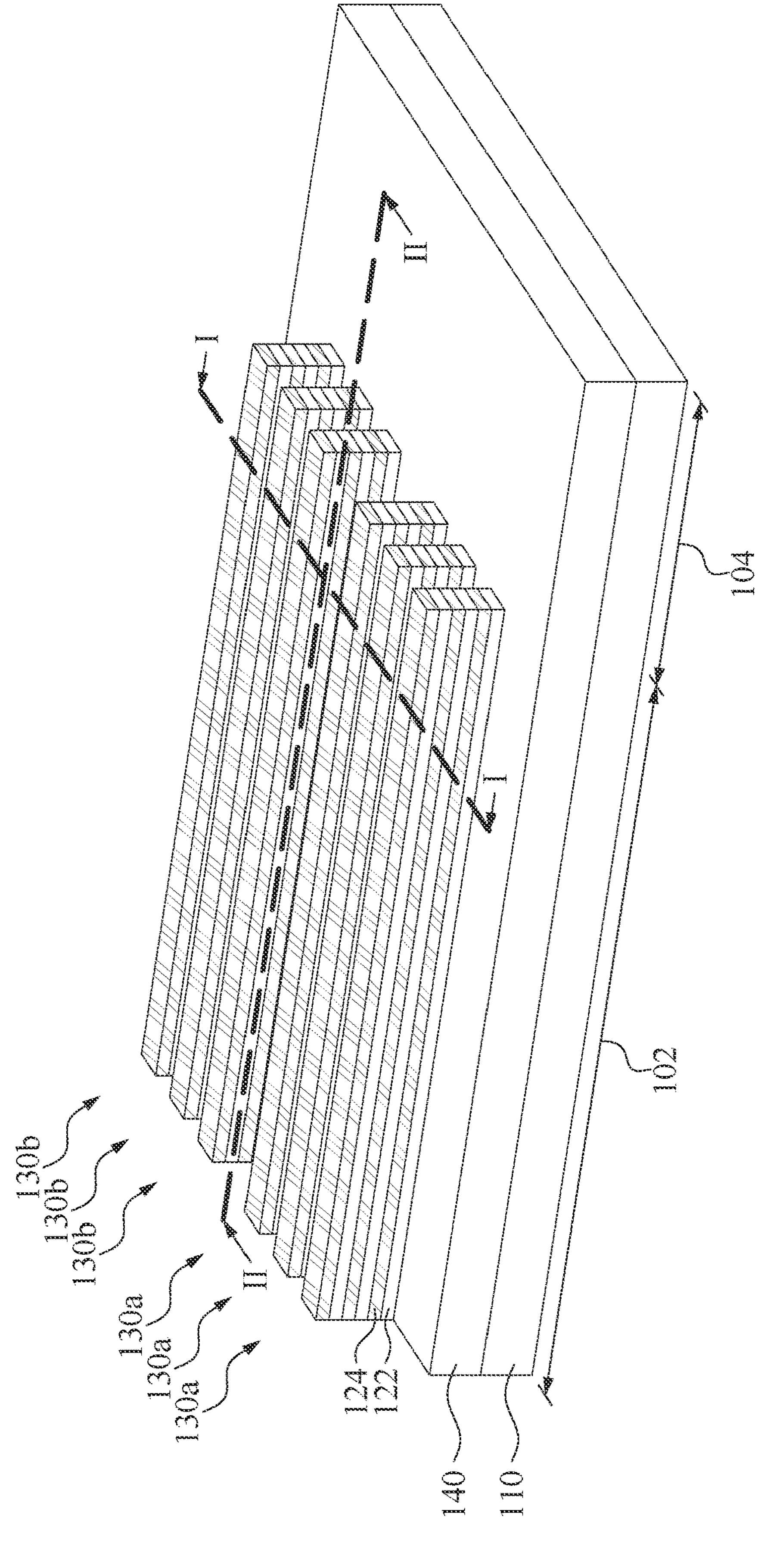
Figure 5B:
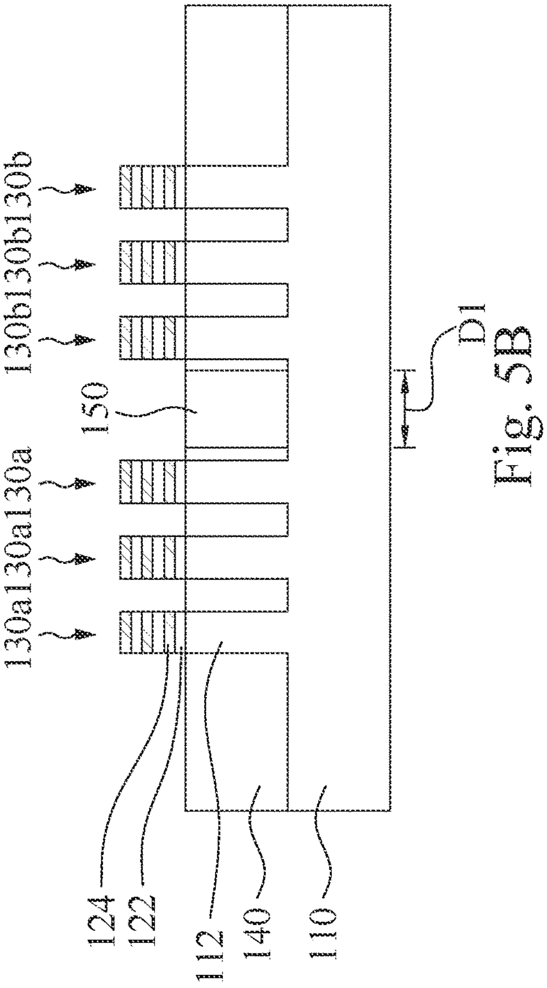
Figure 5C:
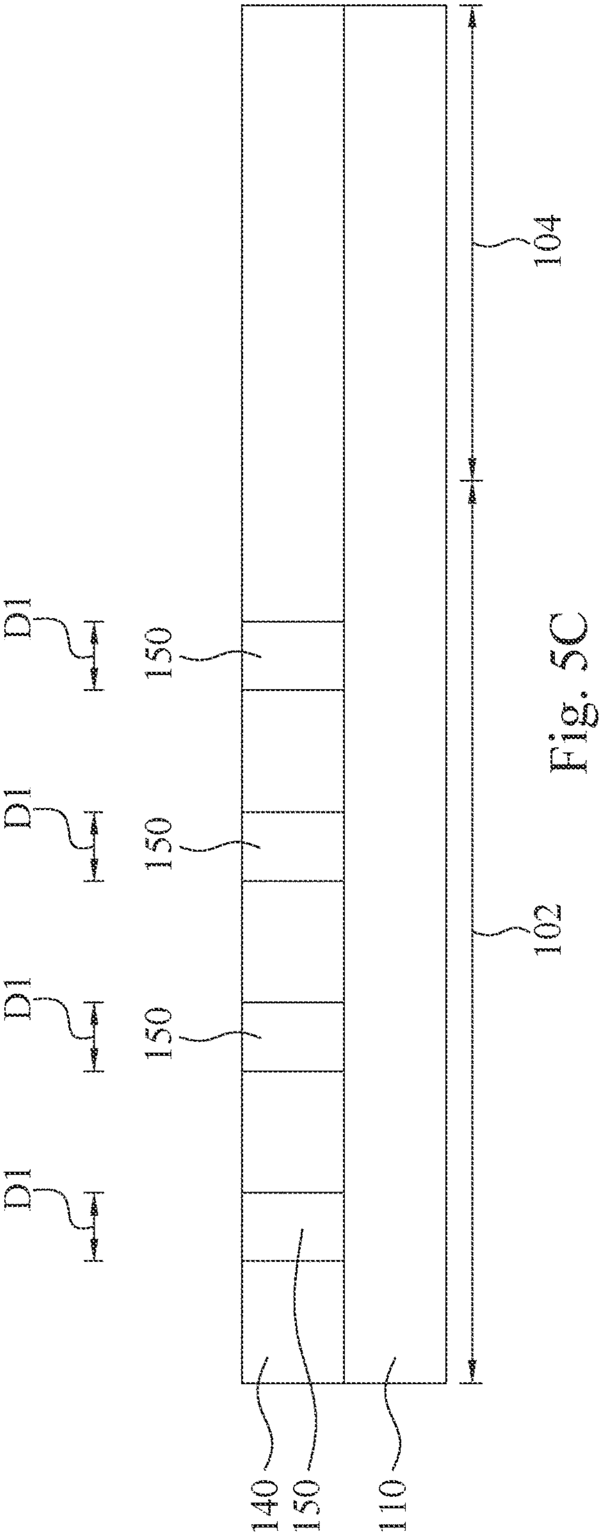

Reference is made to FIGS. 5A-5C, where FIG. 5B is a cross-sectional view taken along line I-I in FIG. 5A, and FIG. 5C is a cross-sectional view taken along line II-II in FIG. 5A. Backside gate vias 150 are formed in the gate via openings O1 (see FIGS. 4B and 4C) and between the fin structures 130*a* and 130*b*. Formation of the backside gate vias 150 includes depositing one or more metal materials overfilling the gate via openings O1, and then performing an etch back process to remove excessive metal materials outside the gate via openings O1. The backside gate vias 150 may include metal materials such as Pt, Ti, TiN, Al, W, WN, Ru, RuO, Ta, Ni, Co, Cu, Ag, Au, combinations thereof, or the like, and may be formed using PVD, CVD, ALD, or the like. In some embodiments, the backside gate vias 150 may further include one or more barrier/adhesion layers (not shown) to protect the isolation structures 140 from metal diffusion (e.g., copper diffusion). The one or more barrier/adhesion layers may include titanium, titanium nitride, tantalum, tantalum nitride, or the like, and may be formed using PVD, CVD, ALD, or the like. In some embodiments, a dimension (length or width or diameter) D1 of the backside gate vias 150 is in a range from about 10 nm to about 500 nm.

Figure 6A:
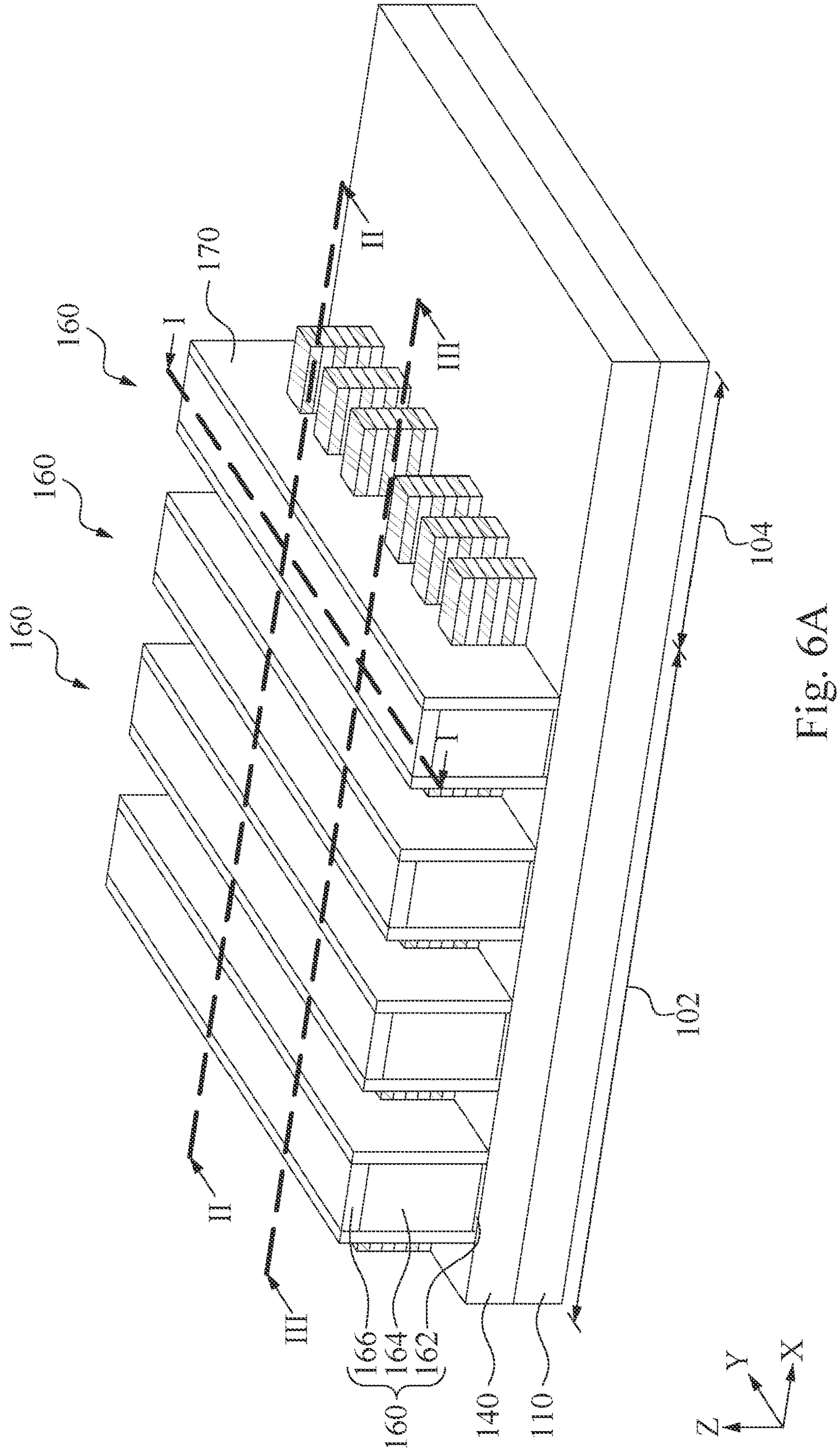
Figure 6B:
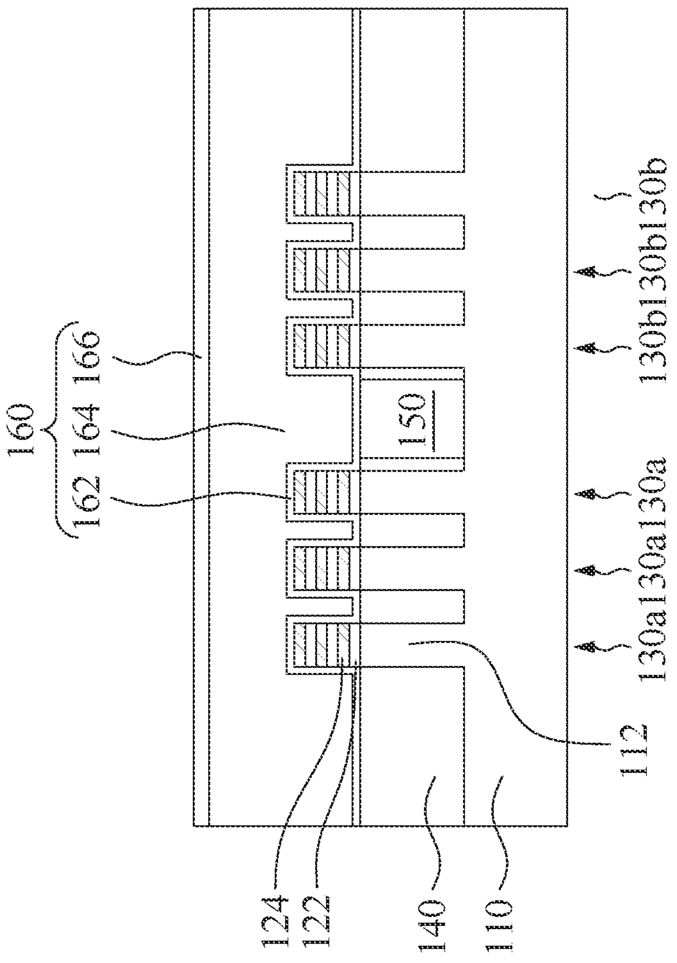
Figure 6C:
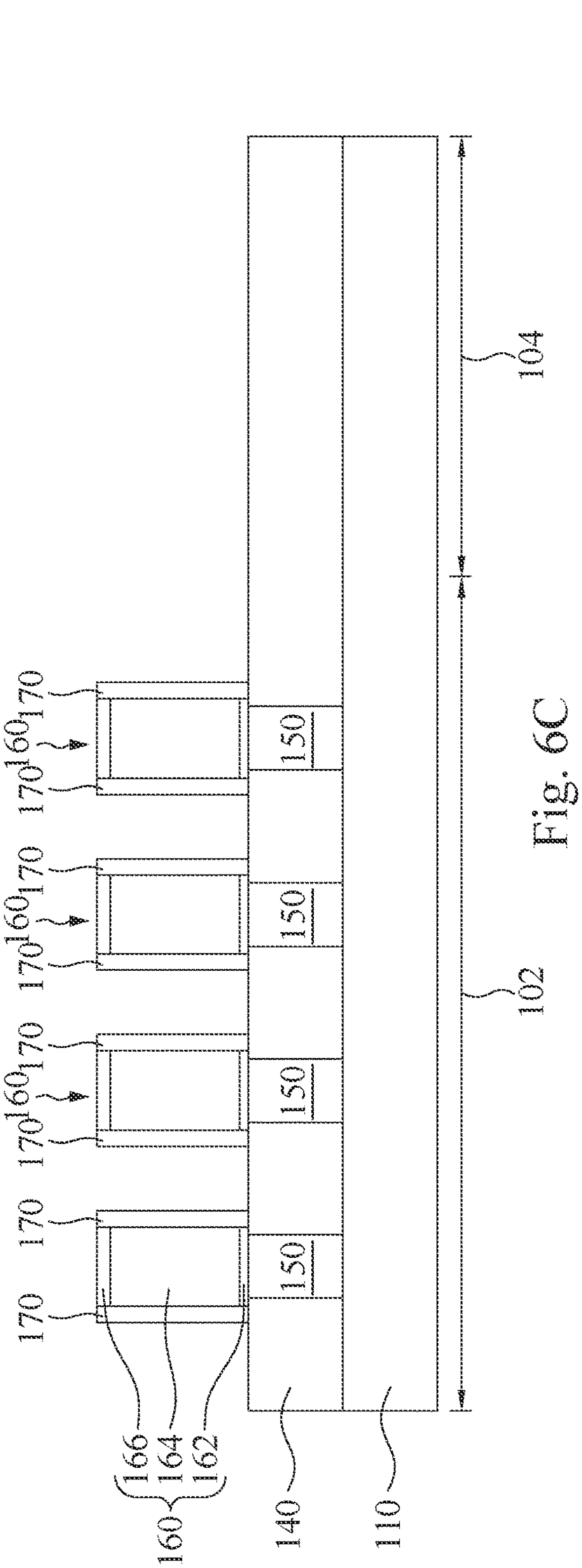
Figure 6D:
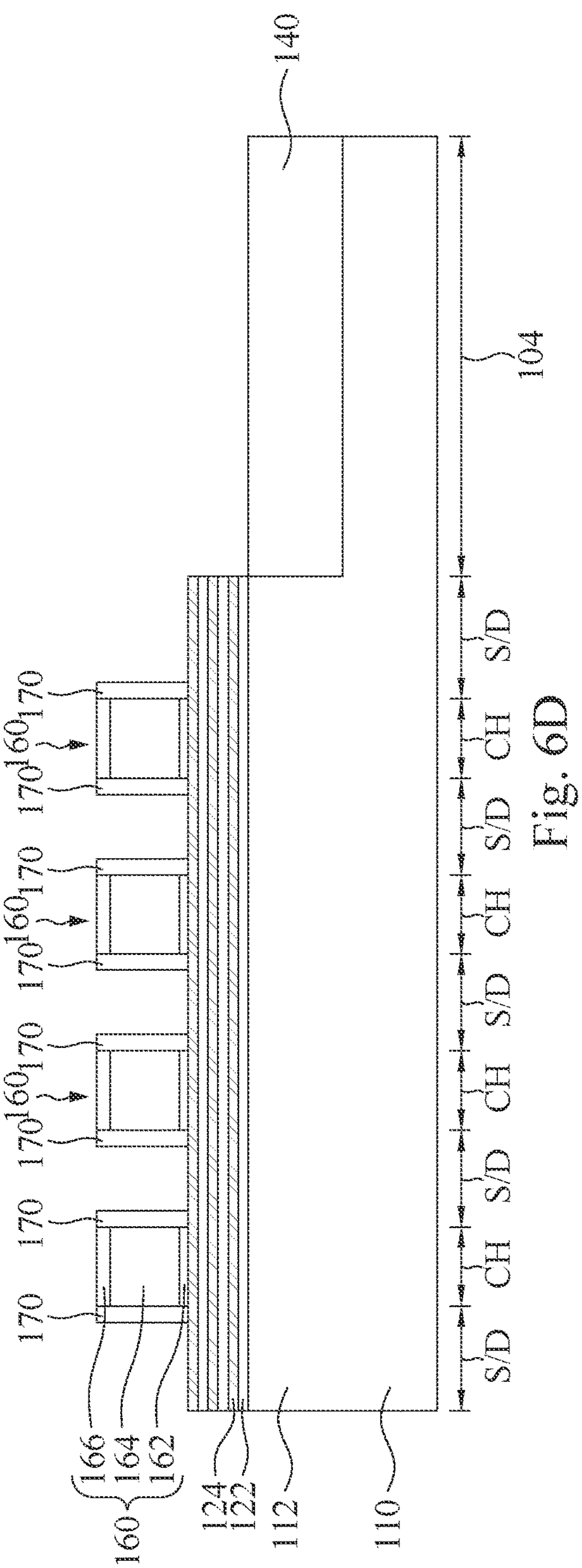

Reference is made to FIGS. 6A-6D, where FIG. 6B is a cross-sectional view taken along line I-I in FIG. 6A, FIG. 6C is a cross-sectional view taken along line II-II in FIG. 6A, and FIG. 6D is a cross-sectional view taken along line III-III in FIG. 6A. Dummy gate structures 160 are formed over the substrate 110 and are at least partially disposed over the fin structures 130*a* and 130*b*. The portions of the fin structures 130*a* and 130*b* underlying the dummy gate structures 160 may be referred to as the channel region CH. The dummy gate structures 160 may also define source/drain (S/D) regions S/D of the fin structures 130*a* and 130*b*, for example, the regions of the fin structures 130*a* and 130*b* adjacent and on opposing sides of the channel regions CH. Further, as shown in FIG. 6C, the dummy gate structures 160 cover the backside gate vias 150.

Dummy gate formation operation first forms a dummy gate dielectric layer 162 over the fin structures 130*a* and 130*b* and the backside gate vias 150. Subsequently, a dummy gate electrode layer 164 and a hard mask 166 are formed over the dummy gate dielectric layer 162. The hard mask 166 is then patterned, followed by patterning the dummy gate electrode layer 164 by using the patterned hard mask 166 as an etch mask. In some embodiments, after patterning the dummy gate electrode layer 164, the dummy gate dielectric layer 162 is removed from the source/drain regions S/D of the fin structures 130*a* and 130*b*. The etch process may include a wet etch, a dry etch, and/or a combination thereof. The etch process is chosen to selectively etch the dummy gate dielectric layer 162 without substantially etching the fin structures 130*a* and 130*b*, the dummy gate electrode layer 164, and the hard mask 166.

After formation of the dummy gate structures 160 is completed, gate spacers 170 are formed on sidewalls of the dummy gate structures 160. The gate spacers 170 may include a dielectric material such as silicon oxide, silicon nitride, silicon carbide, silicon oxynitride, SiCN films, silicon oxycarbide, SiOCN films, and/or combinations thereof. By way of example, the gate spacers 170 may be formed by depositing a dielectric material over the dummy gate structures 160 using suitable deposition processes. An anisotropic etching process is then performed on the deposited spacer material layer to expose portions of the fin structures 130*a* and 130*b* not covered by the dummy gate structure 160 (e.g., in source/drain regions of the fin structures 130*a* and 130*b*). Portions of the spacer material layer directly above the dummy gate structure 160 may be completely removed by this anisotropic etching process. Portions of the spacer material layer on sidewalls of the dummy gate structure 160 may remain, forming gate sidewall spacers, which are denoted as the gate spacers 170, for the sake of simplicity.

Figure 7A:
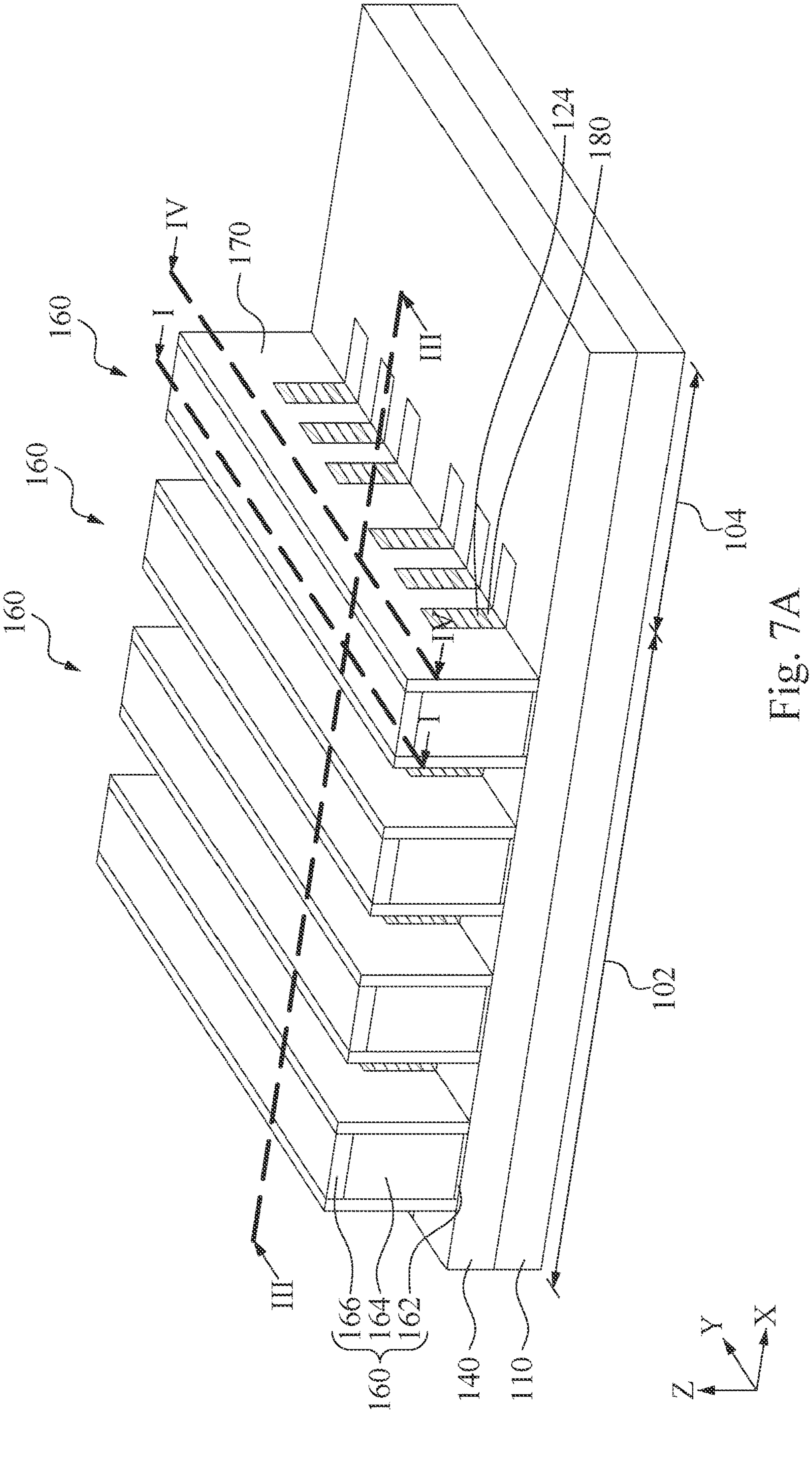
Figure 7C:
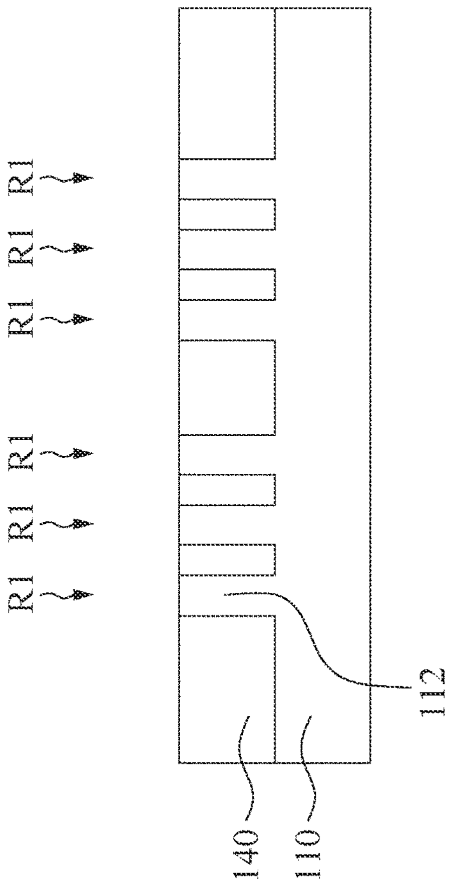
Figure 7B:
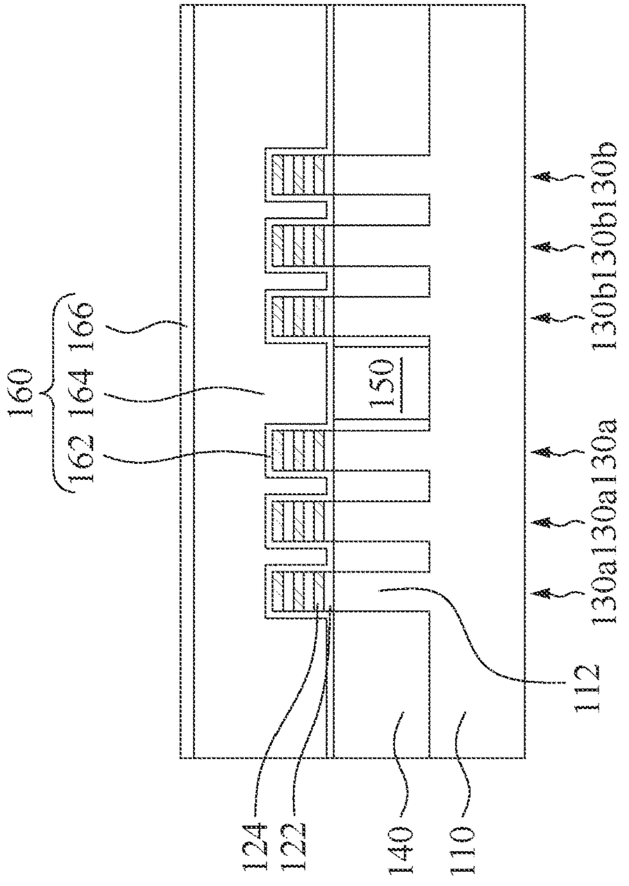
Figure 7D:
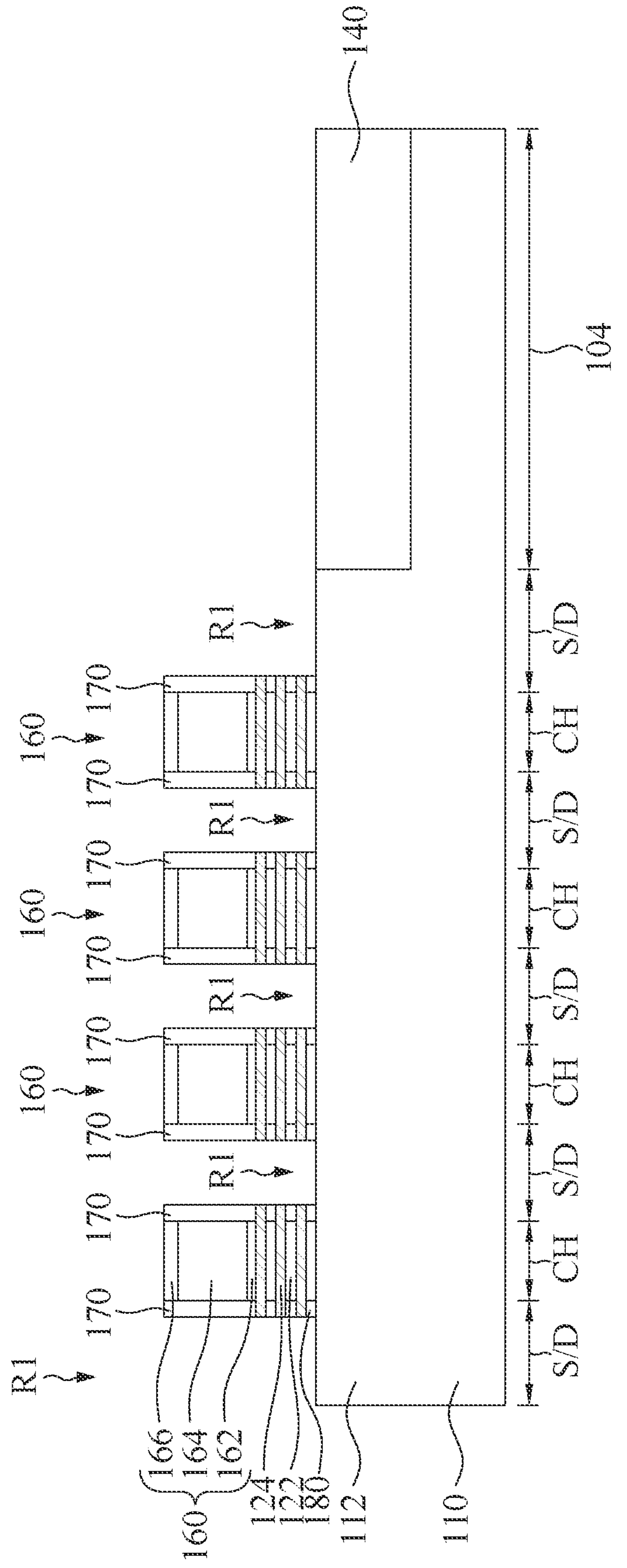

Reference is made to FIGS. 7A-7D, where FIG. 7B is a cross-sectional view taken along line I-I of FIG. 7A, FIG. 7C is a cross-sectional view taken along line IV-IV of FIG. 7A, and FIG. 7D is a cross-sectional view taken along line III-III of FIG. 7A. Next, exposed portions of the fin structures 130*a* and 130*b* that extend laterally beyond the gate spacers 170 (e.g., in source/drain regions S/D of the fin structures 130*a* and 130*b*) are etched by using, for example, an anisotropic etching process that uses the dummy gate structure 160 and the gate spacers 170 as an etch mask, resulting in recesses R1 into the fin structures 130*a* and 130*b* and between corresponding dummy gate structures 160. After the anisotropic etching, end surfaces of the epitaxial layers 122 and channel layers 124 and respective outermost sidewalls of the gate spacers 170 are substantially coterminous, due to the anisotropic etching.

Subsequently, the epitaxial layers 122 are laterally or horizontally recessed by using suitable etch techniques, resulting in lateral recesses each vertically between corresponding channel layers 124. This operation may be performed by using a selective etching process. By way of example and not limitation, the epitaxial layers 122 are SiGe and the channel layers 124 are silicon allowing for the selective etching of the epitaxial layers 122. As a result, the channel layers 124 laterally extend past opposite end surfaces of the epitaxial layers 122.

Inner spacers 180 are respectively formed in the recesses. For example, a dielectric material layer is formed over the substrate 110, and one or more etching operations are performed to form the inner spacers 180. In some embodiments, the inner spacers 180 include a silicon nitride-based material, such as SiN, SiON, SiOCN or SiCN and combinations thereof and are different from the material of the gate spacers 170. In some embodiments, the inner spacers 180 are silicon nitride. The inner spacers 180 may fully fill the recesses. The dielectric material layer can be formed using CVD, including PECVD, PEALD, ALD, or other suitable processes. The etching operations include one or more wet and/or dry etching operations. In some embodiments, the etching is an isotropic etching.

Figure 8A:
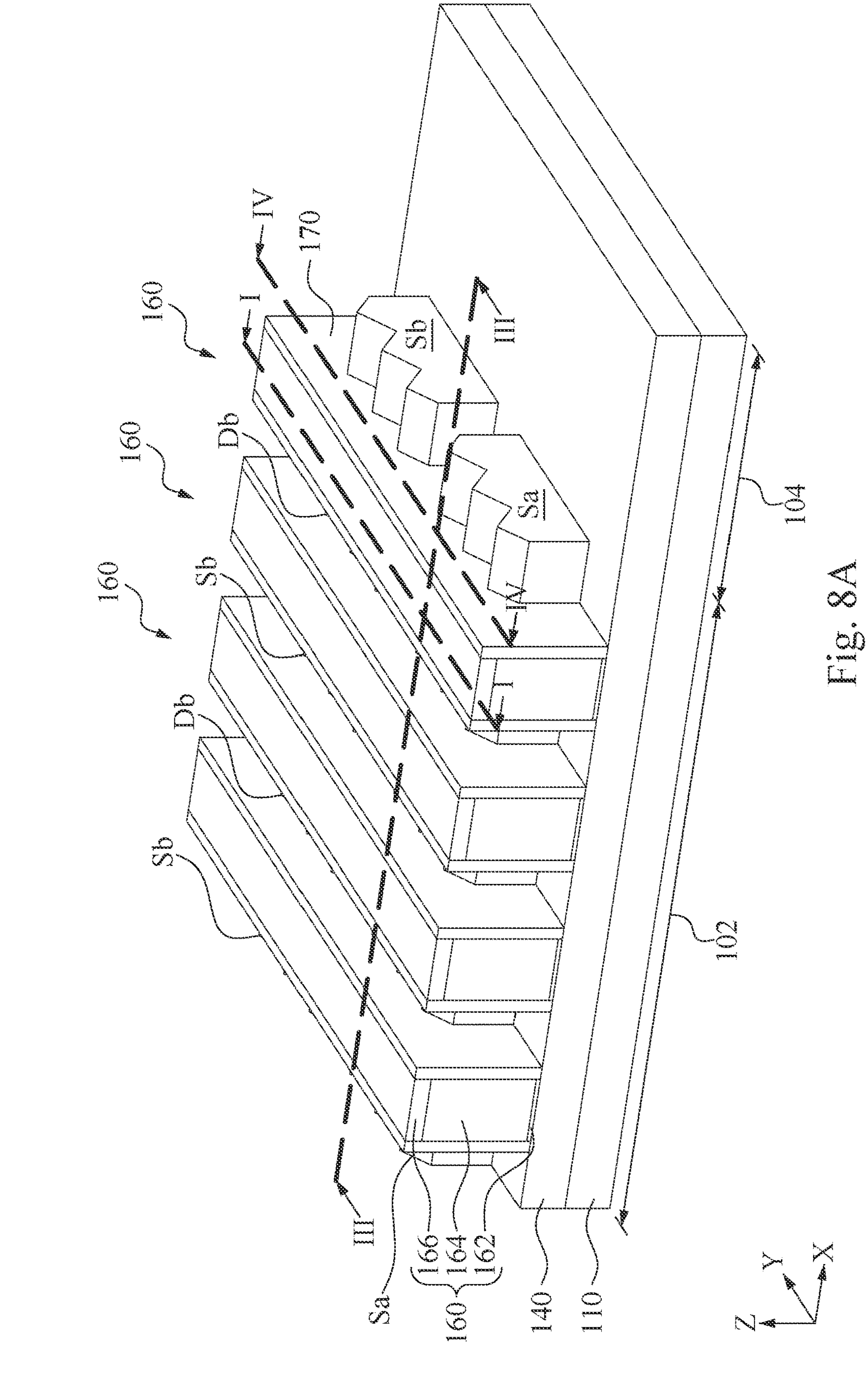
Figure 8B:
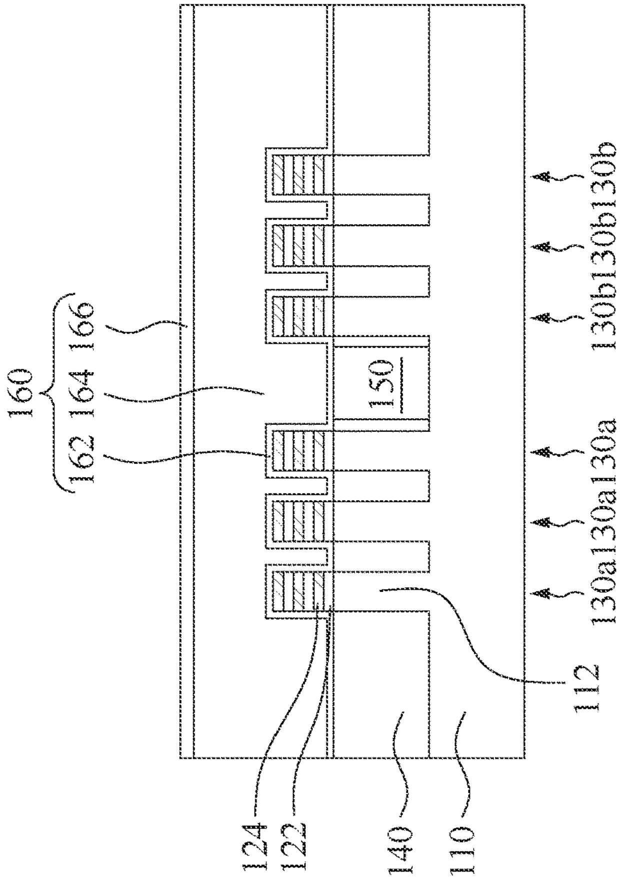
Figure 8C:
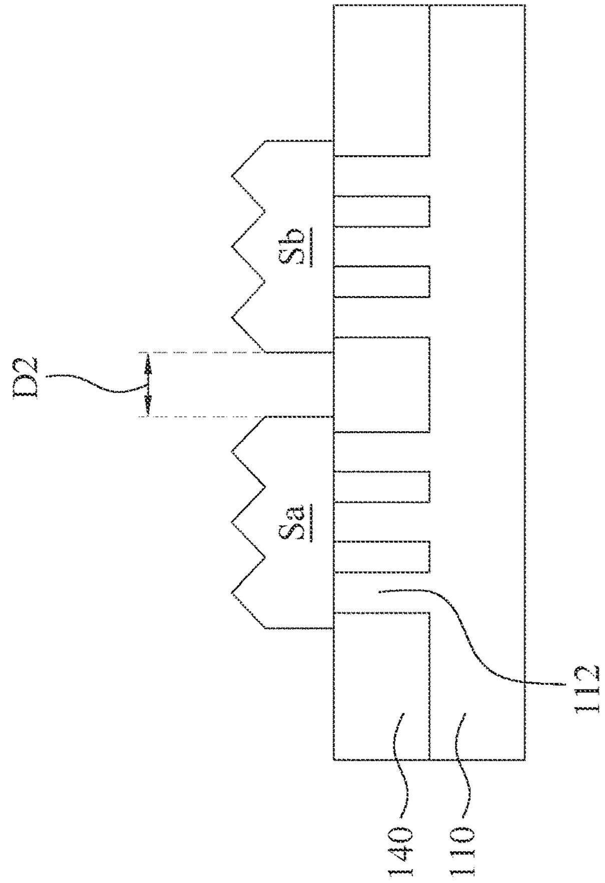
Figure 8D:
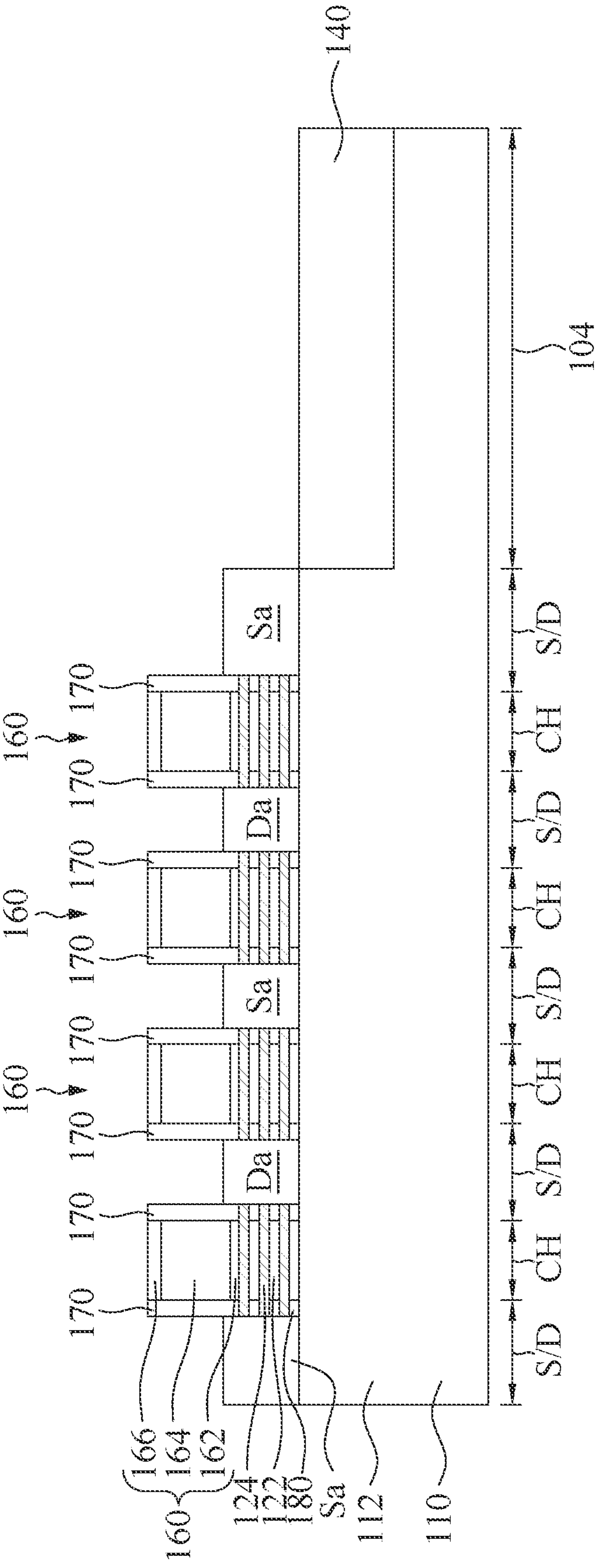

Reference is made to FIGS. 8A-8D, where FIG. 8B is a cross-sectional view taken along line I-I of FIG. 8A, FIG. 8C is a cross-sectional view taken along line IV-IV of FIG. 8A, and FIG. 8D is a cross-sectional view taken along line III-III of FIG. 8A. Source/drain epitaxial structures Sa and Da are formed over the source/drain regions S/D of the fin structures 130*a* (see FIG. 5A), and source/drain epitaxial structures Sb and Db are formed over the source/drain regions S/D of the fin structures 130*b* (see FIG. 5A). The source/drain epitaxial structures Sa are spaced apart from the source/drain epitaxial structures Sb by a distance D2, and the source/drain epitaxial structures Da are spaced apart from the source/drain epitaxial structures Db by the distance D2.

The source/drain epitaxial structures Sa, Sb, Da, and Db may be formed by performing an epitaxial growth process that provides an epitaxial material on the fin structures 130*a* and 130*b*. During the epitaxial growth process, the dummy gate structures 160, gate spacers 170, and the inner spacers 180 limit the source/drain epitaxial structures Sa, Sb, Da, and Db to the source/drain regions S/D. In some embodiments, the lattice constants of the epitaxy structures Sa, Sb, Da, and Db are different from the lattice constant of the epitaxial layers 124, so that the epitaxial layers 124 can be strained or stressed by the epitaxy structures Sa, Sb, Da, and Db to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the epitaxial layers 124.

In some embodiments, the source/drain epitaxial structures Sa, Sb, Da, and Db may include Ge, Si, GaAs, AlGaAs, SiGe, GaAsP, SiP, or other suitable material. The source/drain epitaxial structures Sa, Sb, Da, and Db may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures Sa, Sb, Da, and Db are not in-situ doped, an implantation process (i.e., a junction implant process) is performed to dope the source/drain epitaxial structures Sa, Sb, Da, and Db. In some exemplary embodiments, the source/drain epitaxial structures Sa, Sb, Da, and Db in an n-type transistor include SiP, while those in a p-type include GeSnB and/or SiGeSnB.

Figure 9A:
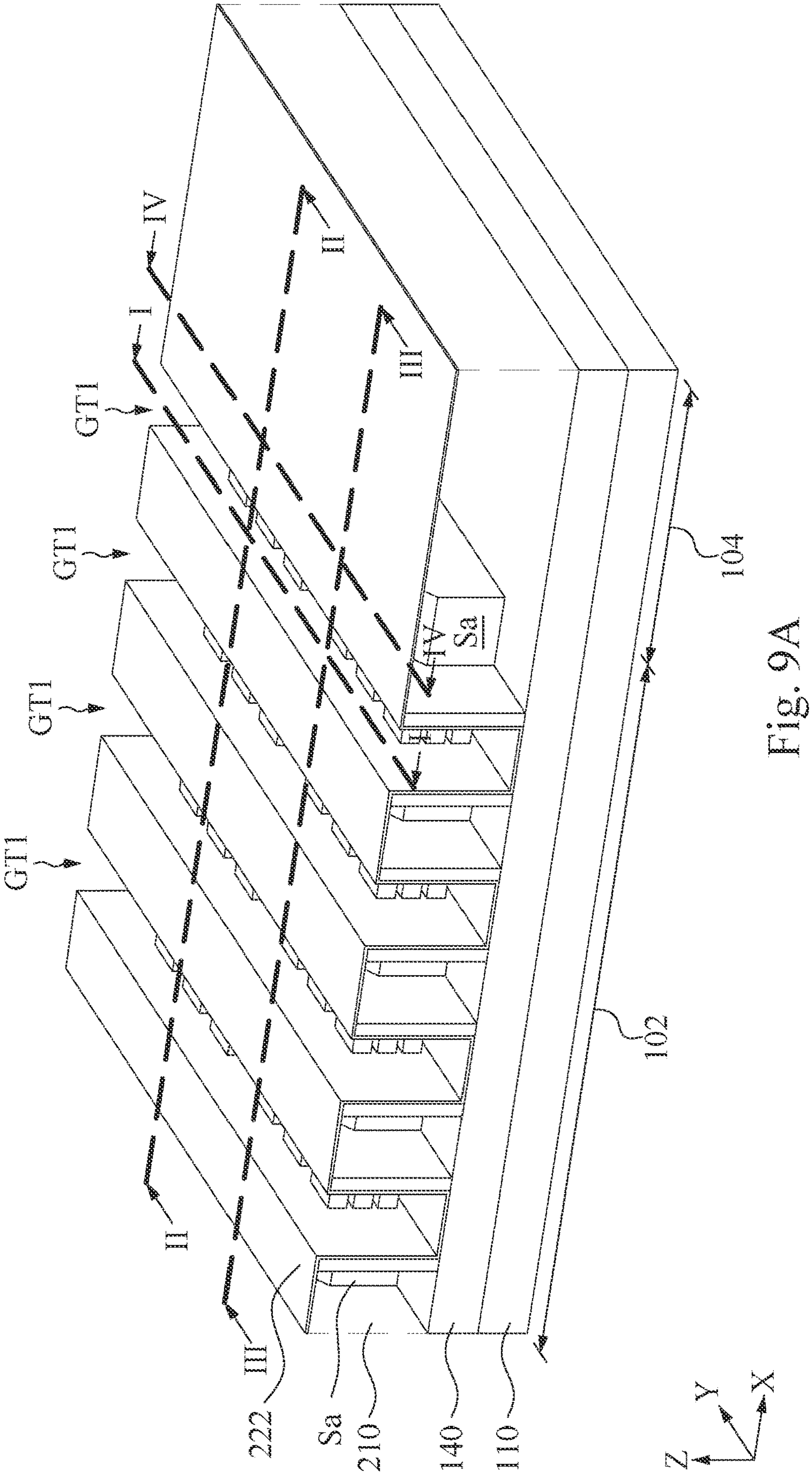
Figure 9C:
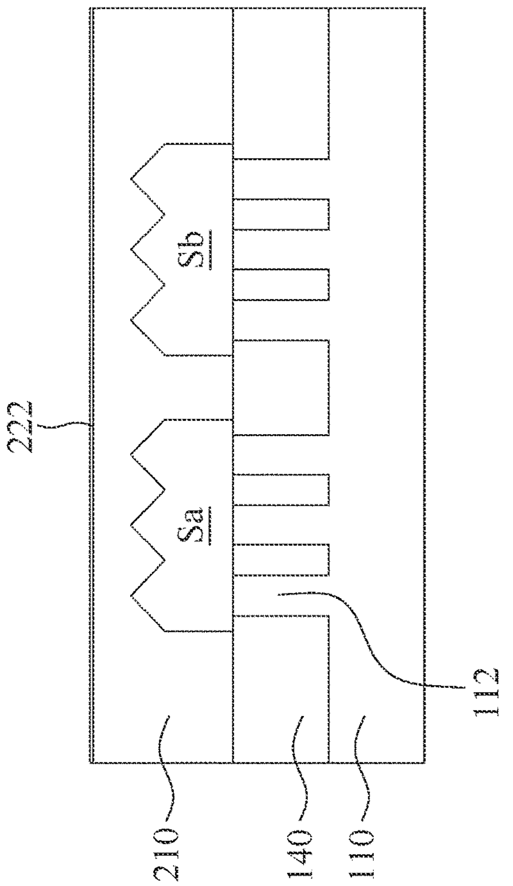
Figure 9B:
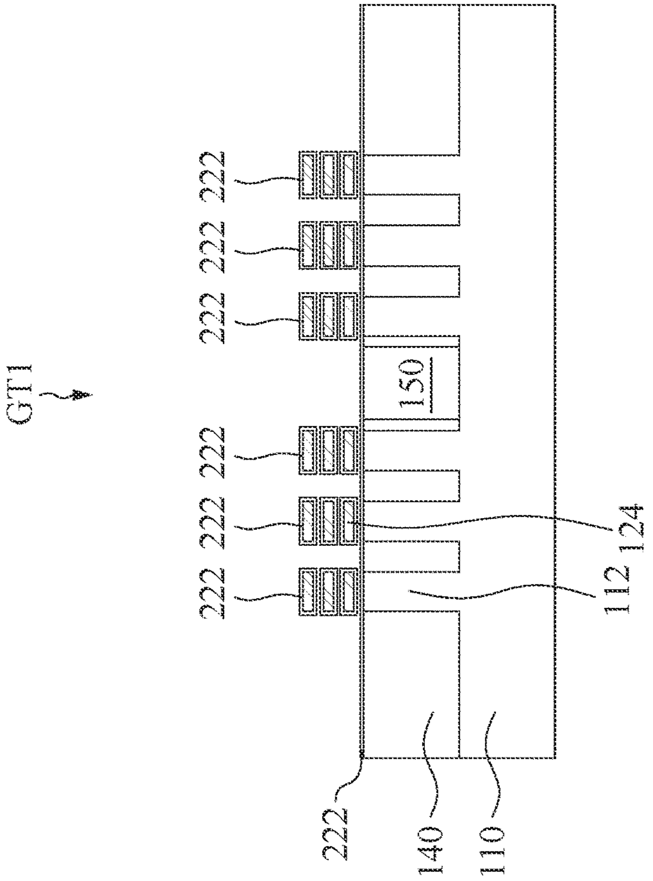
Figure 9D:
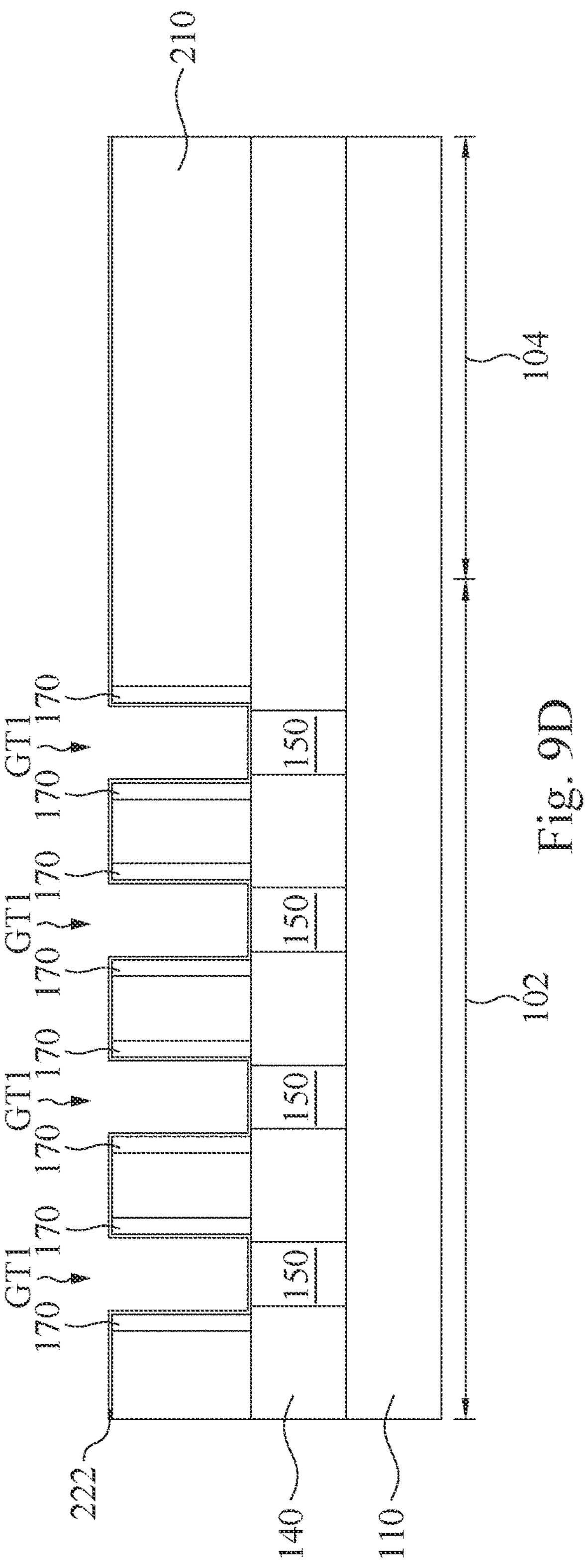
Figure 9E:
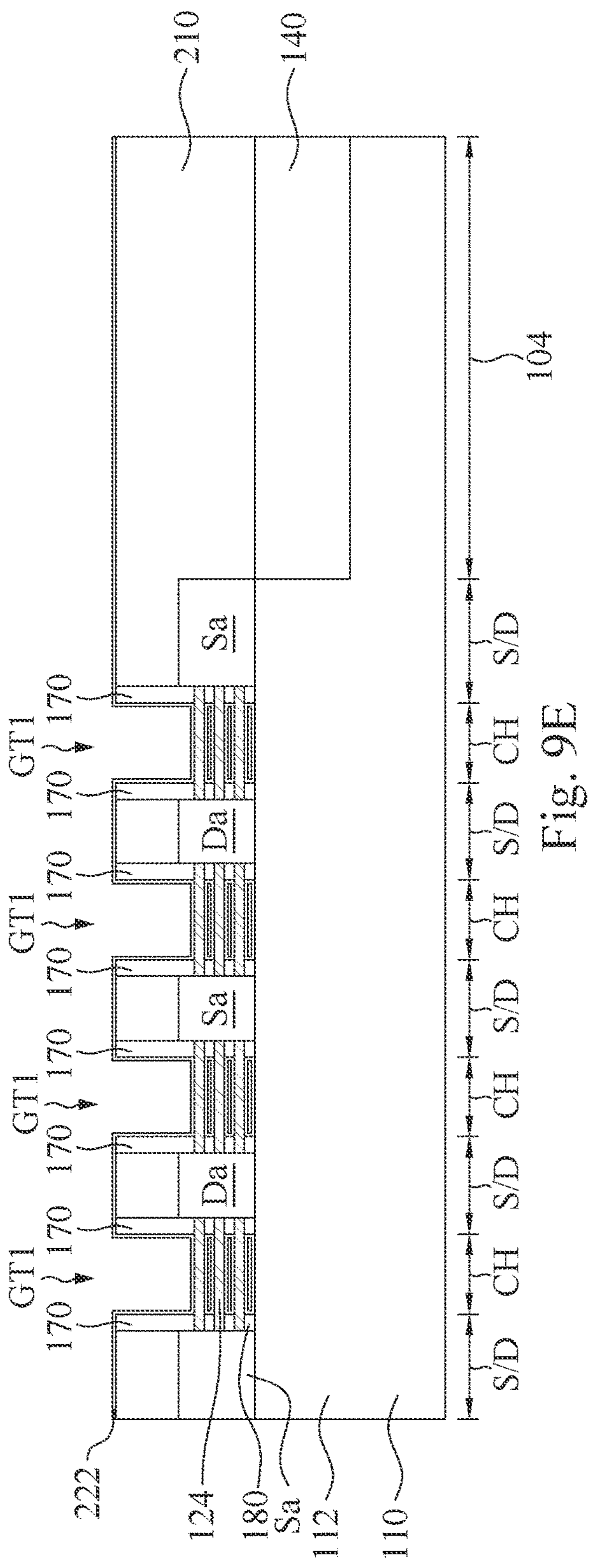

Reference is made to FIGS. 9A-9E, where FIG. 9B is a cross-sectional view taken along line I-I in FIG. 9A, FIG. 9C is a cross-sectional view taken along line IV-IV in FIG. 9A, FIG. 9D is a cross-sectional view taken along line II-II in FIG. 9A, and FIG. 9E is a cross-sectional view taken along line III-III in FIG. 9A. A first interlayer dielectric (ILD) layer 210, which is represented by dashed lines in FIG. 9A for clarity, is formed on the substrate 110. In some embodiments, a contact etch stop layer (CESL) is also formed prior to forming the first ILD layer 210. In some examples, the CESL includes a silicon nitride layer, silicon oxide layer, a silicon oxynitride layer, and/or other suitable materials having a different etch selectivity than the first ILD layer 210. The CESL may be formed by plasma-enhanced chemical vapor deposition (PECVD) process and/or other suitable deposition or oxidation processes. In some embodiments, the first ILD layer 210 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL. The first ILD layer 210 may be deposited by a PECVD process or other suitable deposition technique. In some embodiments, after formation of the first ILD layer 210, the wafer may be subject to a high thermal budget process to anneal the first ILD layer 210.

In some examples, after depositing the first ILD layer 210, a planarization process may be performed to remove excessive materials of the first ILD layer 210. For example, a planarization process includes a chemical mechanical planarization (CMP) process which removes portions of the first ILD layer 210 (and CESL layer, if present) overlying the dummy gate structures 160 and planarizes a top surface of the semiconductor device 100. In some embodiments, the CMP process also removes the hard mask layer 166 (as shown in FIGS. 8A, 8B, and 8D) and exposes the dummy gate electrode layers 164.

Thereafter, the dummy gate structures 160 (as shown in FIGS. 8A, 8B, and 8D) are removed first, and then the epitaxial layers (i.e., sacrificial layers) 122 (as shown in FIGS. 8B and 8D) are removed. In some embodiments, the dummy gate structures 160 are removed by using a selective etching process (e.g., selective dry etching, selective wet etching, or a combination thereof) that etches the materials in dummy gate structures 160 at a faster etch rate than it etches other materials (e.g., the gate spacers 170 and/or the first ILD layer 210), thus resulting in gate trenches GT1 between corresponding gate spacers 170, with the epitaxial layers 122 exposed in the gate trenches GT1. Subsequently, the epitaxial layers 122 in the gate trenches GT1 are removed by using another selective etching process that etches the epitaxial layers 122 at a faster etch rate than it etches the channel layers 124, thus forming openings between neighboring epitaxial layers (i.e., channel layers) 124. In this way, the epitaxial layers 124 become nanosheets suspended over the substrate 110 and between the source/drain epitaxial structures Sa, Sb, Da, and Db. This operation is also called a channel release process. In some embodiments, the epitaxial layers 124 can be interchangeably referred to as nanostructure (nanowires, nanoslabs and nanorings, nanosheet, etc., depending on their geometry). For example, in some other embodiments the epitaxial layers 124 may be trimmed to have a substantial rounded shape (i.e., cylindrical) due to the selective etching process for completely removing the epitaxial layers 122. In that case, the resultant epitaxial layers 124 can be called nanowires. In some other embodiments, the epitaxial layers 124 have an elliptical or diamond cross-sectional shape.

Thereafter, a gate dielectric layer 222 is formed to line the gate trenches GT1. The gate dielectric layer 222 covers the backside gate vias 150 in the gate trenches GT1. The gate dielectric layer 222 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). In some embodiments, the interfacial layer of the gate dielectric layer 222 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 222 may include hafnium oxide ($HfO_2$). Alternatively, the gate dielectric layer 222 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

Figure 10B:
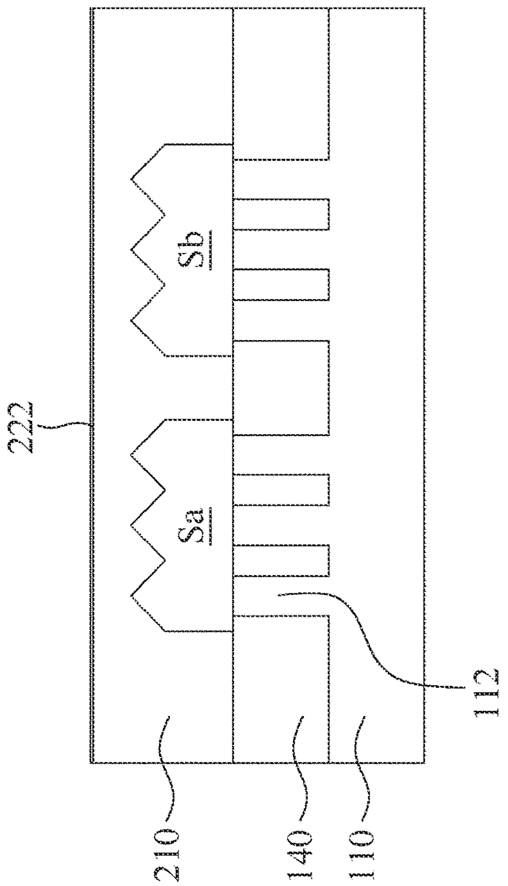
Figure 10A:
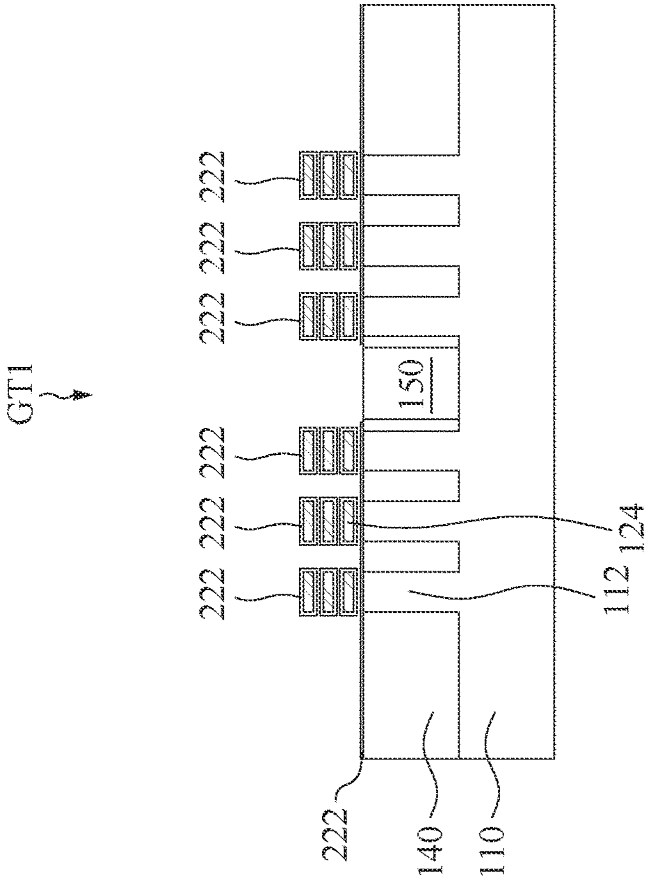
Figure 10C:
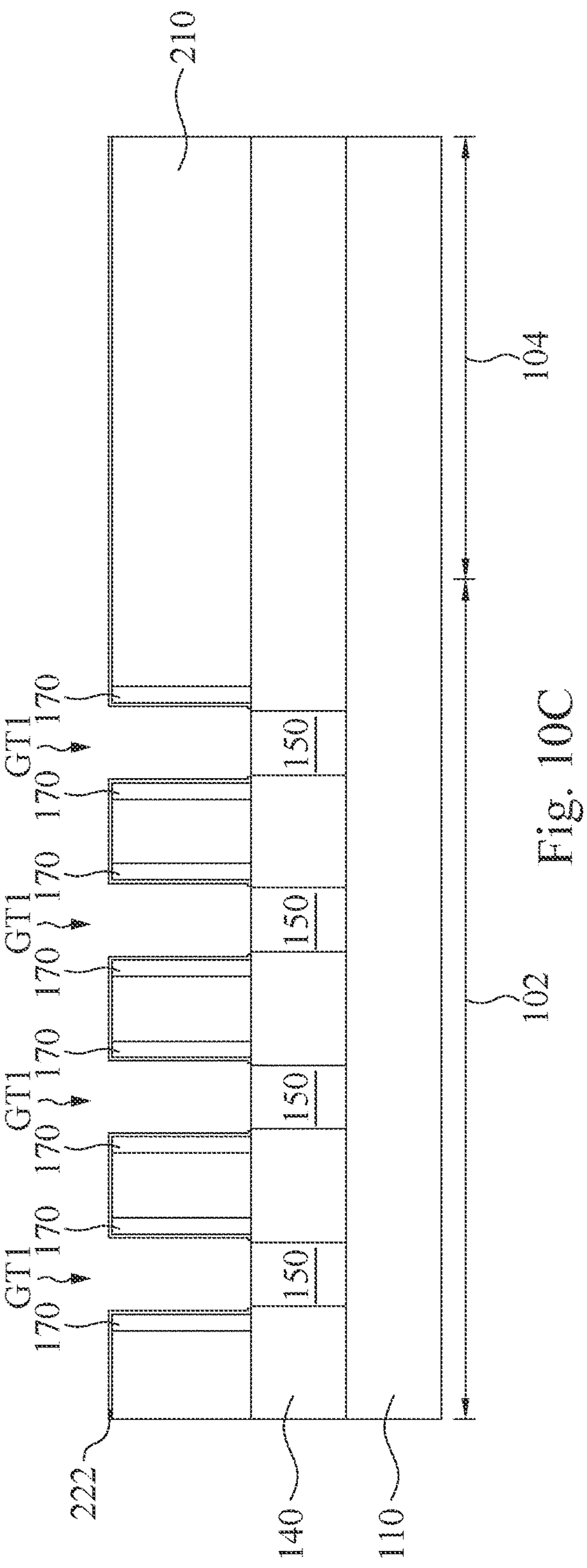
Figure 10D:
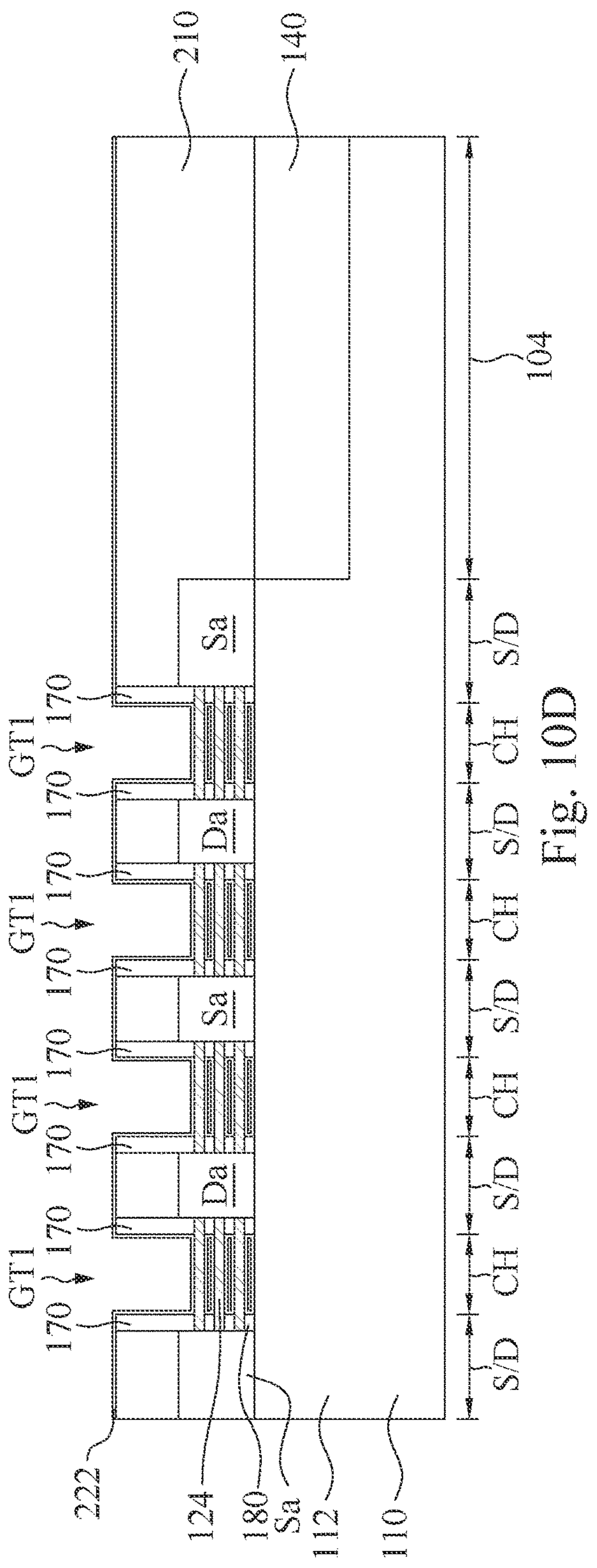

Reference is made to FIGS. 10A-10D. A patterning process is performed to the structure of FIG. 9A, such that portions of the gate dielectric layer 222 covering the top surfaces of the backside gate vias 150 are removed as shown in FIGS. 10A and 10C. For example, a patterned mask layer can be formed over the structure of FIG. 9A. The patterned mask layer exposes the portions of the gate dielectric layer 222 covering the top surfaces of the backside gate vias 150. Subsequently, an etching process is performed to remove these portions of the gate dielectric layer 222, such that the top surfaces of the backside gate vias 150 are exposed. The patterned mask layer is removed after the etching process.

Figure 11A:
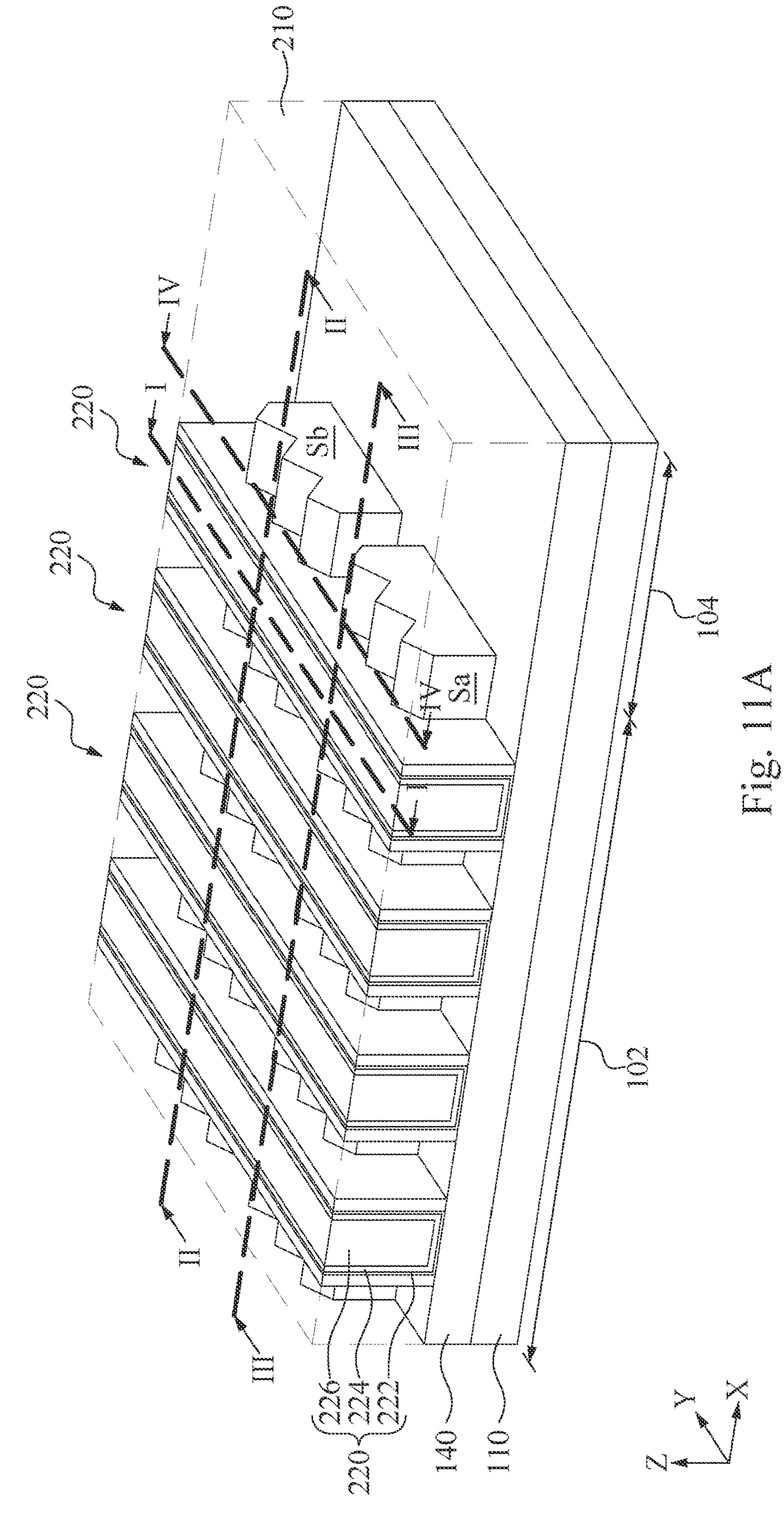
Figure 11C:
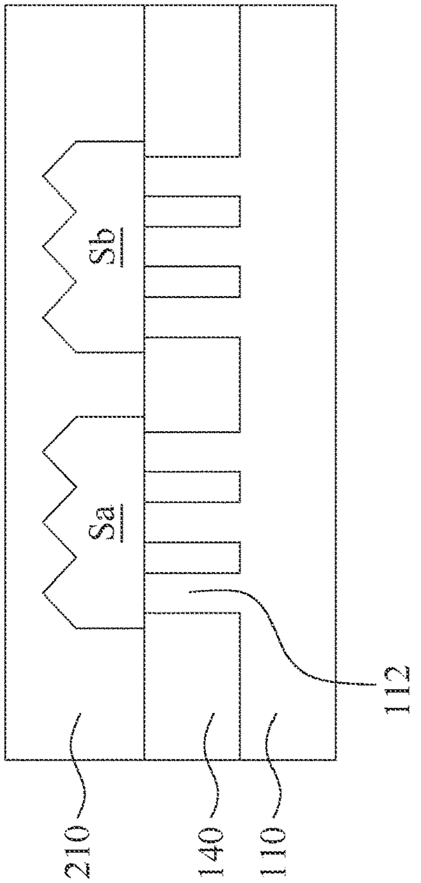
Figure 11B:
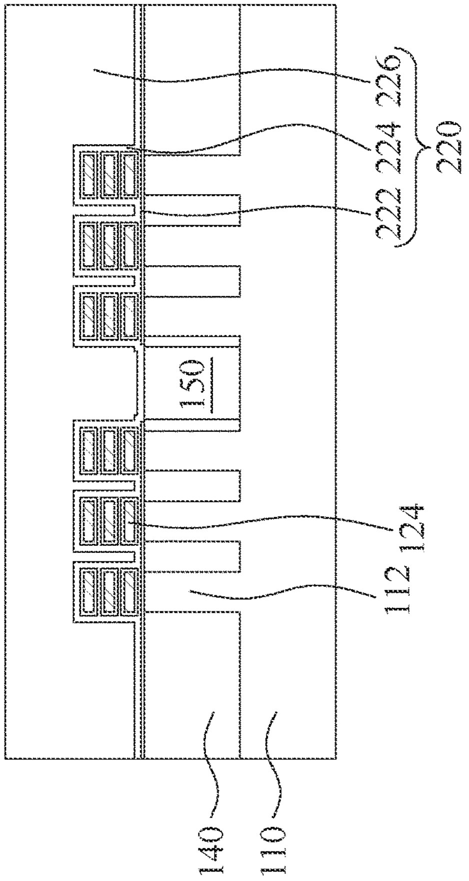
Figure 11D:
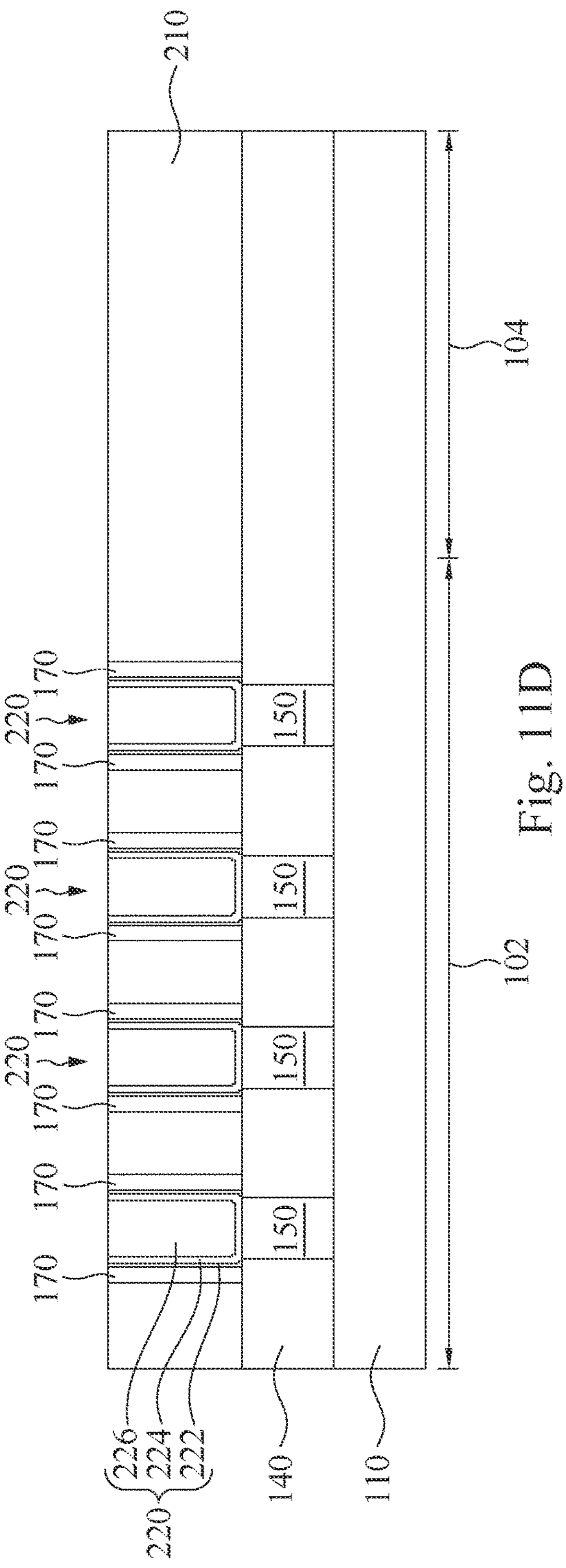
Figure 11E:
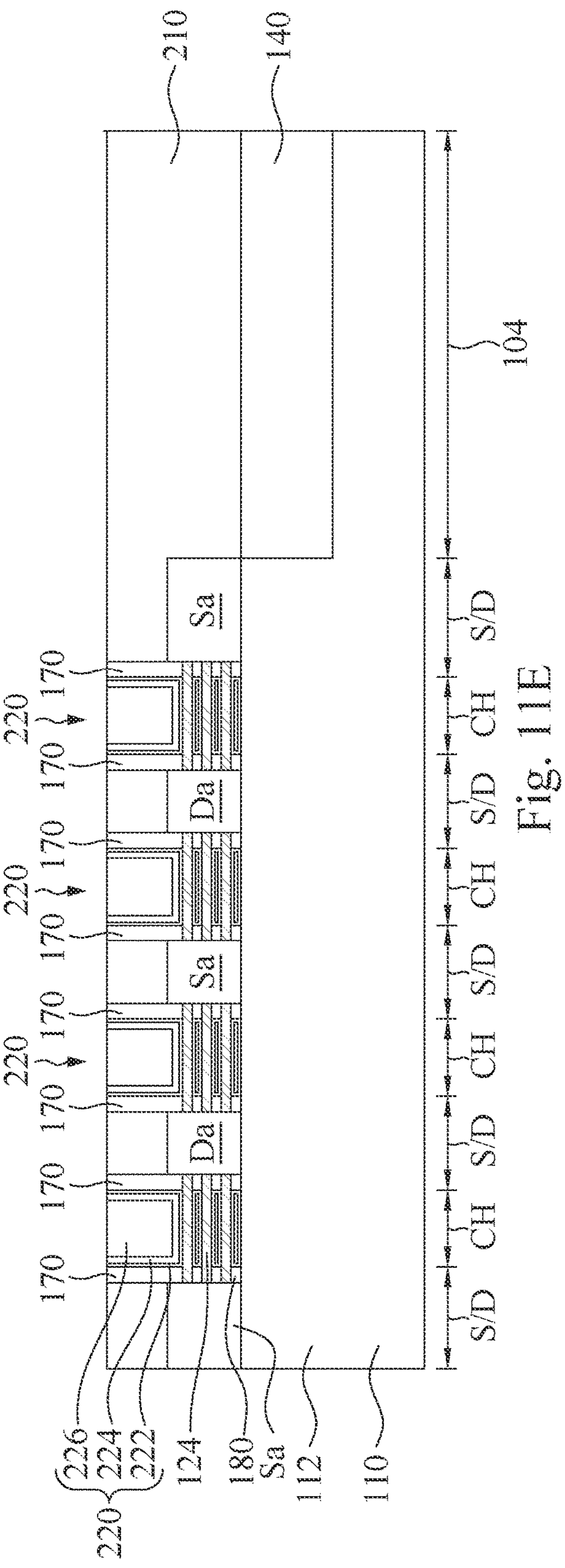

Reference is made to FIGS. 11A-11E, where FIG. 11B is a cross-sectional view taken along line I-I in FIG. 11A, FIG. 11C is a cross-sectional view taken along line IV-IV in FIG. 11A, FIG. 11D is a cross-sectional view taken along line II-II in FIG. 11A, and FIG. 11E is a cross-sectional view taken along line III-III in FIG. 11A. Gate electrodes (including work function metal layers 224 and fill metals 226) are formed in the gate trenches GT1 to form gate structures 220. The gate structures 220 may be the final gates of the GAA FETs. Formation of the gate structures 220 may include multiple deposition processes to form various gate materials, one or more liner layers, and one or more CMP processes to remove excessive gate materials.

The work function metal layer 224 may include work function metals to provide a suitable work function for the gate structures 220. For an n-type FET, the work function metal layer 224 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type FET, the work function metal layer 224 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

In some embodiments, the fill metal 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 12A:
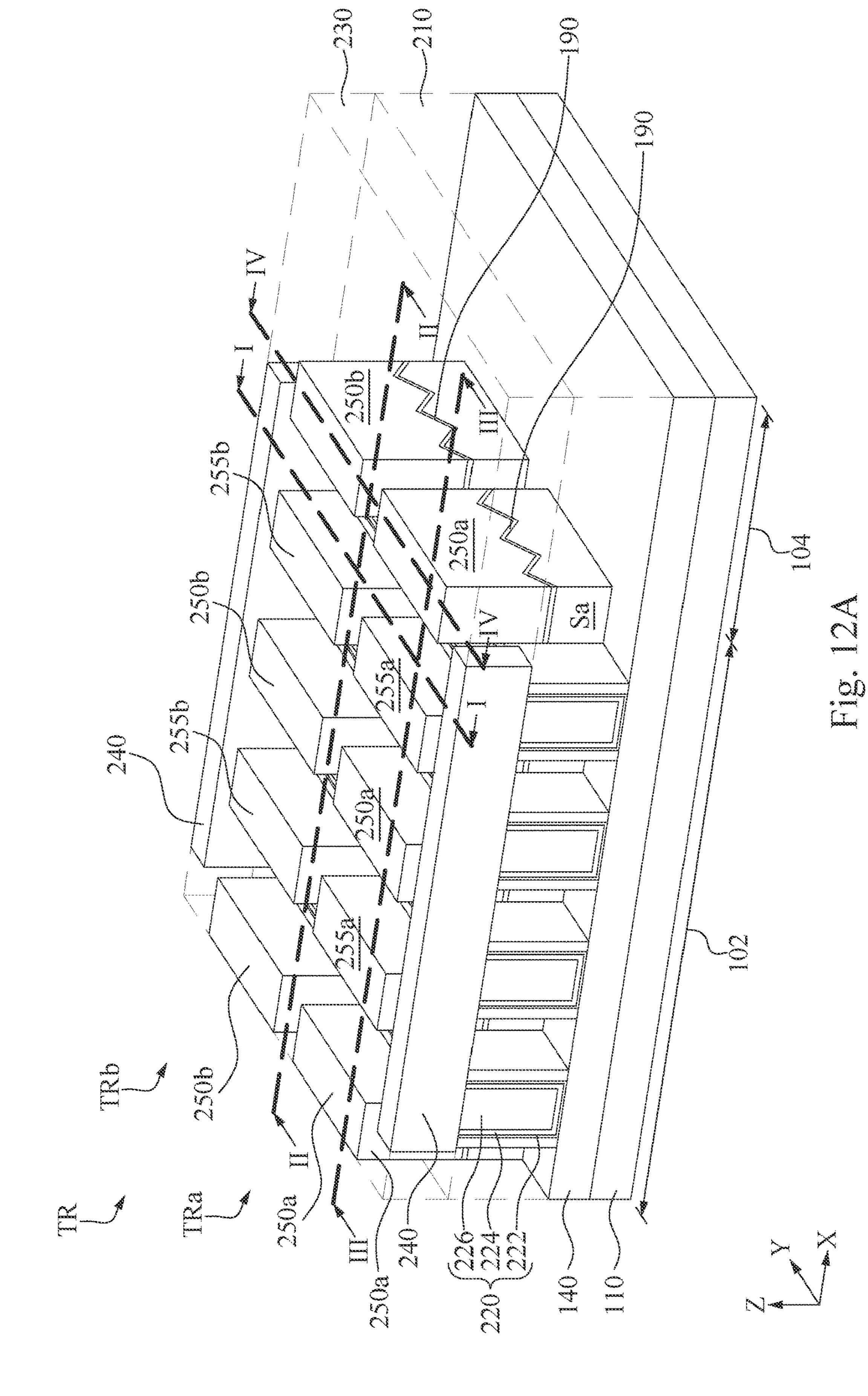
Figure 12B:
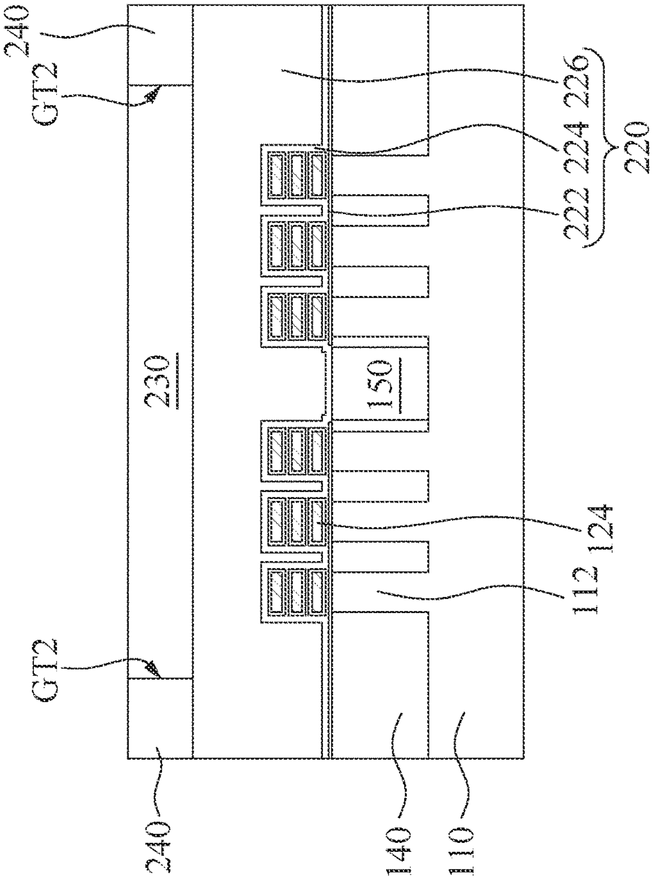
Figure 12C:
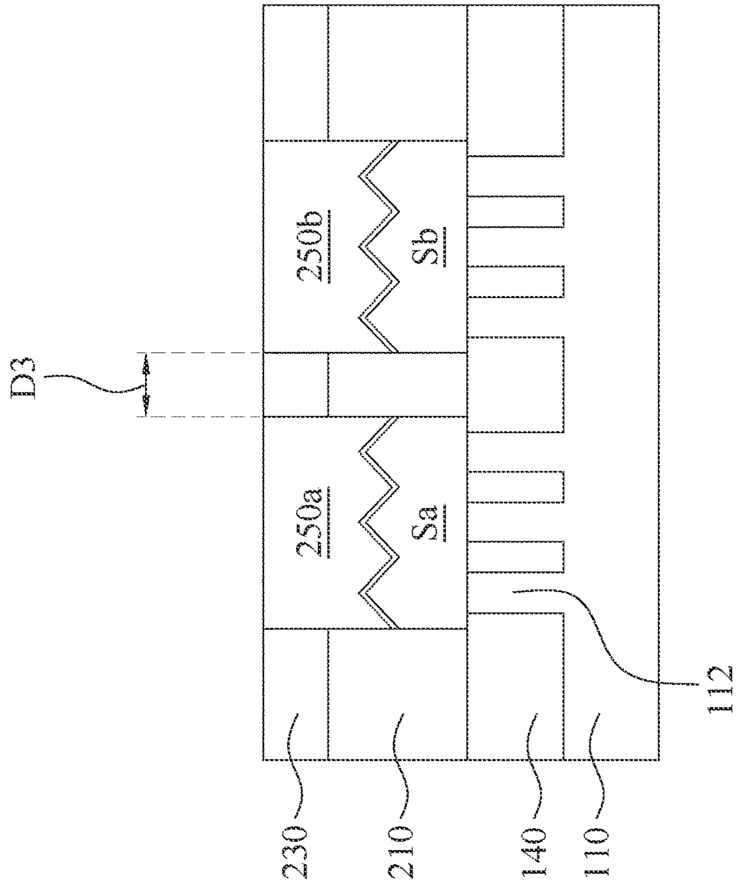
Figure 12D:
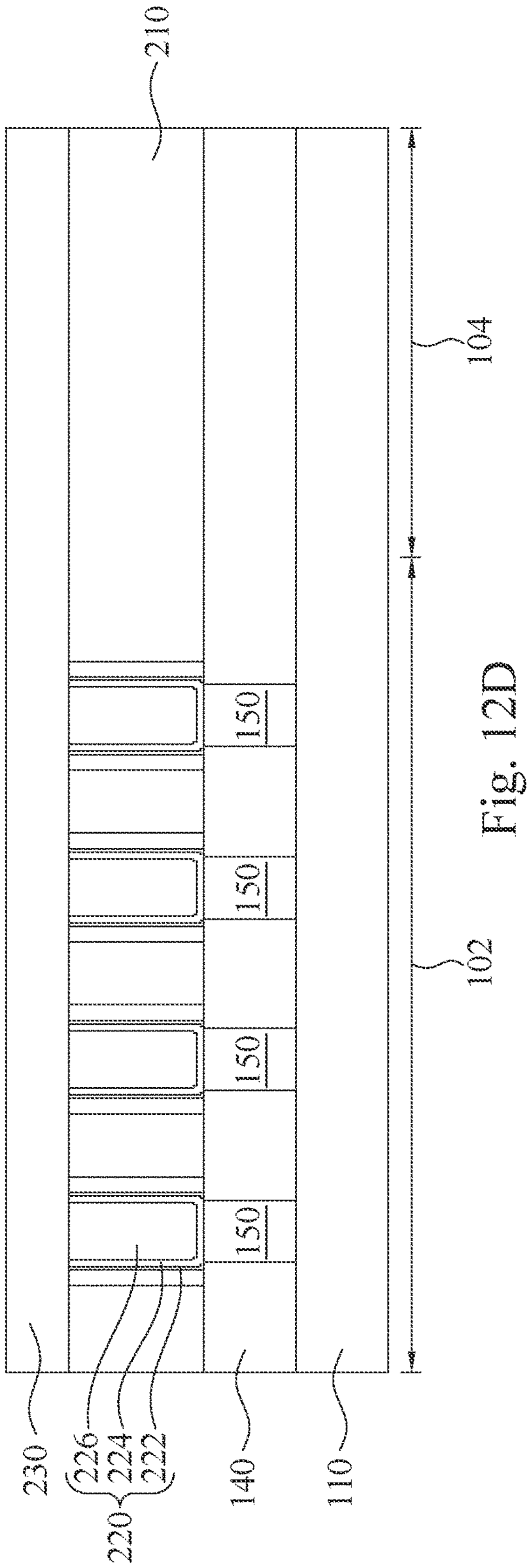
Figure 12E:
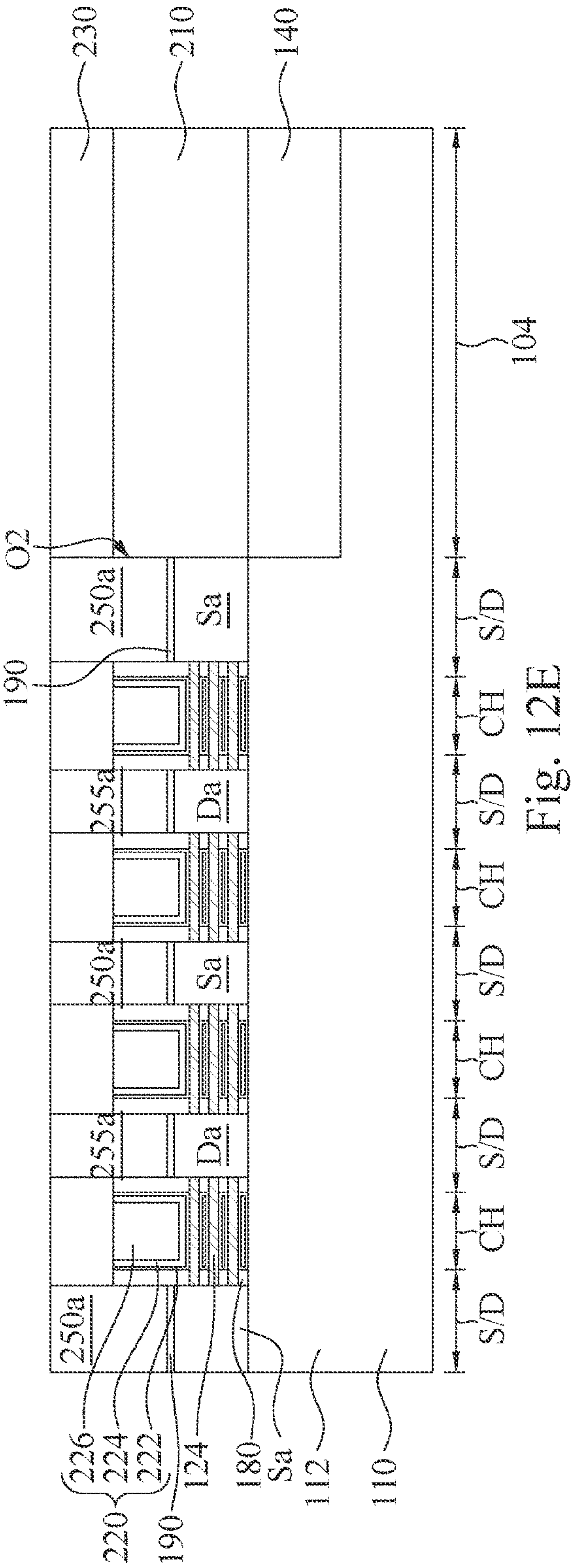

Reference is made to FIGS. 12A-12E, where FIG. 12B is a cross-sectional view taken along line I-I in FIG. 12A, FIG. 12C is a cross-sectional view taken along line IV-IV in FIG. 12A, FIG. 12D is a cross-sectional view taken along line II-II in FIG. 12A, and FIG. 12E is a cross-sectional view taken along line III-III in FIG. 12A. A second ILD layer 230, which is represented by dashed lines in FIG. 12A for clarity, is formed over the substrate 110. In some embodiments, the second ILD layer 230 includes materials such as tetraethylorthosilicate (TEOS)-formed oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The second ILD layer 230 may be deposited by a PECVD process or other suitable deposition technique.

Subsequently, the second ILD layer 230 is patterned to form source/drain contact openings O2 extending downward through the second ILD layer 230 and the first ILD layer 210 to the source/drain epitaxial structures Sa, Sb, Da, and Db. Next, metal alloy layers 190 are respectively formed above the source/drain epitaxial structures Sa, Sb, Da, and Db. The metal alloy layers 190, which may be silicide layers, are respectively formed in the source/drain contact openings O2 and over the exposed source/drain epitaxial structures Sa, Sb, Da, and Db by a self-aligned silicide (salicide) process. The silicide process converts the surface portions of the source/drain epitaxial structures Sa, Sb, Da, and Db into the silicide contacts. Silicide processing involves deposition of a metal that undergoes a silicidation reaction with silicon (Si). In order to form silicide contacts on the source/drain epitaxial structures Sa, Sb, Da, and Db, a metal material is blanket deposited on the source/drain epitaxial structures Sa, Sb, Da, and Db. After heating the wafer to a temperature at which the metal reacts with the silicon of the source/drain epitaxial structures Sa, Sb, Da, and Db to form contacts, unreacted metal is removed. The silicide contacts remain over the source/drain epitaxial structures Sa, Sb, Da, and Db, while unreacted metal is removed from other areas. The silicide layer may include a material selected from titanium silicide, cobalt silicide, nickel silicide, platinum silicide, nickel platinum silicide, erbium silicide, palladium silicide, combinations thereof, or other suitable materials. In some embodiments, the metal alloy layer 190 may include germanium.

Source/drain contacts 250*a*, 250*b*, 255*a*, and 255*b* are formed to fill the source/drain contact openings O2. The source/drain contacts 250*a* are electrically connected to the source/drain epitaxial structures Sa, the source/drain contacts 250*b* are electrically connected to the source/drain epitaxial structures Sb, the source/drain contacts 255*a* are electrically connected to the source/drain epitaxial structures Da, and the source/drain contacts 255*b* are electrically connected to the source/drain epitaxial structures Db. The source/drain contacts 250*a* are spaced apart from the source/drain contacts 250*b* by a distance D3, and the source/drain contacts 255*a* are spaced apart from the source/drain contacts 255*b* by the distance D3.

After the formation of the source/drain contacts 250*a*, 250*b*, 255*a*, and 255*b*, a transistor array TR is formed over the substrate 110. The transistor array TR includes a first portion TRa and a second portion TRb arranged along the Y direction. Each of the first portion TRa and the second portion TRb includes at least one transistor. For example, in FIG. 12A, each of the first portion TRa and the second portion TRb includes four transistors arranged in the X direction.

The second ILD layer 230 is further patterned to form gate trenches GT2 extending downward to the gate structures 220. The second ILD layer 230 can be patterned by using suitable photolithography and etching techniques. Gate conductive lines 240 are formed to fill the gate trenches GT2. The gate conductive lines 240 are over the transistor array TR and electrically and physically interconnect the gate structures 220.

The source/drain contacts 250*a*, 250*b*, 255*a*, and 255*b*, and the gate conductive lines 240 are formed using, by way of example and not limitation, depositing metal materials overfilling the source/drain contact openings O2 or the gate trenches GT2 followed by CMP processes to remove excessive metal material(s) outside the source/drain contact openings O2 or the gate trenches GT2. As a result of the CMP processes, the source/drain contacts 250*a*, 250*b*, 255*a*, and 255*b*, and the gate conductive lines 240 have top surfaces substantially coplanar with the second ILD layer 230. The source/drain contacts 250*a*, 250*b*, 255*a*, and 255*b*, and the gate conductive lines 240 may include metal materials such as Pt, Ti, TiN, Al, W, WN, Ru, RuO, Ta, Ni, Co, Cu, Ag, Au, combinations thereof, or the like, and may be formed using PVD, CVD, ALD, or the like. In some embodiments, the source/drain contacts 250*a*, 250*b*, 255*a*, and 255*b*, and the gate conductive lines 240 may further include one or more barrier/adhesion layers (not shown) to protect the second ILD layer 230 (and the first ILD layer 210) from metal diffusion (e.g., copper diffusion). The one or more barrier/adhesion layers may include titanium, titanium nitride, tantalum, tantalum nitride, or the like, and may be formed using PVD, CVD, ALD, or the like.

Figure 13A:
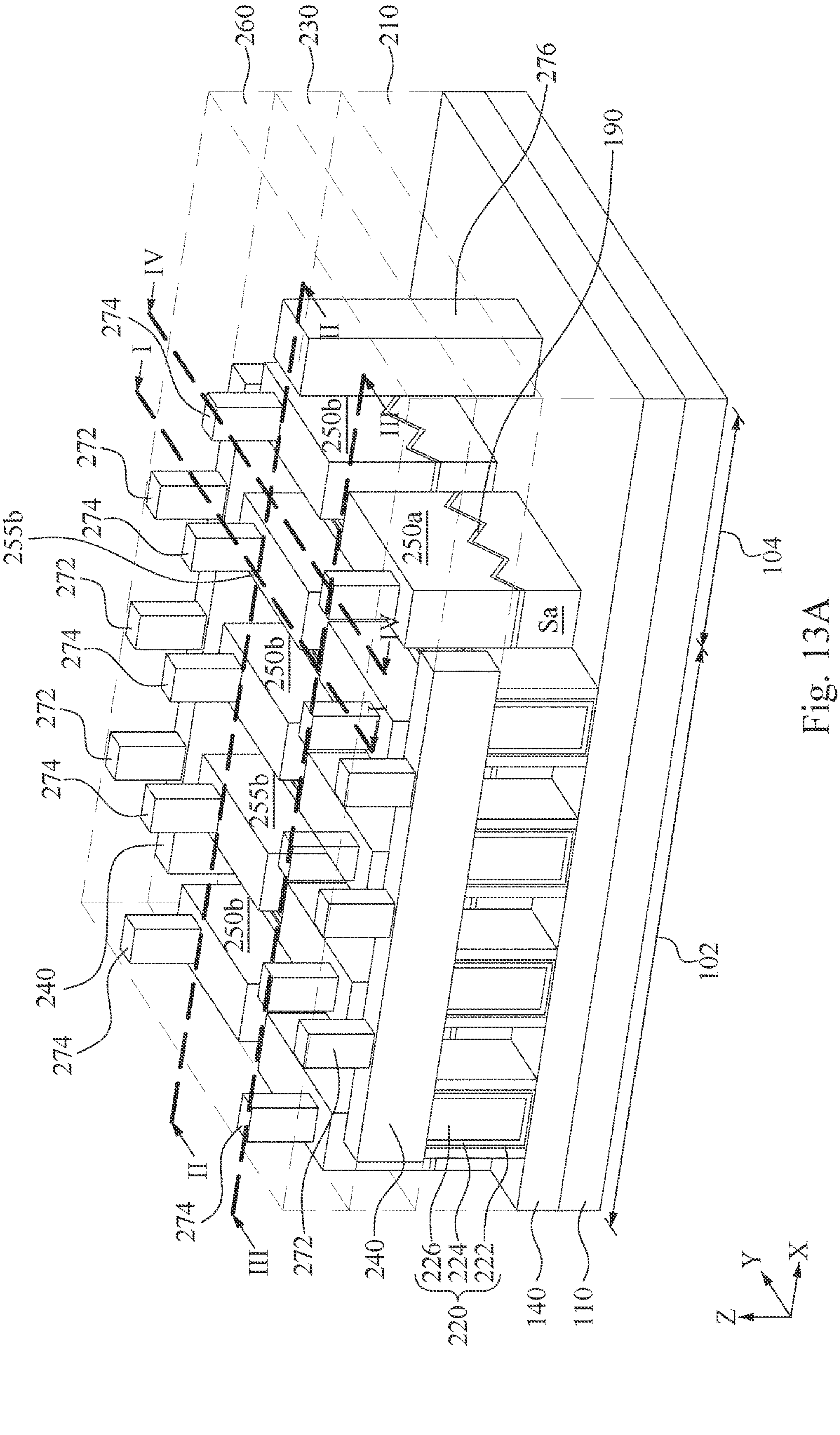
Figure 13B:
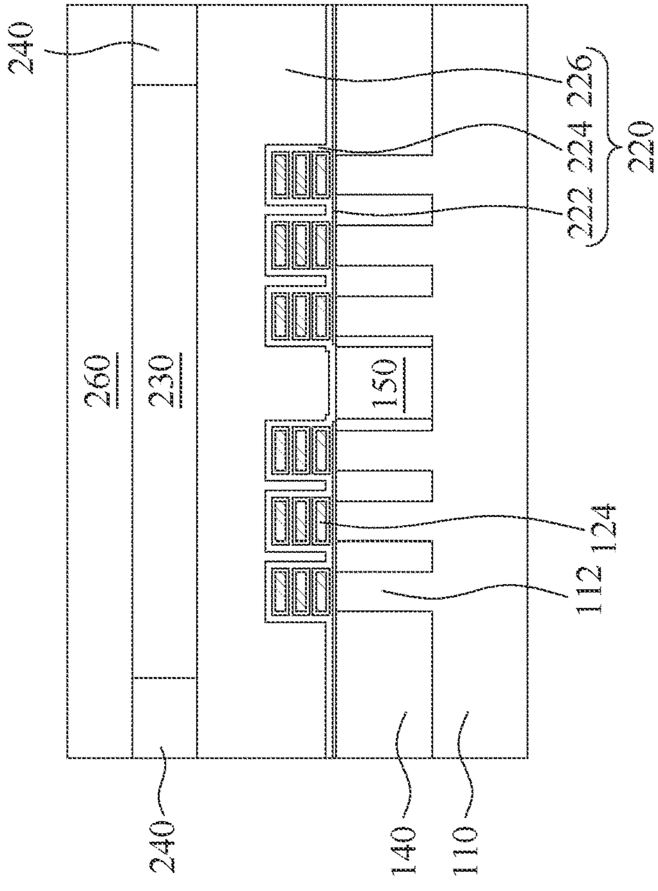
Figure 13C:
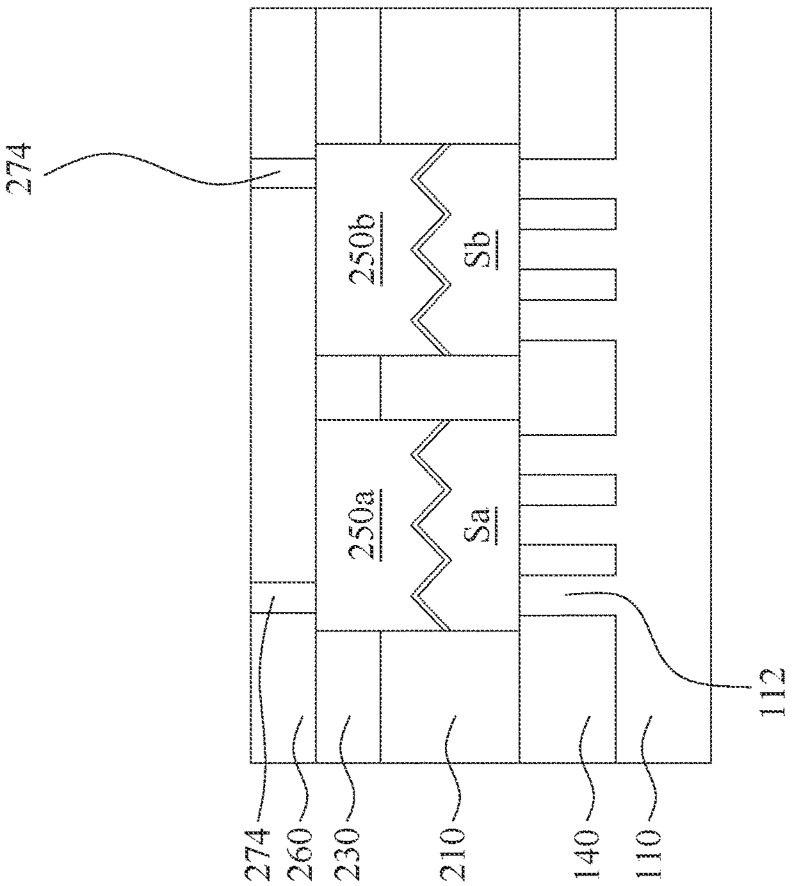
Figure 13D:
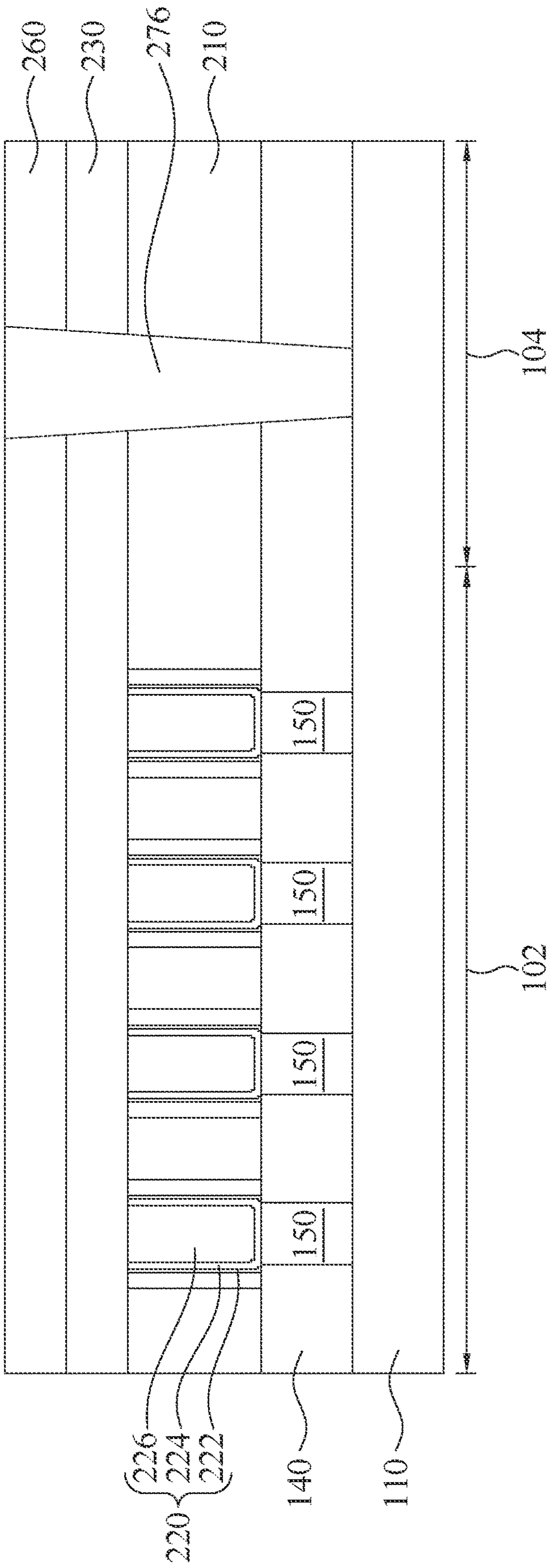
Figure 13E:
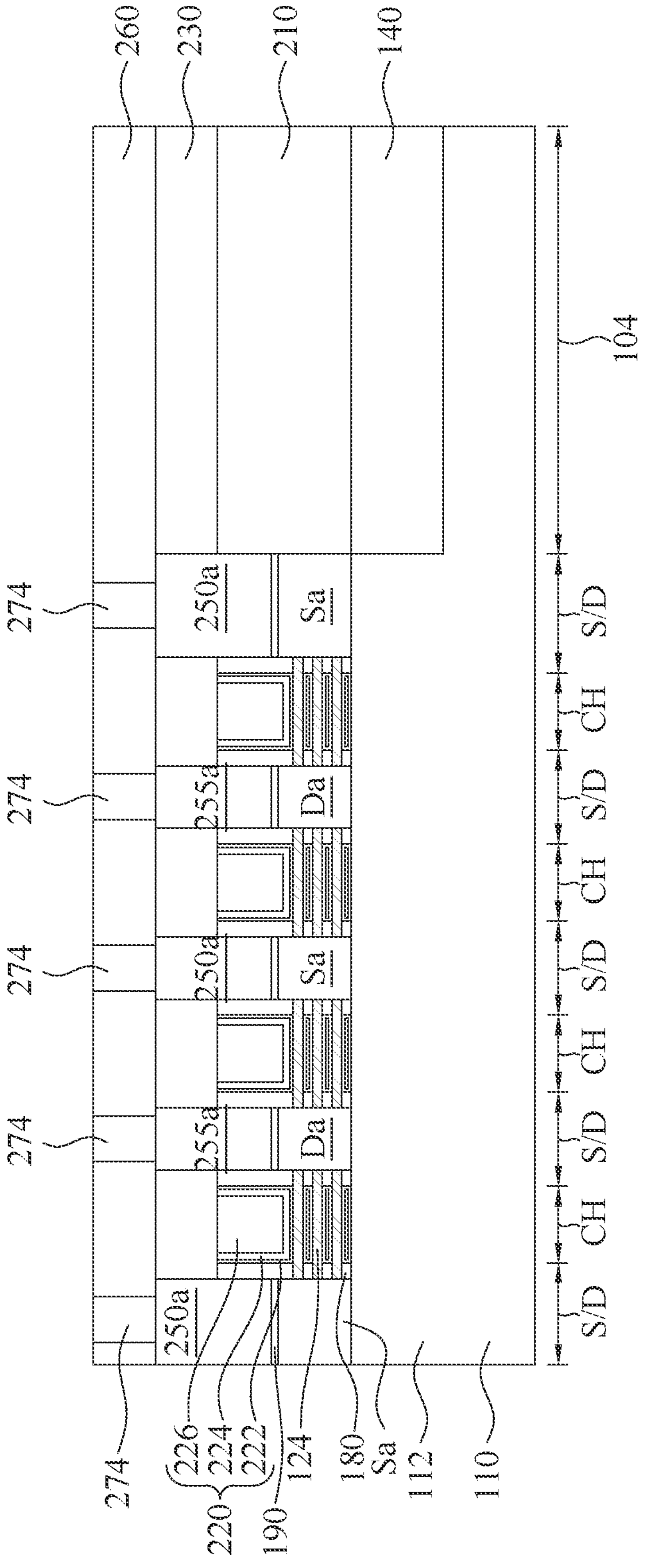

Reference is made to FIGS. 13A-13E, where FIG. 13B is a cross-sectional view taken along line I-I in FIG. 13A, FIG. 13C is a cross-sectional view taken along line IV-IV in FIG. 13A, FIG. 13D is a cross-sectional view taken along line II-II in FIG. 13A, and FIG. 13E is a cross-sectional view taken along line III-III in FIG. 13A. A third ILD layer 260, which is represented by dashed lines in FIG. 13A for clarity, is formed over the substrate 110. Materials, configurations, dimensions, processes and/or operations regarding the third ILD layer 260 are similar to or the same as the second ILD layer 230 of FIG. 12A.

Subsequently, front-side gate vias 272 and source/drain vias 274 are formed in the third ILD layer 260. Further, as shown in FIGS. 13A and 13D, at least one through via 276 is formed extending downward through the third ILD layer 260, the second ILD layer 230, the first ILD layer 210, and the isolation structure 140 to the peripheral region 104 of the substrate 110. The front-side gate vias 272, the source/drain vias 274, and the through via 276 are formed using, by way of example and not limitation, etching the third ILD layer 260 (and the second ILD layer 230, the first ILD layer 210, and the isolation structure 140) to form openings therein, depositing one or more metal materials overfilling the openings followed by a CMP process to remove excessive metal material(s) outside the openings. As a result of the CMP process, the front-side gate vias 272, the source/drain vias 274, and the through via 276 have top surfaces substantially coplanar with the third ILD layer 260. The front-side gate vias 272 are electrically and physically connected the gate conductive lines 240, and the source/drain vias 274 are electrically and physically connected the source/drain contacts 250*a* or 250*b*. The front-side gate vias 272, the source/drain vias 274, and the through via 276 may include metal materials such as Pt. Ti, TiN, Al, W, WN, Ru, RuO, Ta, Ni, Co, Cu, Ag, Au, combinations thereof, or the like, and may be formed using PVD, CVD, ALD, or the like. In some embodiments, the front-side gate vias 272, the source/drain vias 274, and the through via 276 may further include one or more barrier/adhesion layers (not shown) to protect the third ILD layer 260 (and the second ILD layer 230, the first ILD layer 210, and the isolation structure 140) from metal diffusion (e.g., copper diffusion). The one or more barrier/adhesion layers may include titanium, titanium nitride, tantalum, tantalum nitride, or the like, and may be formed using PVD, CVD, ALD, or the like.

Figure 14A:
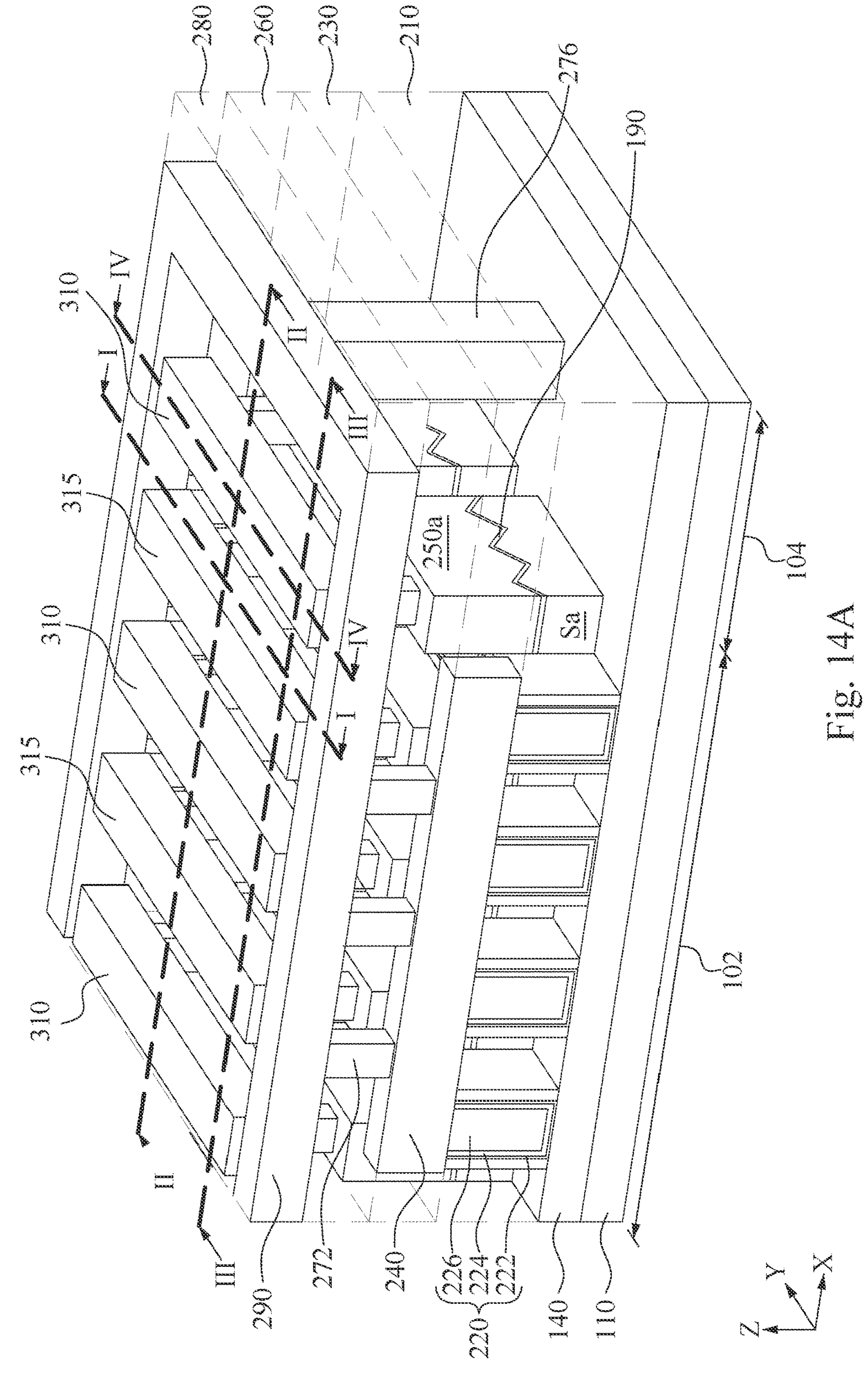
Figure 14C:
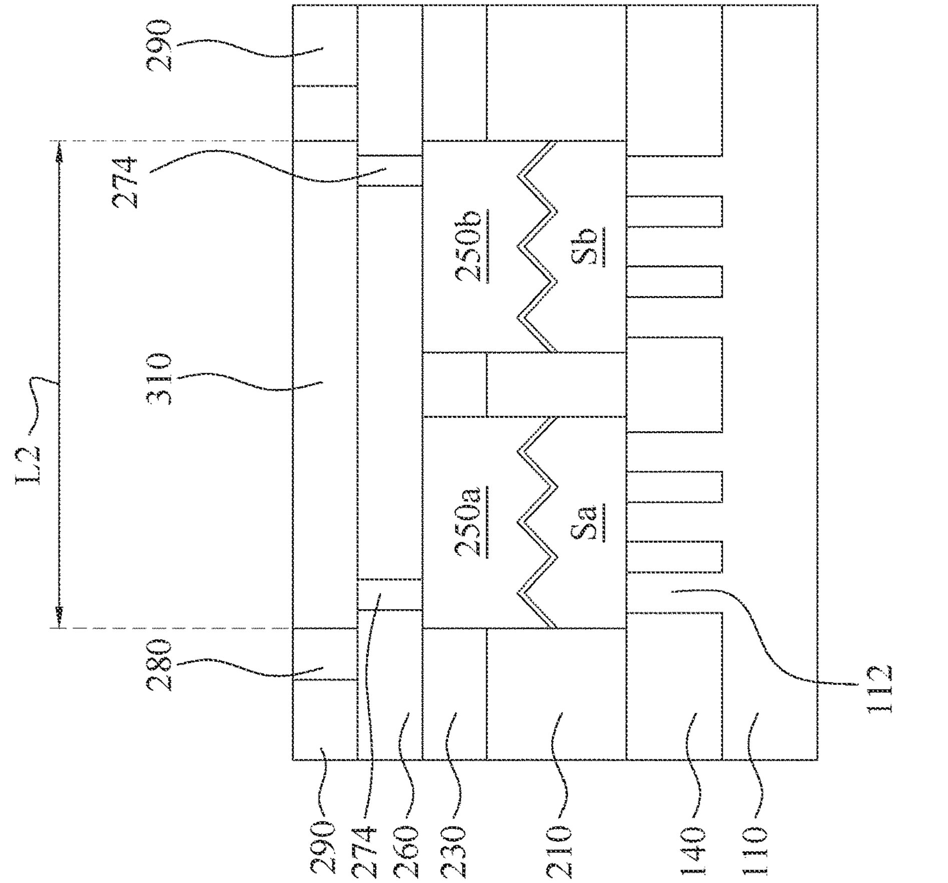
Figure 14B:
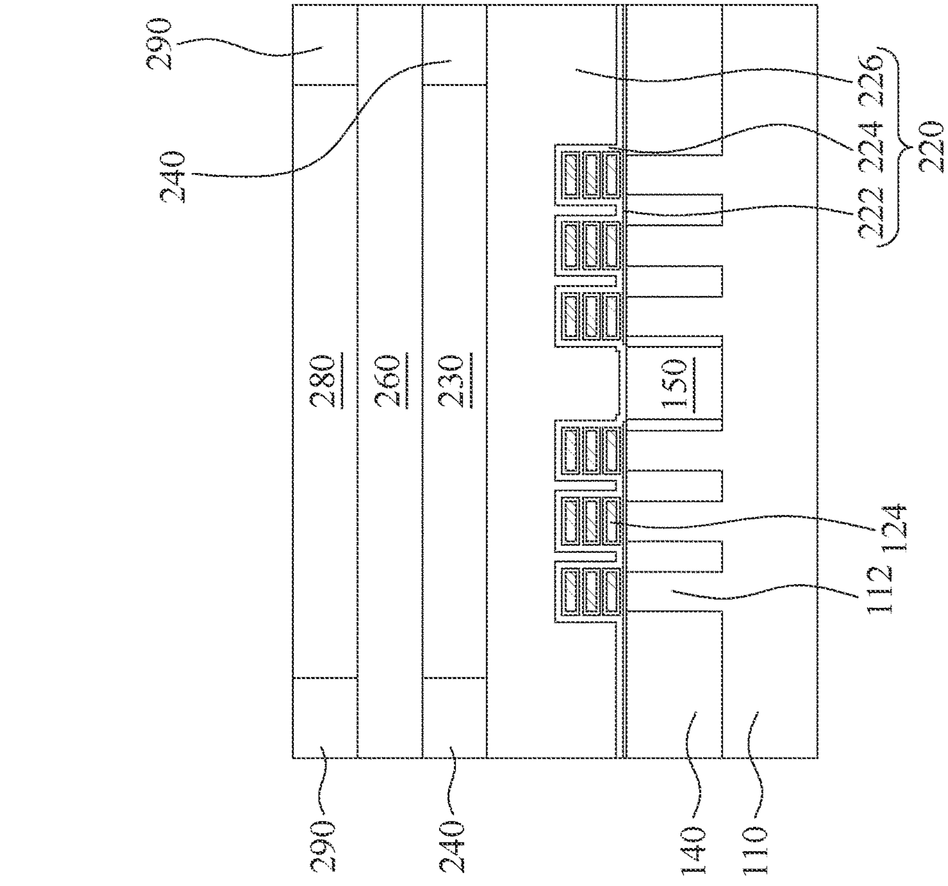
Figure 14D:
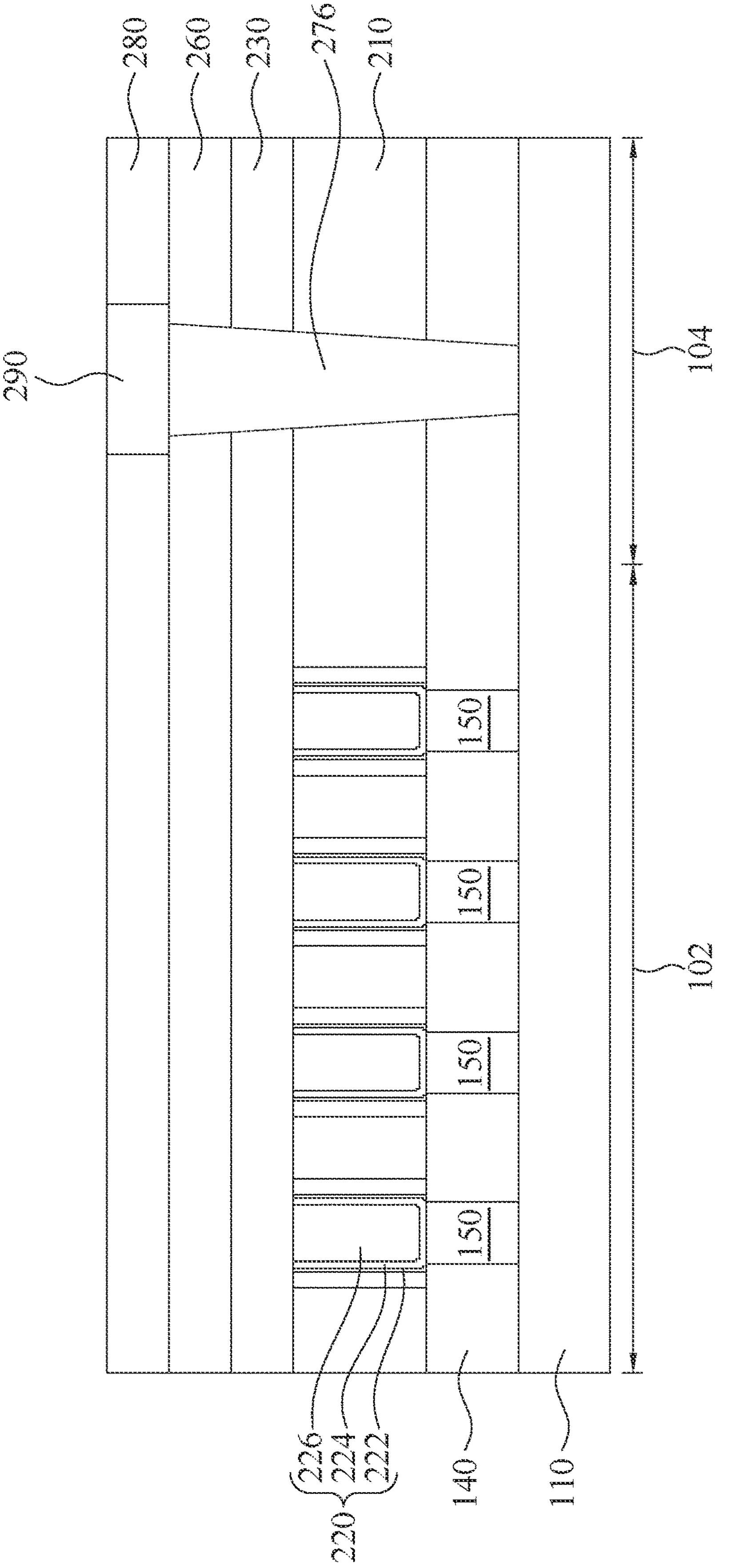
Figure 14E:
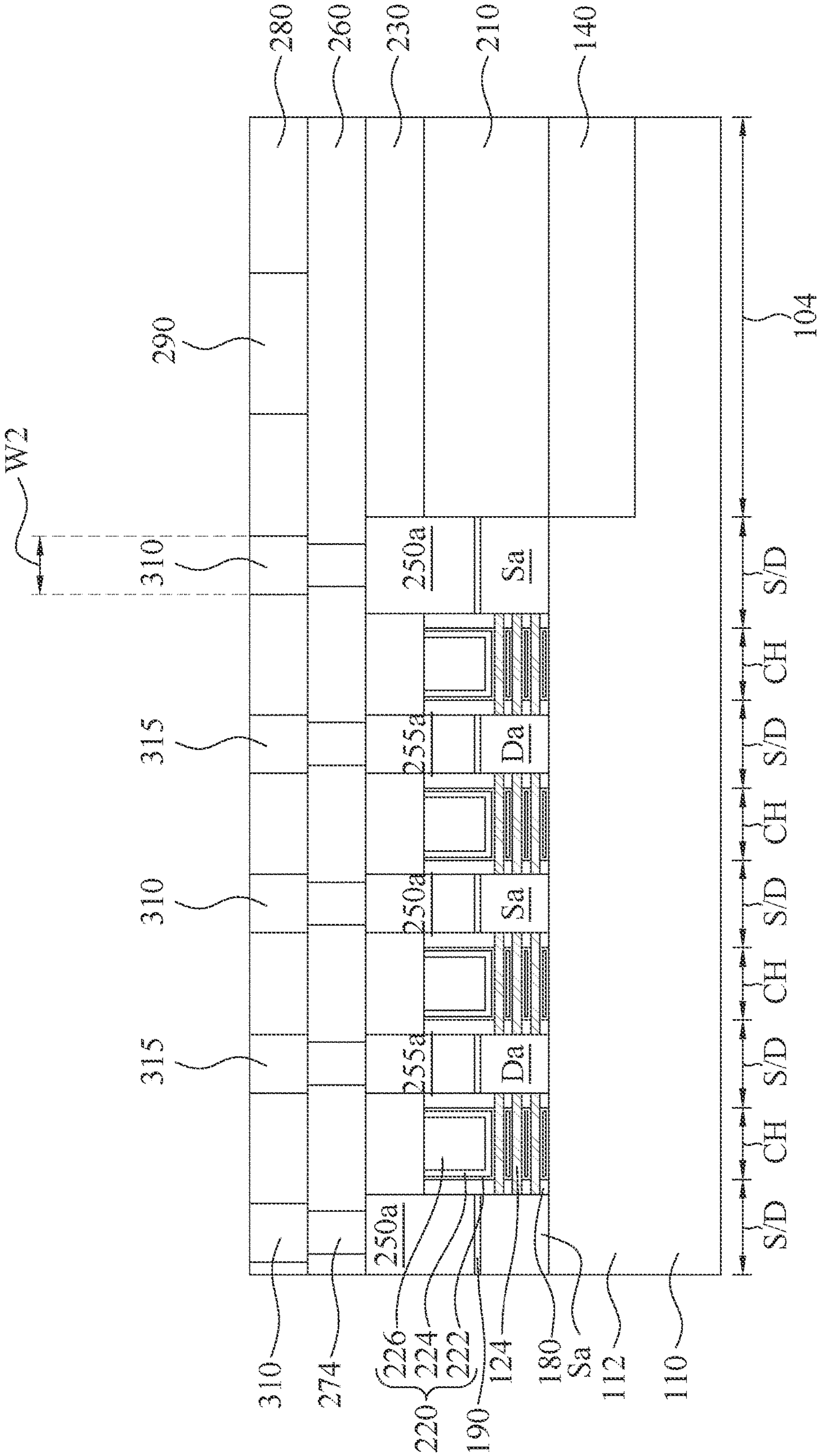

Reference is made to FIGS. 14A-14E, where FIG. 14B is a cross-sectional view taken along line I-I in FIG. 14A, FIG. 14C is a cross-sectional view taken along line IV-IV in FIG. 14A, FIG. 14D is a cross-sectional view taken along line II-II in FIG. 14A, and FIG. 14E is a cross-sectional view taken along line III-III in FIG. 14A. A fourth ILD layer 280, which is represented by dashed lines in FIG. 14A for clarity, is formed over the substrate 110. Materials, configurations, dimensions, processes and/or operations regarding the fourth ILD layer 280 are similar to or the same as the second ILD layer 230 of FIG. 12A.

Subsequently, a first gate trace line 290 and first source/drain trace lines 310 and 315 are formed in the fourth ILD layer 280 and over the transistor array TR (see FIG. 12A). The first gate trace line 290 interconnects the front-side gate vias 272 and the through via 276 and is electrically connected to the gate structures 220. The first source/drain trace lines 310 interconnect some of the source/drain vias 274 and are electrically connected to the source/drain epitaxial structures Sa and Sb. The first source/drain trace lines 315 interconnect some of the source/drain vias 274 and are electrically connected to the source/drain epitaxial structures Da and Db. In some embodiments, each of the first source/drain trace lines 310 and 315 has a length L2 in a range from about 10 nm to about 200 um and a width W2 in a range from about 10 nm to about 500 nm.

The first gate trace line 290 and the first source/drain trace lines 310 and 315 are formed using, by way of example and not limitation, etching the fourth ILD layer 280 to form trenches therein, depositing one or more metal materials overfilling the openings followed by a CMP process to remove excessive metal material(s) outside the openings. As a result of the CMP process, the first gate trace line 290 and the first source/drain trace lines 310 and 315 have top surfaces substantially coplanar with the fourth ILD layer 280. The first gate trace line 290 and the first source/drain trace lines 310 and 315 may include metal materials such as Pt, Ti, TiN, Al, W, WN, Ru, RuO, Ta, Ni, Co, Cu, Ag, Au, combinations thereof, or the like, and may be formed using PVD, CVD, ALD, or the like. In some embodiments, the first gate trace line 290 and the first source/drain trace lines 310 and 315 may further include one or more barrier/adhesion layers (not shown) to protect the fourth ILD layer 280 from metal diffusion (e.g., copper diffusion). The one or more barrier/adhesion layers may include titanium, titanium nitride, tantalum, tantalum nitride, or the like, and may be formed using PVD, CVD, ALD, or the like.

Figure 15A:
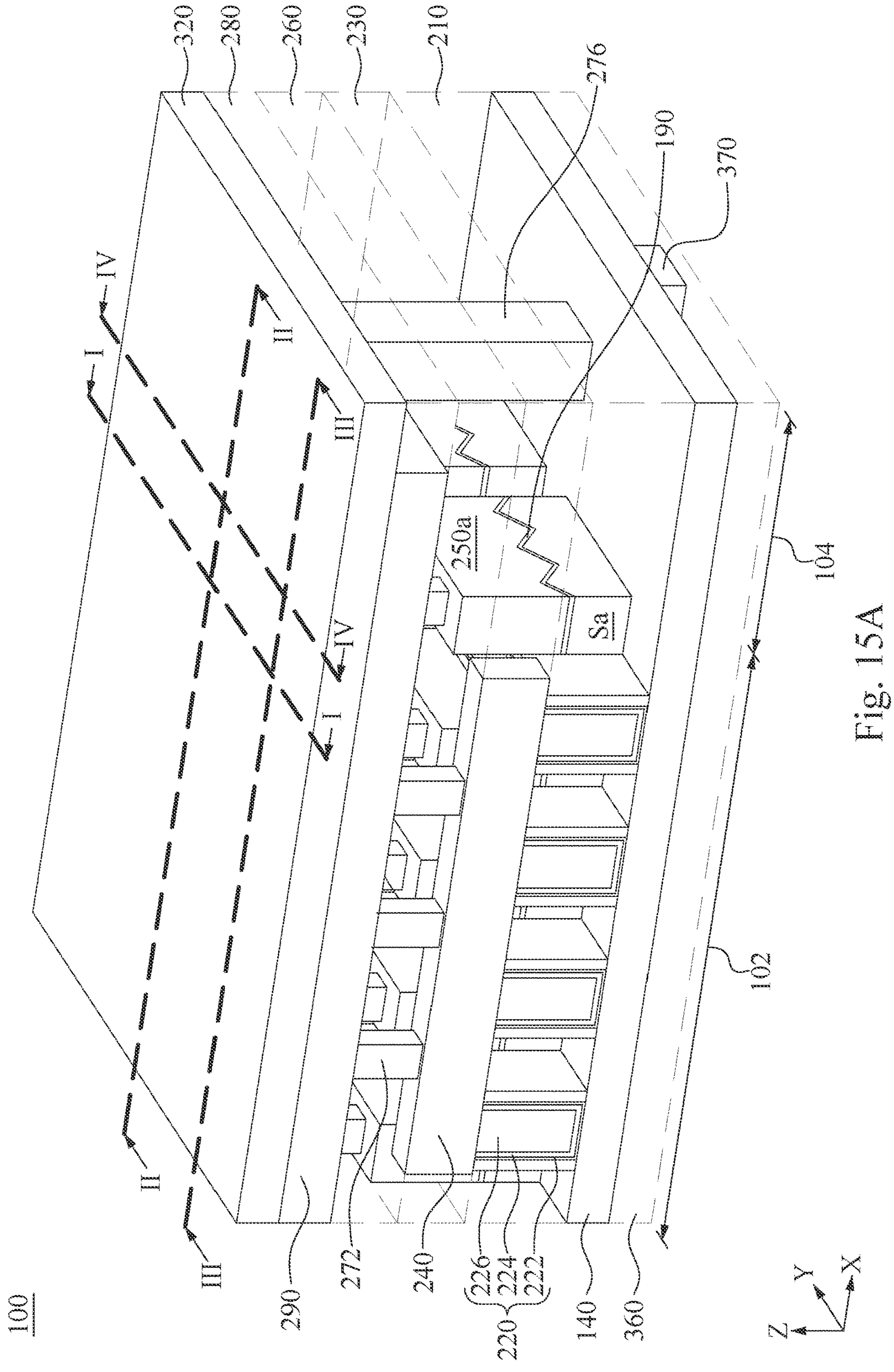
Figure 15C:
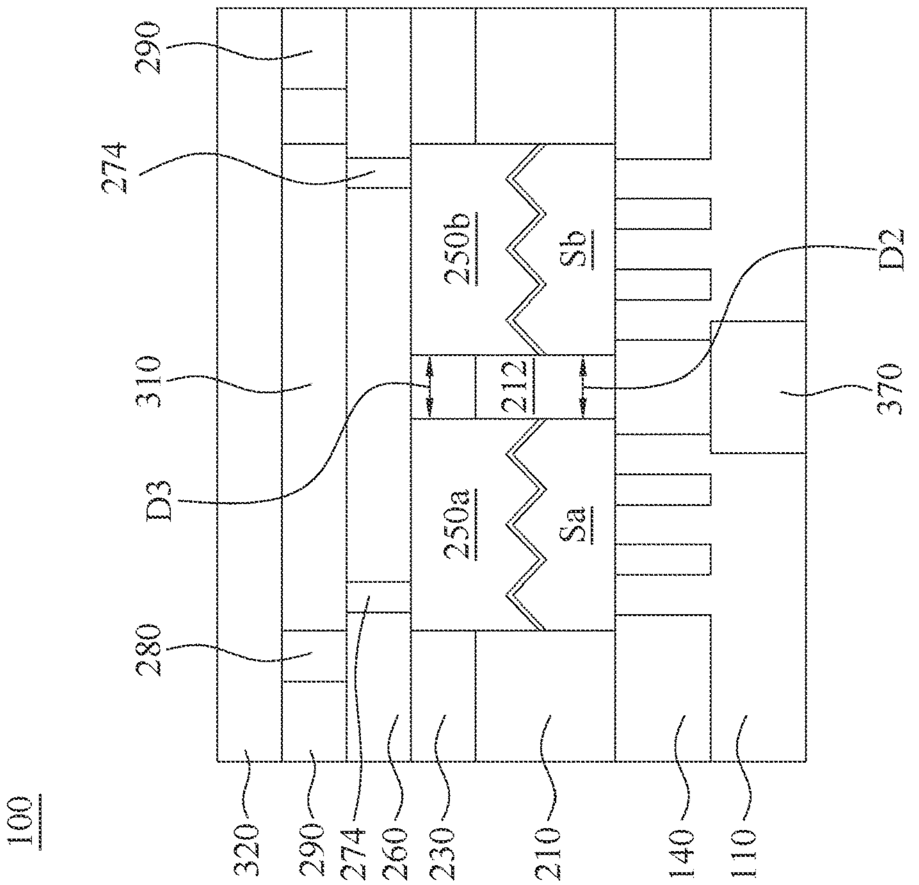
Figure 15B:
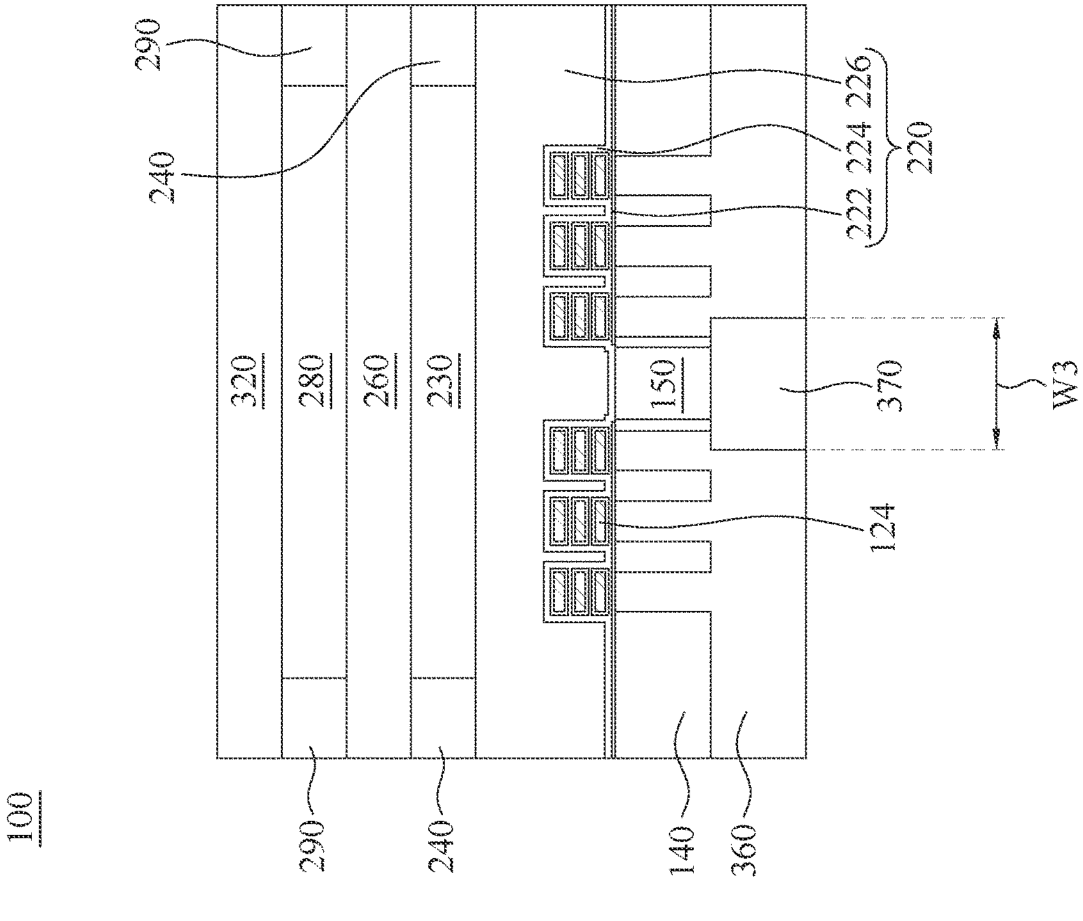
Figure 15D:
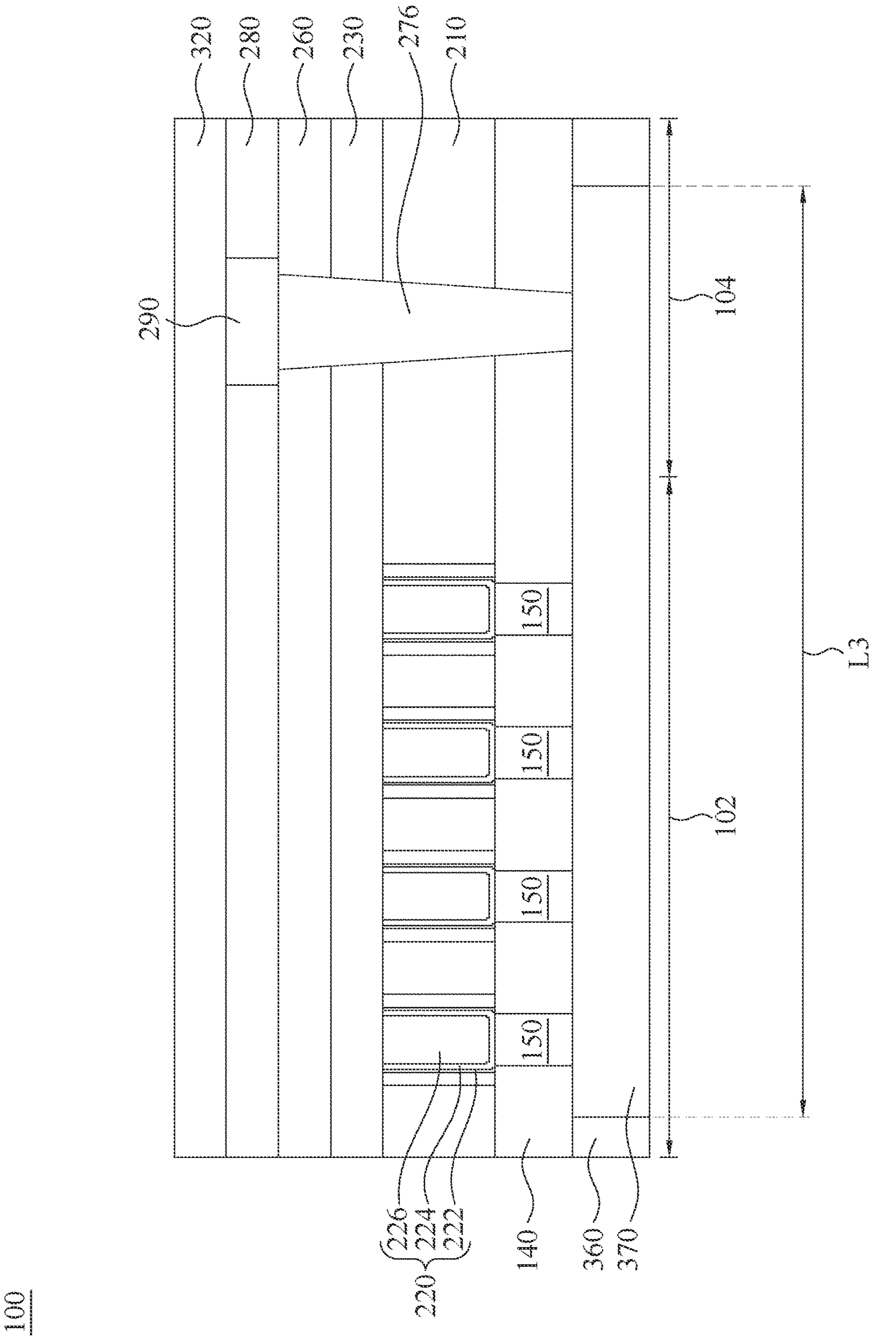
Figure 15E:
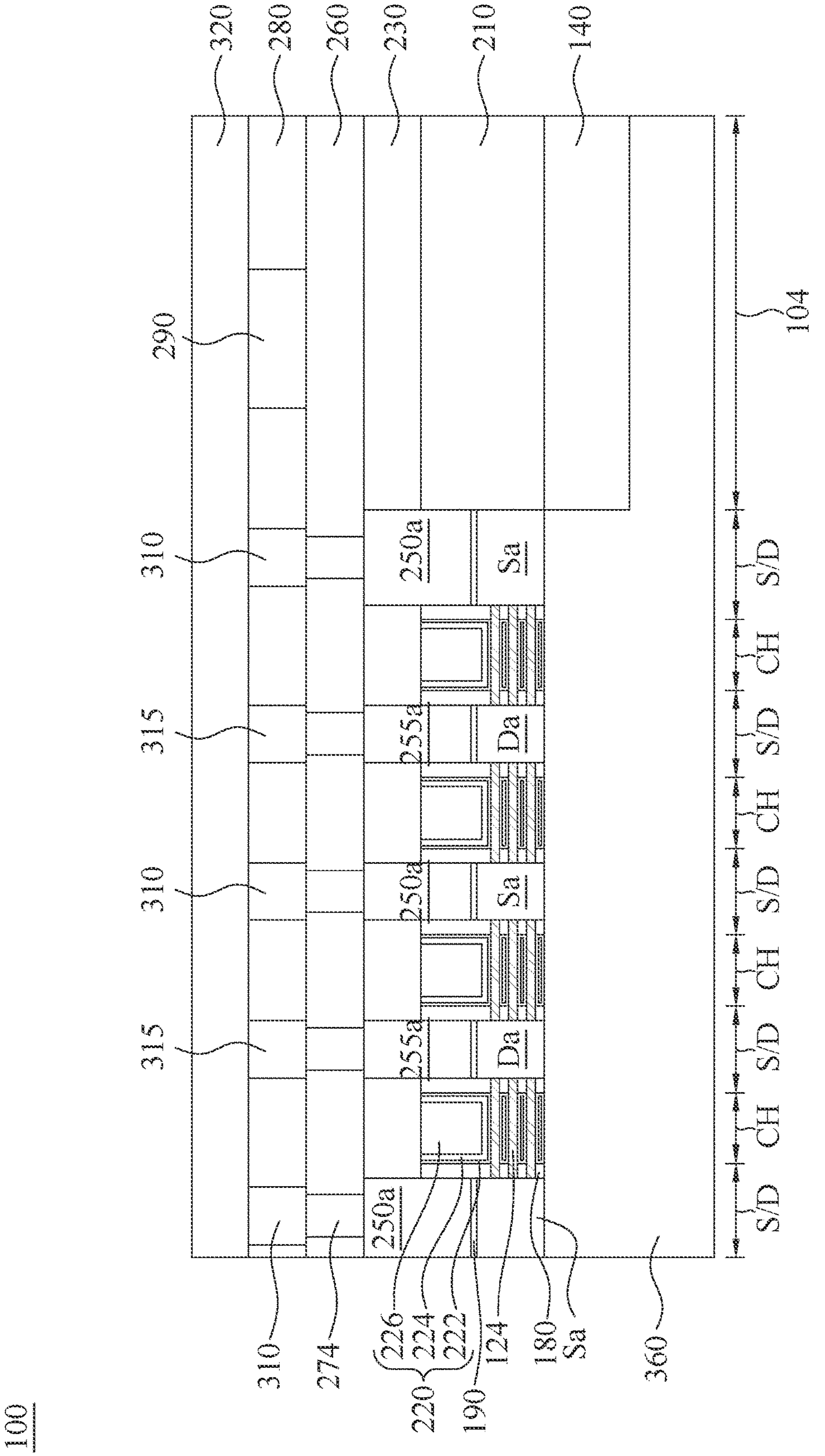

Reference is made to FIGS. 15A-15E, where FIG. 15B is a cross-sectional view taken along line I-I in FIG. 15A, FIG. 15C is a cross-sectional view taken along line IV-IV in FIG. 15A, FIG. 15D is a cross-sectional view taken along line II-II in FIG. 15A, and FIG. 15E is a cross-sectional view taken along line III-III in FIG. 15A. An interconnection structure 320 is formed over the fourth ILD layer 280. The design of the interconnection structure 320 may be varied, according to different circuit requirements.

The substrate 110 and the base portions 112 (see FIGS. 14A, 14B, 14C, and 14E) are then removed. As such, isolation structures 140, the backside gate vias 150, the through via 276 are exposed. In some embodiments, the removal processes include thinning down the substrate 110 from the backside thereof until the isolation structures 140 are exposed. The base portions 112 are then removed by using a selective etching process that etches the base portions 112 at a faster etch rate that it etches the isolation structure 140 (e.g., dielectric materials). In some embodiments, the selective etching process for selectively removing the base portions 112 may be a wet etching process using an wet etching solution such as tetramethylammonium hydroxide (TMAH), potassium hydroxide (KOH), $NH_4OH$, the like or combinations thereof.

Subsequently, a fifth ILD layer 360, which is represented by dashed lines in FIG. 15A for clarity, is formed to cover the backside of the source/drain epitaxial structures Sa, Sb, Da, and Db, the gate structures 220, the isolation structures 140, the backside gate vias 150, and the through via 276. Materials, configurations, dimensions, processes and/or operations regarding the fifth ILD layer 360 are similar to or the same as the second ILD layer 230 of FIG. 12A.

Next, a backside gate rail 370 is formed in the fifth ILD layer 360. The backside gate rail 370 is electrically and physically connected to the backside gate vias 150 and the through via 276. Further, as shown in FIG. 15D, the through via 276 extends from the first gate trace line 290 to the backside gate rail 370. The backside gate rail 370 may include metal materials such as Pt, Ti, TiN, Al, W, WN, Ru, RuO, Ta, Ni, Co, Cu, Ag, Au, combinations thereof, or the like, and may be formed using PVD, CVD, ALD, or the like. In some embodiments, the backside gate rail 370 may further include one or more barrier/adhesion layers (not shown) to protect the fifth ILD layer 360 from metal diffusion (e.g., copper diffusion). The one or more barrier/adhesion layers may include titanium, titanium nitride, tantalum, tantalum nitride, or the like, and may be formed using PVD, CVD, ALD, or the like.

Therefore, the semiconductor device 100 is shown in FIGS. 15A-15E. The semiconductor device 100 includes the transistor array TR (see FIG. 12A), the backside gate rail 370, the through via 276, and the first gate trace line 290. The transistor array TR includes a first portion TRa and a second portion TRb arranged along the Y direction. Each of the first portion TRa and the second portion TRb includes at least one transistor. For example, in FIG. 12A, each of the first portion TRa and the second portion TRb includes four transistors. Each of the transistors in the first portion TRa has the epitaxial layers 124, the gate structure 220 surrounding the epitaxial layers 124, the source/drain epitaxial structures Sa and Da connected to the epitaxial layers 124, and the source/drain contacts 250*a* and 255*a* connected to the source/drain epitaxial structures Sa and Da, respectively. Each of the transistors in the second portion TRb has the epitaxial layers 124, the gate structure 220 surrounding the epitaxial layers 124, the source/drain epitaxial structures Sb and Db connected to the epitaxial layers 124, and the source/drain contacts 250*b* and 255*b* connected to the source/drain epitaxial structures Sb and Db, respectively.

The source/drain epitaxial structures Sa (or Da) are separated from the source/drain epitaxial structures Sb (or Db) by the distance D2. Similarly, the source/drain contacts 250*a* (or 255*a*) are separated from the source/drain contacts 255*b* (or 255*b*) by substantially the distance D3. The source/drain epitaxial structures Sa (or Da) and Sb (or Db) are arranged along the Y direction, and the source/drain contacts 250*a* (or 255*a*) and 255*b* (or 255*b*) are arranged along the Y direction.

The first ILD layer 210 surrounds the transistors of the transistor array TR. Portions 212 of the first ILD layer 210 are directly (or sandwiched) between the adjacent source/drain epitaxial structures Sa and Sb (or Da and Db). Stated another way, the source/drain epitaxial structure Sa (or Da), the portion 212 of the first ILD layer 210, and the source/drain epitaxial structure Sb (or Db) are arranged along the Y direction.

The backside gate vias 150 are embedded in the isolation structure 140, which is under the first ILD layer 210, and connected to the gate structures 220. The backside gate rail 370 is under the first ILD layer 210 and the transistor array TR. The backside gate rail 370 extends along the X direction. The backside gate vias 150 are between the gate structures 220 and the backside gate rail 370, such that the backside gate rail 370 is electrically connected to the gate structures 220 through the backside gate vias 150. Therefore, the backside gate rail 370 is electrically connected to the gate structures 220 through the backside gate vias 150. The portions 212 of the first ILD layer 210 are directly above the backside gate rail 370. Stated another way, the backside gate rail 370 is between the first portion Tra and the second portion TRb of the transistor array TR in the top view. That is, the transistors of the transistor array TR are not formed directly above the backside gate rail 370.

Figure 23:
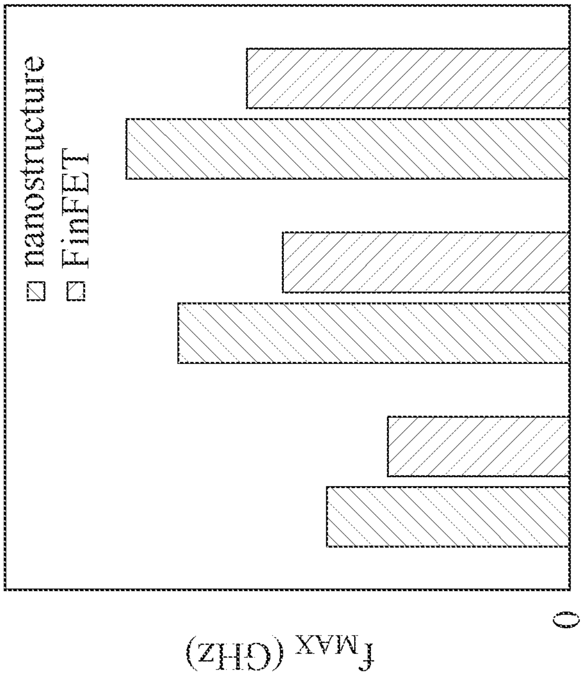
FIGS. 22 and 23 are performance comparisons of the semiconductor devices including different numbers of the backside gate rail(s).

With such configuration, the overlap area (from the top view as shown in FIGS. 17A, 18A, 19A, 20A, and 21A for example) between the backside gate rail 370 and the source/drain structures (e.g., the source/drain epitaxial structures Sa, Sb, Da, Db and the source/drain contacts 250*a*, 250*b*, 255*a*, and 255*b*) is reduced, such that the parasitic capacitance between gate and source/drain is reduced. With the reduced parasitic capacitance, the cut-off frequency, $f_T$, with current gain $(I_{out}/I_{in})=1$ of the semiconductor device 100 is not degraded too much, as shown in FIG. 22. Further, the gate voltage can be applied to not only the gate conductive lines 240, but also the backside gate rail 370, such that the gate resistance can be reduced. For example, the gate conductive lines 240 and the backside gate rail 370 are on opposite sides of the transistors. With the reduced gate resistance, the maximum oscillation frequency, $f_{MAX}$, with power gain $(P_{out}/P_{in})=1$ of the semiconductor device 100 is effectively improved, as shown in FIG. 23.

As shown in FIGS. 15C and 14A, the first source/drain trace lines 310 are over and interconnect the source/drain contacts 250*a* and 250*b*, and the first source/drain trace lines 315 interconnect the source/drain contacts 255*a* and 255*b*. Therefore, the series resistance of the source/drain contacts 250*a* and 250*b* (255*a* and 255*b*) can be reduced.

In FIG. 15B, a width W3 of the backside gate rail 370 is in a range from about 10 nm to about 5 um. In FIG. 15D, a length L3 of the backside gate rail 370 is in a range from about 10 nm to about 200 um. In FIGS. 15A-15E, the through via 276 is connected to the first gate trace line 290. However, in some other embodiments, the through via 276 may be directly connected to the gate trace line in the interconnect structure 320 (e.g., the second gate trace line 332 or higher gate trace line(s), if exists).

Figure 16B:
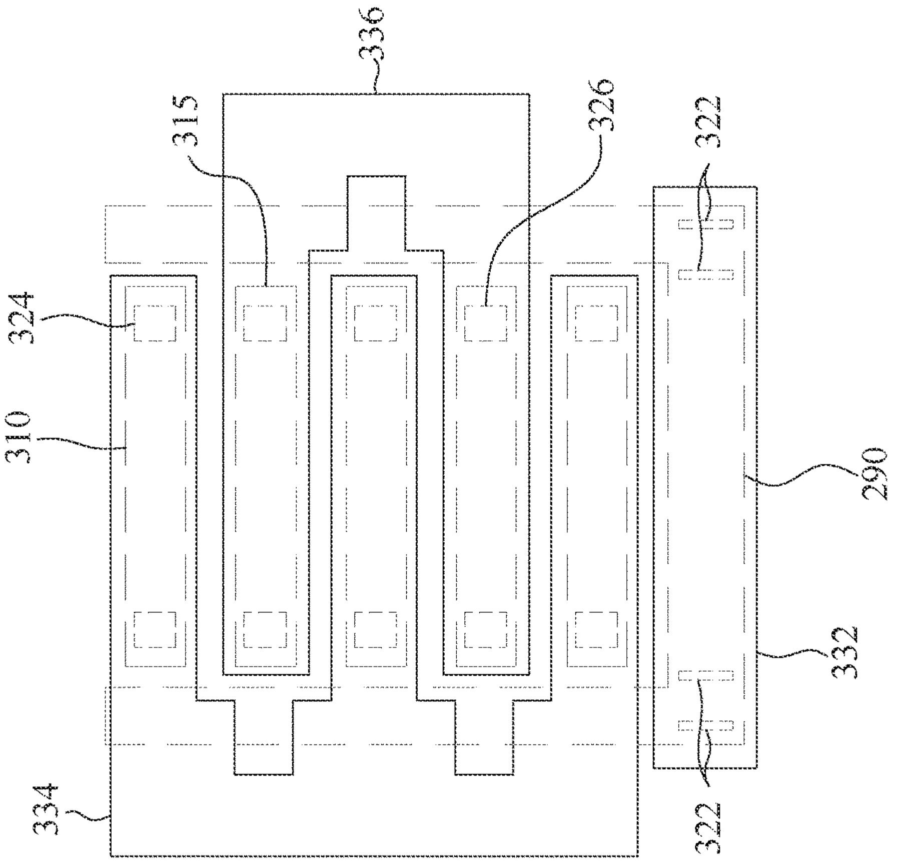
FIGS. 16A-16D illustrate a method for manufacturing an interconnection structure at various stages in accordance with some embodiments of the present disclosure.
Figure 16A:
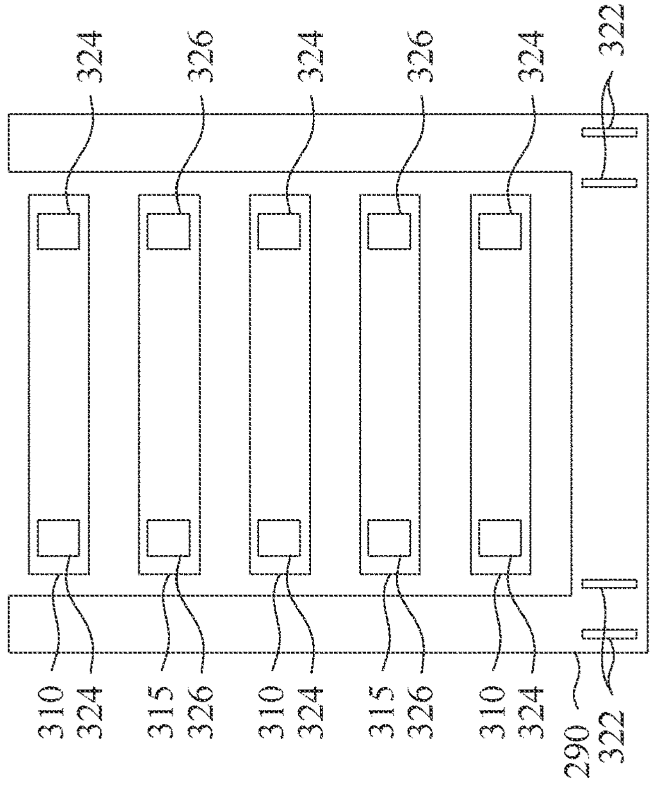

FIGS. 16A-16D illustrate a method for manufacturing the interconnection structure 320 at various stages in accordance with some embodiments of the present disclosure. Reference is made to FIG. 16A. After the formation of the first gate trace line 290 and the first source/drain trace lines 310 and 315, another ILD layer is formed over the structure of FIG.

14A. Subsequently, a plurality of vias 322, 324, and 326 are formed in the ILD layer. The vias 322 are connected to the first gate trace line 290, the vias 324 are connected to the first source/drain trace lines 310, and the vias 326 are connected to the first source/drain trace lines 315. Materials, configurations, dimensions, processes and/or operations regarding the vias 322, 324, and 326 are similar to or the same as the front-side gate vias 272 and the source/drain vias 274 of FIG. 13A.

Reference is made to FIGS. 16A and 16B. Another ILD layer is formed over the structure of FIG. 16A. Subsequently, a second gate trace line 332 and second source/drain trace lines 334 and 336 are formed in the ILD layer. The second gate trace line 332 is electrically connected to the first gate trace line 290 through the vias 322, the second source/drain trace line 334 is electrically connected to the first source/drain trace lines 310 through the vias 324, and the second source/drain trace line 336 is electrically connected to the first source/drain trace lines 315 through some of the vias 326. Materials, configurations, dimensions, processes and/or operations regarding the second gate trace line 332 and the second source/drain trace lines 334 and 336 are similar to or the same as the first gate trace line 290 and the first source/drain trace lines 310 and 315 of FIG. 14A.

Figure 16D:
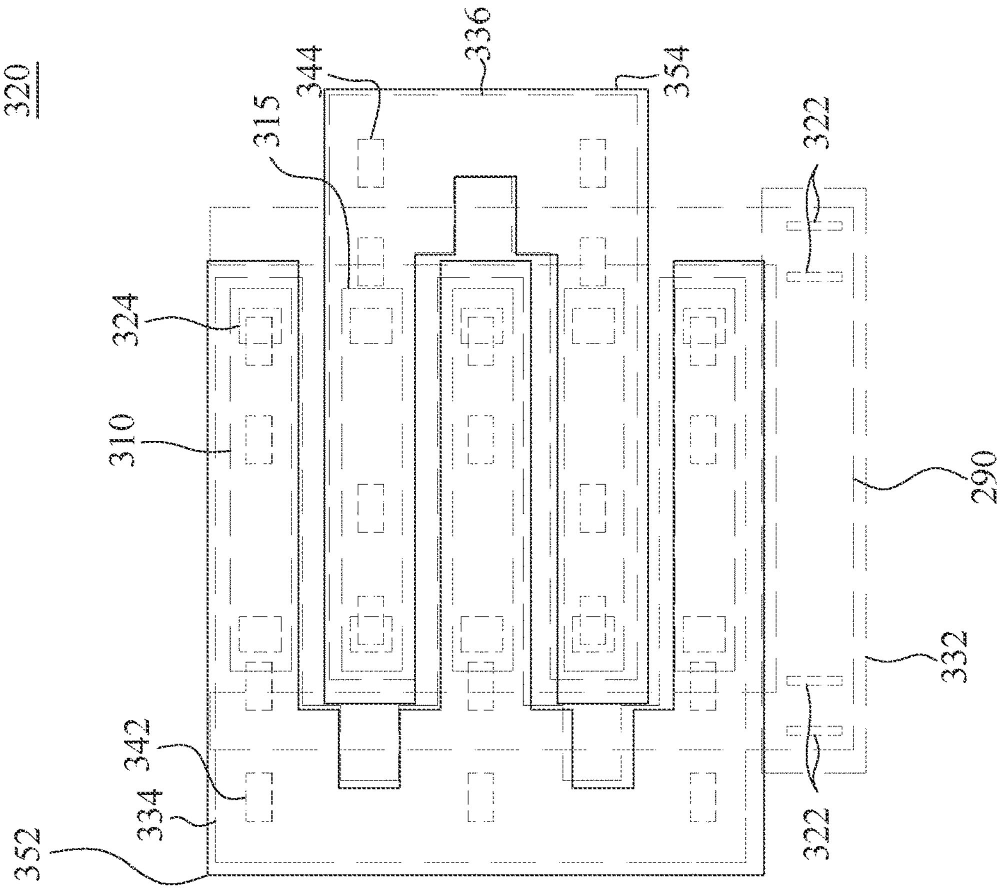
Figure 16C:
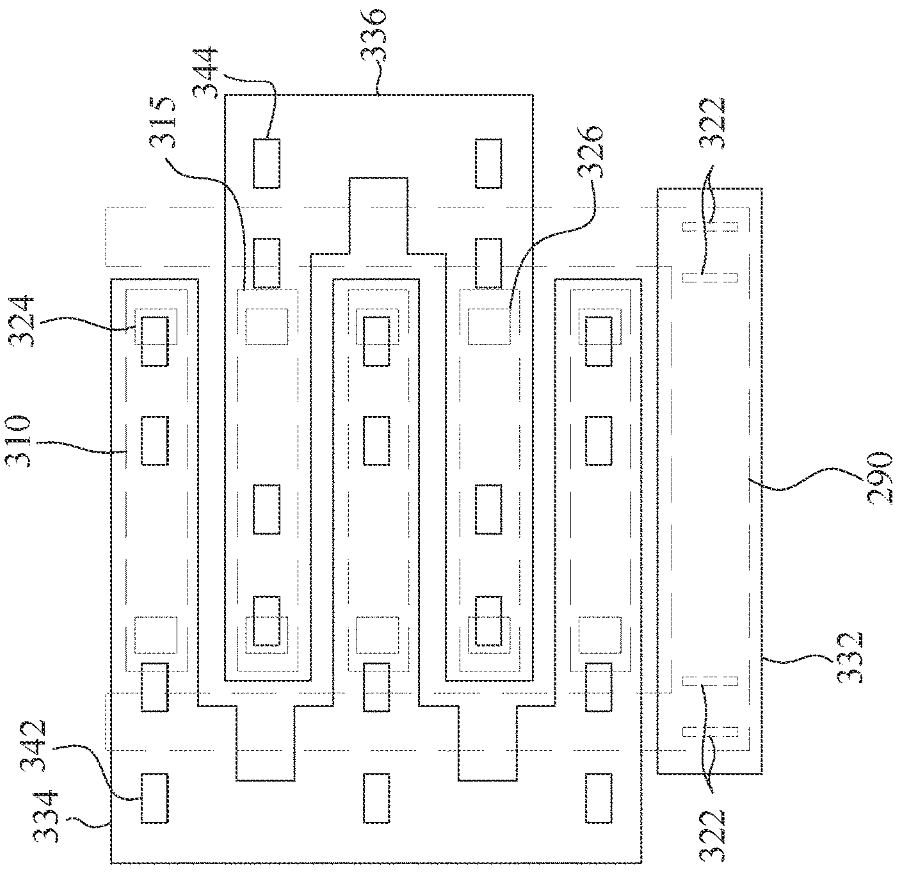

Reference is made to FIG. 16C. Another ILD layer is formed over the structure of FIG. 16B. Subsequently, a plurality of vias 342 and 344 are formed in the ILD layer. The vias 342 are connected to the second source/drain trace line 334, and the vias 344 are connected to the second source/drain trace line 336. Materials, configurations, dimensions, processes and/or operations regarding the vias 342 and 344 are similar to or the same as the front-side gate vias 272 and the source/drain vias 274 of FIG. 13A.

Reference is made to FIGS. 16C and 16D. Another ILD layer is formed over the structure of FIG. 16C. Subsequently, third source/drain trace lines 352 and 354 are formed in the ILD layer. The third source/drain trace line 352 is electrically connected to the second source/drain trace line 334 through the vias 342, and the third source/drain trace line 354 is electrically connected to the second source/drain trace line 336 through some of the vias 344. Materials, configurations, dimensions, processes and/or operations regarding the third source/drain trace lines 352 and 354 are similar to or the same as the first gate trace line 290 and the first source/drain trace lines 310 and 315 of FIG. 14A.

It is noted that the number of backside gate rail 370 is not limited to one. The number of the backside gate rail(s) 370 may be in a range from 1 to about 4000. Therefore, depending on the number of the backside gate rail(s) 370, the source/drain epitaxial structures connected to the same first source/drain trace line is in a range from 1 to about 4000. FIGS. 17A, 18A, 19A, 20A, and 21A illustrate simplified cross-sectional views of the epitaxial layers 124, the gate structures 220, the gate conductive lines 240, the backside gate vias 150, and the backside gate rail 370 in accordance with some embodiments of the present disclosure, and FIGS. 17B, 18B, 19B, 20B, and 21B illustrate simplified top views of the epitaxial layers 124, the gate structures 220, the gate conductive lines 240, the source/drain epitaxial structures Sa, Sb, Da, Db, and the backside gate rail 370 in accordance with some embodiments of the present disclosure.

Figure 17B:
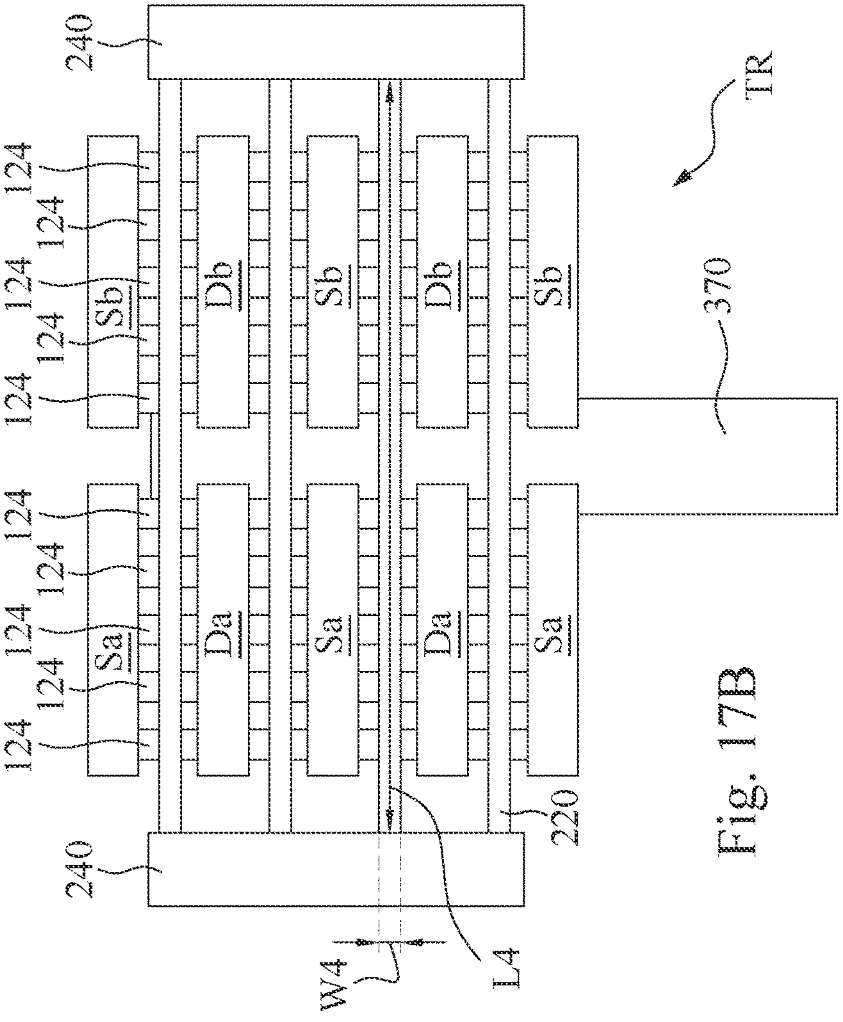
FIGS. 17B, 18B, 19B, 20B, and 21B illustrate simplified top views of epitaxial layers, gate structures, gate conductive lines, backside gate vias, and backside gate rail in accordance with some embodiments of the present disclosure.
Figure 17A:
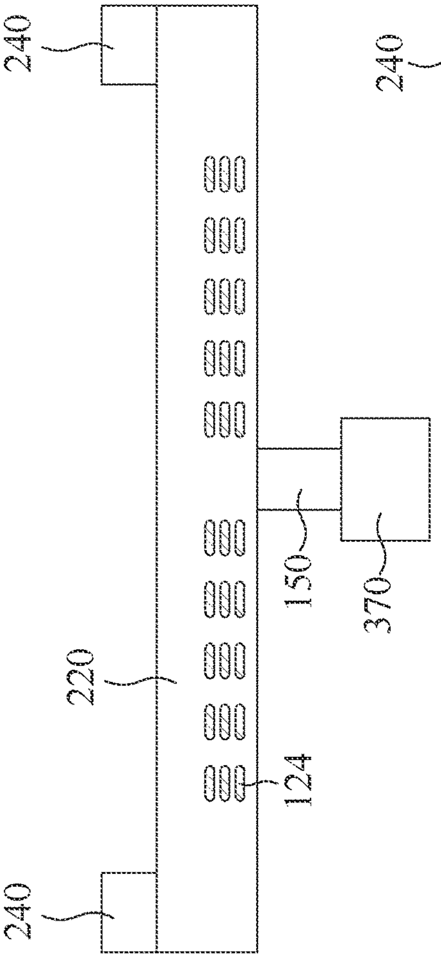
FIGS. 17A, 18A, 19A, 20A, and 21A illustrate simplified cross-sectional views of epitaxial layers, gate structures, gate conductive lines, backside gate vias, and backside gate rail in accordance with some embodiments of the present disclosure.

In FIGS. 17A-17B, each of the source/drain epitaxial structures Sa, Sb, Da, Db is connected to five stacks of the epitaxial layers 124. The source/drain epitaxial structures Sa and Sb are separated from each other, and the source/drain epitaxial structures Da and Db are separated from each other. The number of the backside gate rail 370 is one. The backside gate rail 370 is between the source/drain epitaxial structures Sa and Sb and between the source/drain epitaxial structures Da and Db in the top view. In some embodiments, each of the gate structures 220 has a length L4 in a range from about 10 nm to about 200 um between the gate conductive lines 240 and a width W4 in a range from about 10 nm to about 500 nm.

Figure 18B:
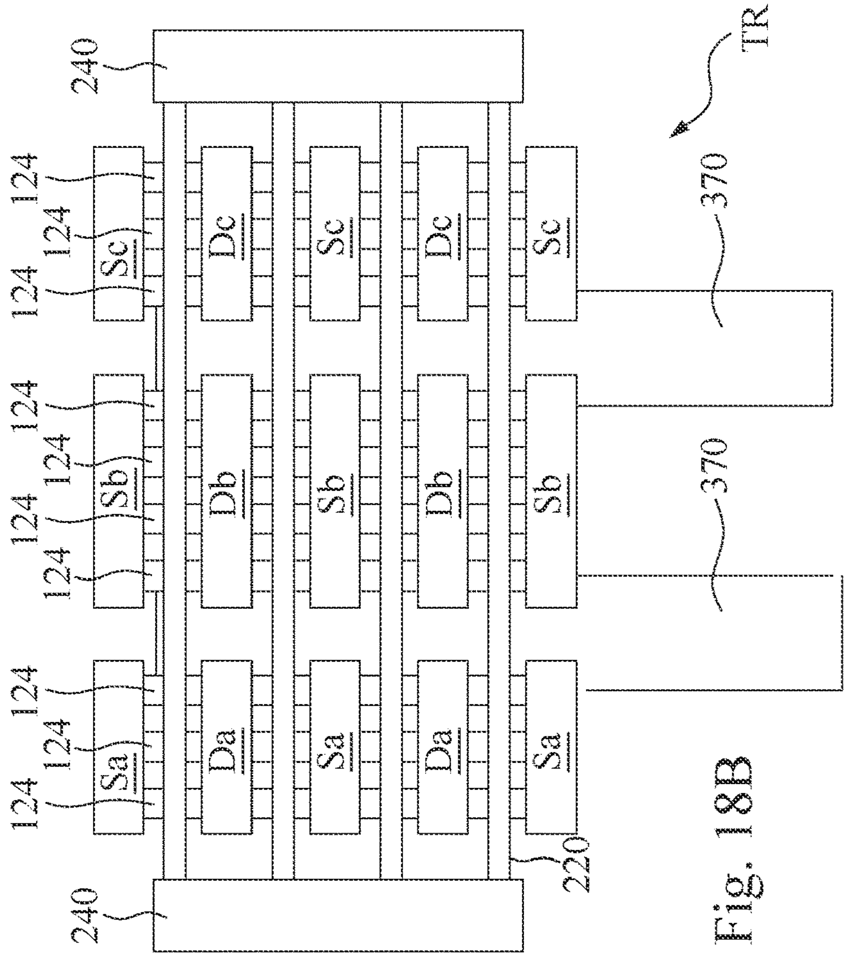
Figure 18A:
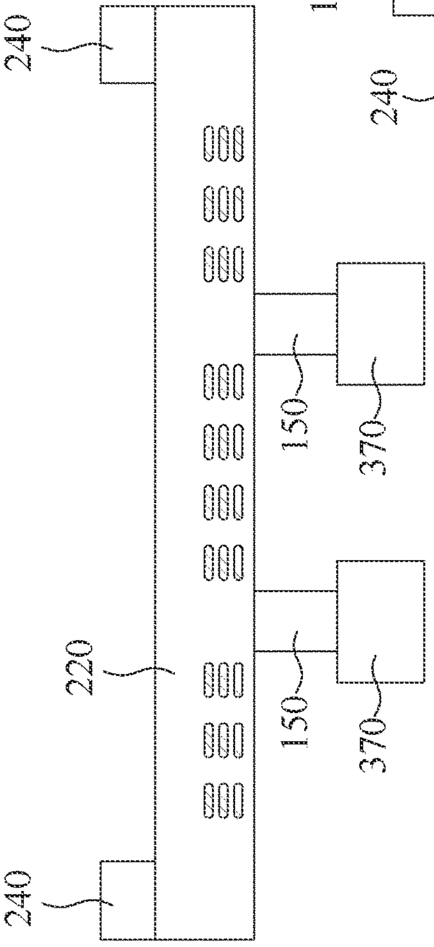

In FIGS. 18A-18B, each of the source/drain epitaxial structures Sa, Sb, Sc, Da, Db. Dc is connected to three or four stacks of the epitaxial layers 124. The source/drain epitaxial structures Sa, Sb, and Sc are separated from each other, and the source/drain epitaxial structures Da, Db, and Dc are separated from each other. The number of the backside gate rails 370 is two. One of the backside gate rails 370 is between the source/drain epitaxial structures Sa and Sb and between the source/drain epitaxial structures Da and Db in the top view, and another one of the backside gate rails 370 is between the source/drain epitaxial structures Sb and Sc and between the source/drain epitaxial structures Db and Dc in the top view.

Figure 19B:
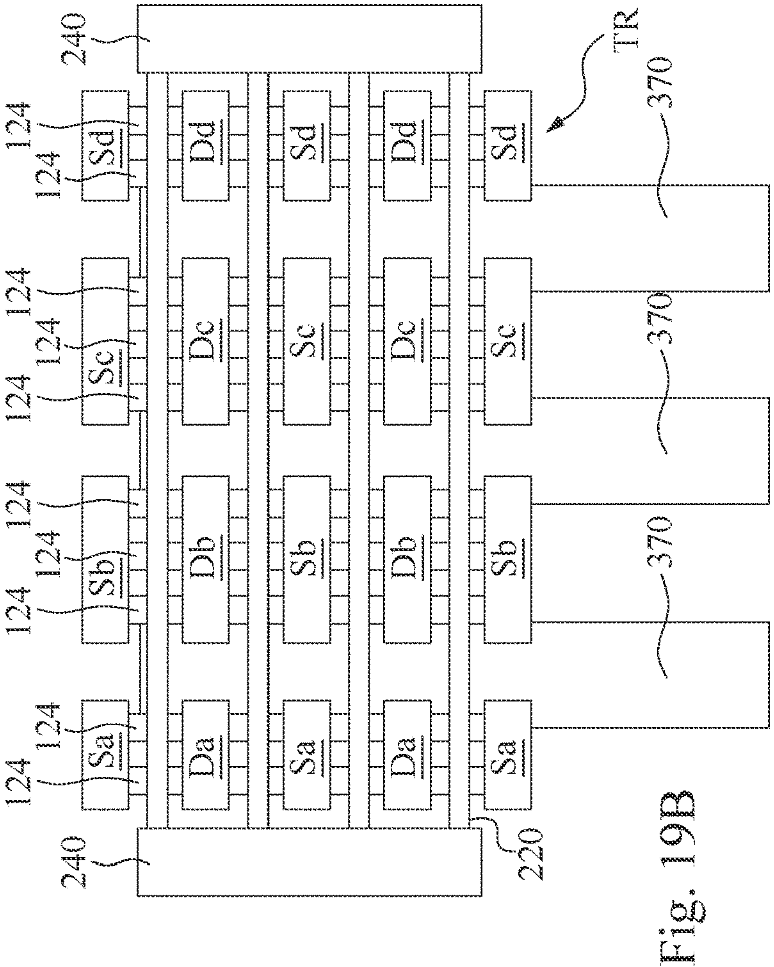
Figure 19A:
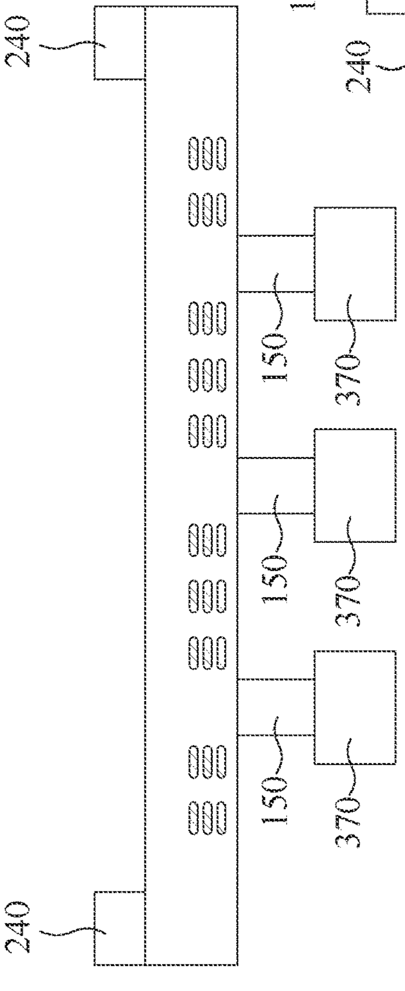

In FIGS. 19A-19B, each of the source/drain epitaxial structures Sa, Sb, Sc, Sd, Da, Db, Dc, Dd is connected to two or three stacks of the epitaxial layers 124. The source/drain epitaxial structures Sa, Sb, Sc, and Sd are separated from each other, and the source/drain epitaxial structures Da, Db, Dc, and Dd are separated from each other. The number of the backside gate rails 370 is three. The backside gate rails 370 are between the source/drain epitaxial structures Sa and Sb (or Sb and Sc, or Sc and Sd) and between the source/drain epitaxial structures Da and Db (or Db and Dc, or Dc and Dd) in the top view.

Figure 20B:
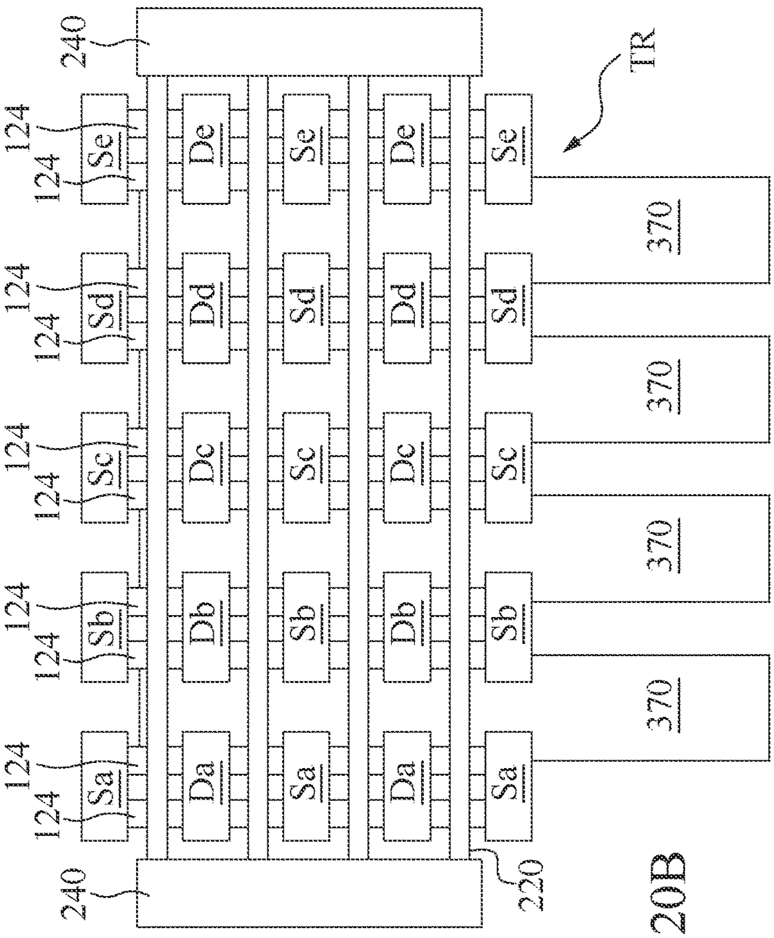
Figure 20A:
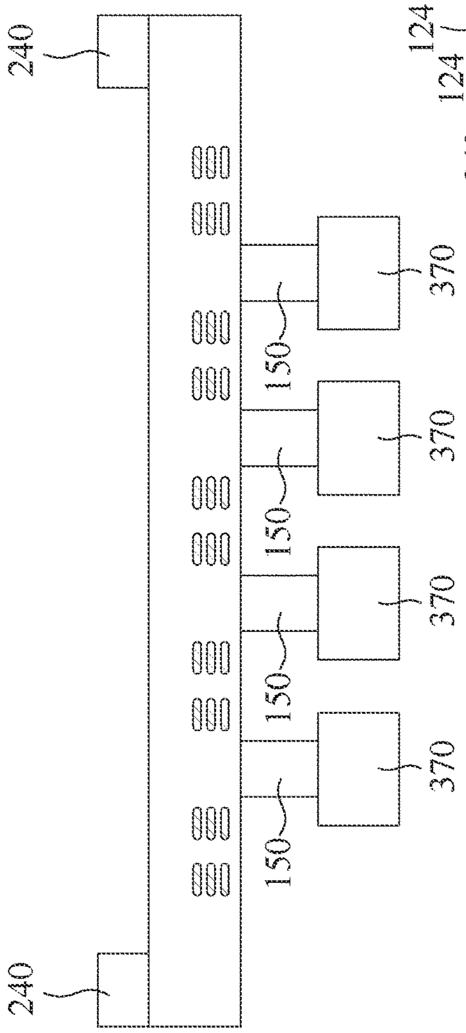

In FIGS. 20A-20B, each of the source/drain epitaxial structures Sa, Sb, Sc, Sd, Se, Da, Db, Dc, Dd, De is connected to two stacks of the epitaxial layers 124. The source/drain epitaxial structures Sa, Sb, Sc, Sd, and Se are separated from each other, and the source/drain epitaxial structures Da, Db, Dc, Dd, and De are separated from each other. The number of the backside gate rails 370 is four. The backside gate rails 370 are between the source/drain epitaxial structures Sa and Sb (or Sb and Sc, or Sc and Sd, or Sd and Se) and between the source/drain epitaxial structures Da and Db (or Db and Dc, or Dc and Dd, or Dd and De) in the top view.

Figure 21A:
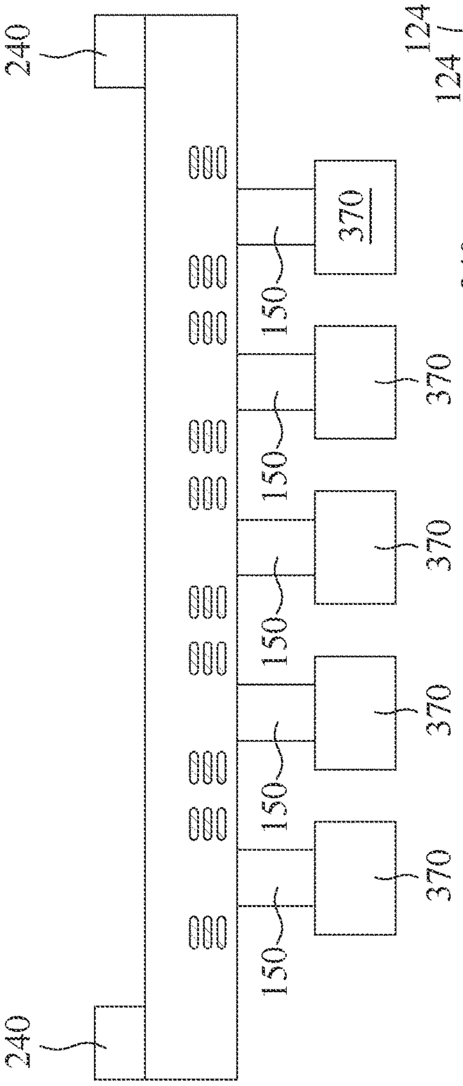
Figure 21B:
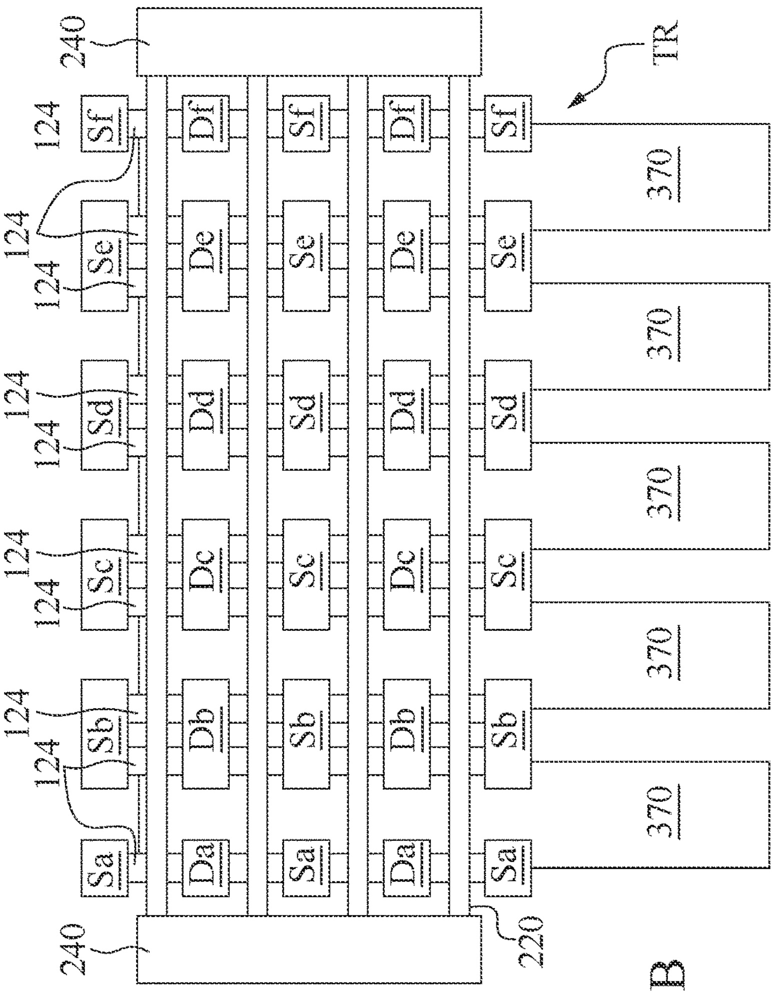
Figure 22:
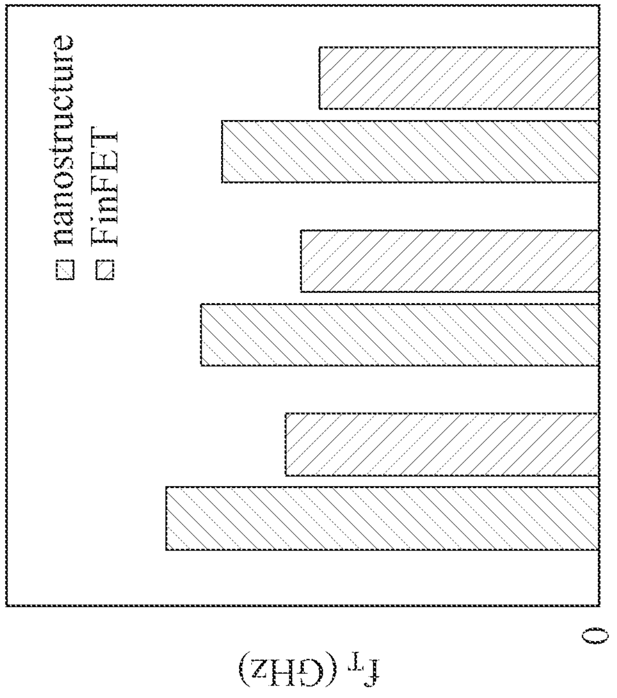

In FIGS. 21A-21B, each of the source/drain epitaxial structures Sa, Sb, Sc, Sd, Se, Sf, Da, Db, Dc, Dd, De, Df is connected to one or two stacks of the epitaxial layers 124. The source/drain epitaxial structures Sa, Sb, Sc, Sd, Se, and Sf are separated from each other, and the source/drain epitaxial structures Da, Db, Dc, Dd, De, and Df are separated from each other. The number of the backside gate rails 370 is five. The backside gate rails 370 are between the source/drain epitaxial structures Sa and Sb (or Sb and Sc, or Sc and Sd, or Sd and Se, or Se and Sf) and between the source/drain epitaxial structures Da and Db (or Db and Dc, or Dc and Dd, or Dd and De, or De and Df) in the top view.

FIGS. 22 and 23 are performance comparisons of the semiconductor devices including different numbers of the backside gate rail(s). The semiconductor devices in FIGS. 22 and 23 may be FinFETs or nanostructures (e.g., GAA FETs). In FIG. 22, the cut-off frequencies, $f_T$, with current gain $(I_{out}/I_{in})=1$ of semiconductor devices with zero backside gate rail (#0), with one backside gate rail (#1) and with two backside gate rails (#2) are compared. As shown in FIG. 22, the semiconductor devices (#0, #1, and #2) have similar cut-off frequencies. In FIG. 23, the maximum oscillation frequencies, $f_{MAX}$, with power gain $(P_{out}/P_{in})=1$ of the semiconductor devices (#0, #1, and #2) are compared. As shown in FIG. 23, the semiconductor devices (#2) have maximum oscillation frequencies higher than that of the semiconductor devices (#1), and the semiconductor devices (#1) have maximum oscillation frequencies much higher than that of the semiconductor device (#0).

Figure 24:
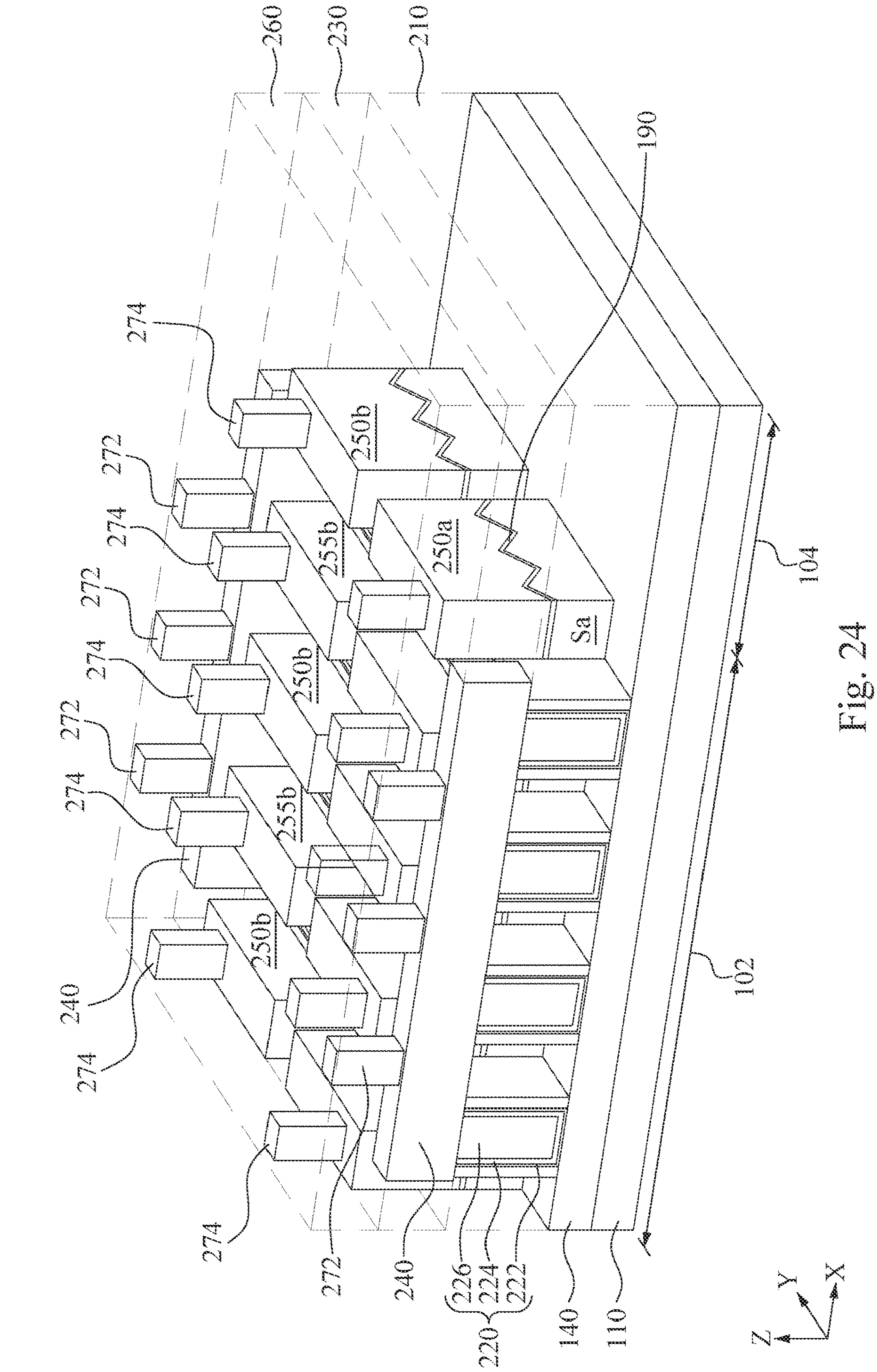
FIGS. 24-25B illustrate a method for manufacturing a semiconductor device at various stages in accordance with some embodiments of the present disclosure.
Figure 25A:
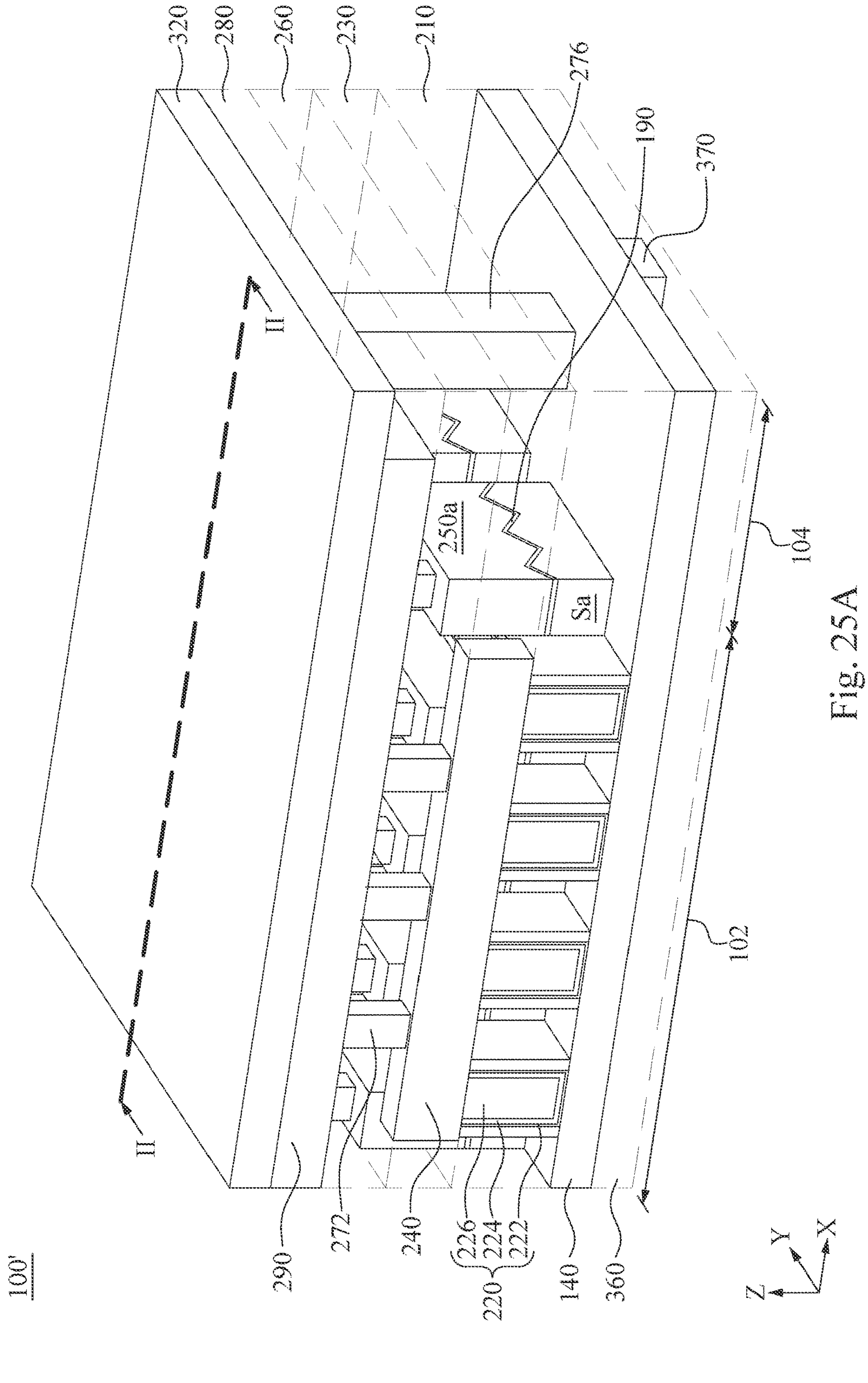
Figure 25B:
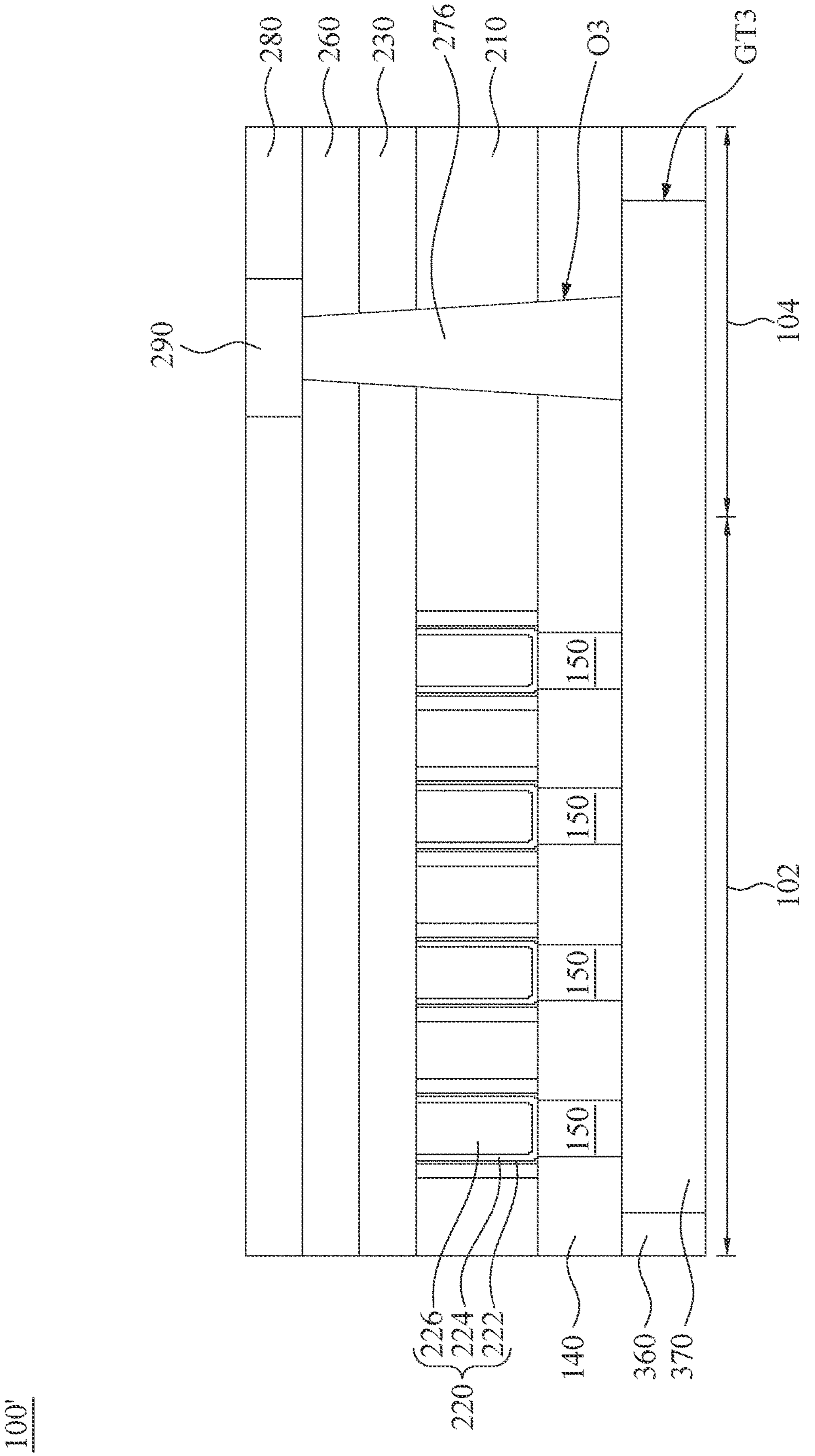

FIGS. 24-25B illustrate a method for manufacturing a semiconductor device 100' at various stages in accordance with some embodiments of the present disclosure. It is understood that additional operations can be provided before, during, and after processes shown by FIGS. 24-25B, and some of the operations described below can be replaced or eliminated, for additional embodiments of the method. The order of the operations/processes may be interchangeable. The same or similar configurations, materials, processes and/or operation as described with FIGS. 1-15E may be employed in the following embodiments, and the detailed explanation may be omitted.

After the structure as shown in FIGS. 12A-12E is formed, the third ILD layer 260 is deposited over the substrate 110 as shown in FIG. 24. Subsequently, front-side gate vias 272 and source/drain vias 274 are formed in the third ILD layer 260. Thereafter, the structure in FIG. 24 undergoes the process shown in FIGS. 14A-14E.

Reference is made to FIGS. 25A and 25B, FIG. 25B is a cross-sectional view taken along line II-II in FIG. 25A. After the formation of the first gate trace line 290 and the first source/drain trace lines 310 and 315, the interconnection structure 320 is formed over the substrate 110. The substrate 110 and the base portions 112 (see FIGS. 14A-14E) are then removed. Subsequently, the fifth ILD layer 360, which is represented by dashed lines in FIG. 25A for clarity, is formed to cover the backside of the source/drain epitaxial structures Sa, Sb, Da, and Db, the gate structures 220, the isolation structures 140, and the backside gate vias 150.

Next, the fifth ILD layer 360, the isolation structure 140, the first ILD layer 210, the second ILD layer 230, and the third ILD layer 260 are patterned to form an opening O3 and a gate trench GT3 as shown in FIG. 25B. Subsequently, the through via 276 is formed in the opening O3, and the backside gate rail 370 is formed in the gate trench GT3.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that the semiconductor device includes at least one backside gate rail to reduce the gate resistance therein and increase the power gain of the semiconductor device. In addition, the source/drain structures (e.g., the source/drain epitaxial structures and the source/drain contacts) are not directly above the backside gate rail, such that the parasitic capacitance between gate and source/drain can be reduced. Further, source/drain trace lines are formed to interconnect the source/drain contacts to reduce the series resistance of the source/drain contacts.

According to some embodiments, a device includes a first transistor, a second transistor, an interlayer dielectric (ILD) layer, and a backside gate rail. The first transistor and the second transistor are arranged along a first direction in a top view. The first transistor includes a first channel layer, a gate structure surrounding the first channel layer, a first source/drain epitaxial structure and a second source/drain epitaxial structure connected to the first channel layer. The second transistor includes a second channel layer, the gate structure surrounding the second channel layer, a third source/drain epitaxial structure and a fourth source/drain epitaxial structure connected to the second channel layer. The ILD layer surrounds the first transistor and the second transistor. A portion of the ILD layer is sandwiched between the first source/drain epitaxial structure and the third source/drain epitaxial structure. The backside gate rail is under the ILD layer and is electrically connected to the gate structure. The portion of the ILD layer sandwiched between the first source/drain epitaxial structure and the third source/drain epitaxial structure is directly above the backside gate rail.

According to some embodiments, a device includes a transistor array and a backside gate rail. The transistor array includes a first portion and a second portion. The first portion includes a plurality of first transistors arranged in a first direction in a top view. The second portion includes a plurality of second transistors arranged in the first direction in the top view. The first portion and the second portion are arranged in a second direction different from the first direction in the top view. The backside gate rail is under the transistor array and electrically connected to gate structures of the first transistors. The backside gate rail extends in the first direction and is between the first portion and the second portion of the transistor array in the top view.

According to some embodiments, a method includes forming a first fin structure and a second fin structure over a substrate. An isolation structure is formed over the substrate and surrounds bottom portions of the first fin structure and the second fin structure. A backside gate via is formed in the isolation structure and between the first fin structure and the second fin structure. A dummy gate is over the first fin structure and the second fin structure. The dummy gate is replaced with a gate structure. The gate structure is electrically connected to the backside gate via. The substrate is removed. A backside gate rail is formed under and connected to the backside gate via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a first fin structure and a second fin structure over a substrate;

forming an isolation structure over the substrate and surrounding bottom portions of the first fin structure and the second fin structure;

forming a backside gate via in the isolation structure and between the first fin structure and the second fin structure;

forming a dummy gate over the first fin structure and the second fin structure;

replacing the dummy gate with a gate structure, wherein the gate structure is electrically connected to the backside gate via;

removing the substrate; and forming a backside gate rail under and connected to the backside gate via.

2. The method of claim 1, further comprising:

forming an interlayer dielectric (ILD) layer over the substrate to surround the dummy gate; and forming a through via in the ILD layer, wherein the backside gate rail is connected to the through via.

3. The method of claim 2, wherein forming the through via is performed prior to removing the substrate.

4. The method of claim 1, further comprising forming a gate conductive line over and connected to the gate structure, wherein the gate conductive line and the backside gate rail extend along substantially the same direction in a top view.

5. The method of claim 1, further comprising forming an interconnect structure over the substrate and electrically connected to the gate structure.

6. The method of claim 1, wherein removing the substrate is such that a backside of the gate structure is exposed.

7. A method comprising:

forming a semiconductor structure over a substrate;

forming an isolation structure over the substrate and adjacent the semiconductor structure;

patterning the isolation structure to form an opening in the isolation structure and expose the substrate;

filling conductive materials in the opening to form a conductive via in the isolation structure;

after filling the conductive materials, forming a transistor over the substrate and the isolation structure, wherein a gate structure of the transistor is electrically connected to conductive via;

removing the substrate to expose the gate structure;

depositing a dielectric layer under the gate structure and the isolation structure; and forming a backside gate rail in the dielectric layer and connected to the conductive via.

8. The method of claim 7, wherein the backside gate rail and the gate structure extend in different directions in a top view.

9. The method of claim 7, further comprising forming a front-side gate rail over the gate structure prior to forming the backside gate rail.

10. The method of claim 9, wherein the front-side gate rail is offset from the backside gate rail in a top view.

11. The method of claim 9, further comprising forming a through via adjacent the transistor prior to forming the front-side gate rail, such that the backside gate rail is electrically connected to the front-side gate rail through the through via.

12. The method of claim 7, further comprising forming a source/drain trace line over the transistor and electrically connected to a source/drain epitaxial structure of the transistor.

13. The method of claim 12, wherein the source/drain trace line across the backside gate rail in a top view.

14. A method comprising:

forming a first transistor and a second transistor over a substrate, wherein the first transistor and the second transistor are surrounded by a interlayer dielectric (ILD) layer over the substrate, the first transistor and the second transistor are arranged in a direction in a top view, and a gate structure of the first transistor and a gate structure of the second transistor extend in the direction in the top view;

forming a through via in the ILD layer and in contact with the substrate;

forming a front-side gate rail over the first transistor and the second transistor and electrically connected to the gate structure of the first transistor, the gate structure of the second transistor, and the through via;

removing the substrate to expose the through via; and forming a backside gate rail under the first transistor and the second transistor and electrically connected to the through via after removing the substrate.

15. The method of claim 14, further comprising:

forming a source/drain trace line over the first transistor and the second transistor and after forming the through via, wherein the source/drain trace line is electrically connected to a source/drain epitaxial structure of the first transistor.

16. The method of claim 15, wherein the front-side gate rail and the source/drain trace line are formed simultaneously, and the front-side gate rail laterally surrounds the source/drain trace line in the top view.

17. The method of claim 14, further comprising:

forming an isolation structure over the substrate; and forming a conductive via in the isolation structure prior to forming the first transistor and the second transistor, wherein the conductive via is in contact with the backside gate rail and the gate structure of the first transistor.

18. The method of claim 17, wherein after removing the substrate, the conductive via is exposed.

19. The method of claim 17, wherein the conductive via is between the first transistor and the second transistor in a top view.

20. The method of claim 14, wherein the backside gate rail is between the first transistor and the second transistor in the top view.

* * * * *